United States Patent
Ishizu et al.

(10) Patent No.: US 11,443,796 B2
(45) Date of Patent: Sep. 13, 2022

(54) MEMORY DEVICE AND ELECTRONIC DEVICE

(71) Applicant: Semiconductor Energy Laboratory Co., Ltd., Atsugi (JP)

(72) Inventors: Takahiko Ishizu, Sagamihara (JP); Toshihiko Saito, Atsugi (JP); Hideki Uochi, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 15 days.

(21) Appl. No.: 16/972,696

(22) PCT Filed: Jun. 13, 2019

(86) PCT No.: PCT/IB2019/054931
§ 371 (c)(1),
(2) Date: Dec. 7, 2020

(87) PCT Pub. No.: WO2019/243957
PCT Pub. Date: Dec. 26, 2019

(65) Prior Publication Data
US 2021/0257020 A1      Aug. 19, 2021

(30) Foreign Application Priority Data

Jun. 22, 2018 (JP) .............................. JP2018-118869
Jun. 29, 2018 (JP) .............................. JP2018-124319

(51) Int. Cl.
*G11C 11/00*   (2006.01)
*G11C 11/419*  (2006.01)
(Continued)

(52) U.S. Cl.
CPC .......... *G11C 11/419* (2013.01); *G11C 11/409* (2013.01); *H01L 29/045* (2013.01); *H01L 29/78693* (2013.01)

(58) Field of Classification Search
CPC ............. H01L 27/108; H01L 27/10844; H01L 27/11519; H01L 27/11521; H01L 27/1156;
(Continued)

(56) References Cited

U.S. PATENT DOCUMENTS 7,468,901 B2   12/2008   Kameshiro et al.
7,842,999 B2   11/2010   Takaishi
(Continued)

FOREIGN PATENT DOCUMENTS

CN    001845330 A    10/2006
JP    2006-294116 A   10/2006
(Continued)

OTHER PUBLICATIONS

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.
(Continued)

*Primary Examiner* — Thong Q Le
(74) *Attorney, Agent, or Firm* — Robinson Intellectual Property Law Office; Eric J. Robinson

(57) ABSTRACT

A novel memory device is provided. The memory device includes a plurality of memory cells, and one memory cell includes a first transistor and a second transistor. One of a source and a drain of the first transistor is electrically connected to a gate of the second transistor through a node SN. Data written through the first transistor is retained at the node SN. When an OS transistor is used as the first transis-
(Continued)

tor, formation of a storage capacitor is not needed. A region with a low dielectric constant is provided outside the memory cell, whereby noise from the outside is reduced and stable operation is achieved.

12 Claims, 38 Drawing Sheets

(51) Int. Cl.
*G11C 11/409* (2006.01)
*H01L 29/04* (2006.01)
*H01L 29/786* (2006.01)

(58) Field of Classification Search
CPC ............. H01L 27/1225; H01L 27/0629; H01L 27/10876; H01L 27/115; H01L 28/40; H01L 29/78645; H01L 27/10; H01L 27/1052; H01L 27/10805; H01L 27/10841; H01L 27/1085; H01L 27/10864; H01L 27/10888; H01L 27/11; H01L 27/1207; H01L 27/1255; H01L 29/40114; G11C 11/405; G11C 11/404; G11C 11/565; G11C 16/0408; G11C 11/24; G11C 11/401; G11C 11/4096; G11C 16/02; G11C 16/0433; G11C 5/063
USPC ..... 365/154, 230.05, 189.05, 156, 158, 203, 365/149, 63, 189.04, 230.06, 189.15, 194, 365/191, 171, 189.011, 189.16, 189.11, 365/226, 190, 189.14, 222, 72, 189.08, 365/230.03, 189.09, 205, 173, 177, 51, 365/189.02, 207, 233.1, 187, 66, 174, 365/189.07, 189.19, 200, 49.1, 175, 196
See application file for complete search history.

(56) References Cited

U.S. PATENT DOCUMENTS

| | | |
|---|---|---|
| 7,859,889 B2 | 12/2010 | Kameshiro et al. |
| 8,588,000 B2 | 11/2013 | Kamata |
| 8,614,916 B2 | 12/2013 | Nagatsuka et al. |
| 9,734,914 B2 | 8/2017 | Kamata |
| 10,037,808 B2 | 7/2018 | Kamata |
| 2006/0227648 A1 | 10/2006 | Kameshiro et al. |
| 2008/0261357 A1* | 10/2008 | Kameshiro ....... H01L 29/66772 438/164 |
| 2008/0283816 A1 | 11/2008 | Takaishi |
| 2008/0285325 A1 | 11/2008 | Kameshiro et al. |
| 2011/0286256 A1 | 11/2011 | Kamata |
| 2014/0071768 A1 | 3/2014 | Kamata |
| 2017/0358363 A1 | 12/2017 | Kamata |

FOREIGN PATENT DOCUMENTS

| | | |
|---|---|---|
| JP | 2008-311641 A | 12/2008 |
| JP | 2012-004556 A | 1/2012 |
| JP | 2012-256400 A | 12/2012 |
| JP | 2015-130512 A | 7/2015 |
| JP | 2016-076717 A | 5/2016 |
| JP | 2017-016730 A | 1/2017 |
| JP | 2018-085357 A | 5/2018 |
| KR | 2006-0107412 A | 10/2006 |
| WO | WO-2011/145738 | 11/2011 |
| WO | WO-2017111798 A1 * | 6/2017 ........... G11C 11/404 |

OTHER PUBLICATIONS

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.
Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.
Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.
International Search Report (Application No. PCT/IB2019/054931), dated Sep. 10, 2019.
Written Opinion (Application No. PCT/IB2019/054931), dated Sep. 10, 2019.

* cited by examiner

MEMORY DEVICE AND ELECTRONIC DEVICE

TECHNICAL FIELD

One embodiment of the present invention relates to a memory device.

Furthermore, one embodiment of the present invention relates to an object, a method, or a manufacturing method. Alternatively, one embodiment of the present invention relates to a process, a machine, manufacture, or a composition of matter. One embodiment of the present invention relates to a driving method thereof, or a manufacturing method thereof.

In this specification and the like, a semiconductor device generally means a device that can function by utilizing semiconductor characteristics. A memory device, a display device, an electro-optical device, a power storage device, a semiconductor circuit, and an electronic device include a semiconductor device in some cases. In addition, a memory device, a display device, an electro-optical device, a power storage device, a semiconductor circuit, and an electronic device can be also referred to as a semiconductor device.

BACKGROUND ART

A silicon-based semiconductor material is widely known as a semiconductor thin film that can be used in a transistor, and as another material, an oxide semiconductor (OS) has attracted attention. Examples of oxide semiconductors include not only single-component metal oxides, such as indium oxide and zinc oxide, but also multi-component metal oxides. Among the multi-component metal oxides, in particular, an In—Ga—Zn oxide (hereinafter also referred to as IGZO) has been actively studied.

From the studies on IGZO, in an oxide semiconductor, a CAAC (c-axis aligned crystalline) structure and an nc (nanocrystalline) structure, which are not single crystal nor amorphous, have been found (see Non-Patent Documents 1 to 3). In Non-Patent Documents 1 and 2, a technique for fabricating a transistor using an oxide semiconductor having the CAAC structure is disclosed. Moreover, Non-Patent Documents 4 and 5 disclose that a fine crystal is included even in an oxide semiconductor which has lower crystallinity than an oxide semiconductor having the CAAC structure or the nc structure.

In addition, a transistor which includes IGZO as an active layer has an extremely low off-state current (see Non-Patent Document 6), and an LSI and a display utilizing the transistor characteristics have been reported (see Non-Patent Documents 7 and 8).

A variety of semiconductor devices utilizing a transistor including an oxide semiconductor in its channel formation region (hereinafter also referred to as an "OS transistor" or an "OS-FET") have been proposed.

Patent Document 1 discloses an example of using an OS transistor for a memory cell (memory element) of a memory device. Since the OS transistor has an extremely low current-state current (also referred to as "off-state current") that flows between a source and a drain in an off state, the memory device can have a small or no storage capacitor. With a small or no storage capacitor, a highly integrated memory device can be achieved.

REFERENCE

Patent Document

[Patent Document 1] Japanese Published Patent Application No. 2012-256400

Non-Patent Document

[Non-Patent Document 1] S. Yamazaki et al., "SID Symposium Digest of Technical Papers", 2012, volume 43, issue 1, p. 183-186

[Non-Patent Document 2] S. Yamazaki et al., "Japanese Journal of Applied Physics", 2014, volume 53, Number 4S, p. 04ED18-1-04ED18-10

[Non-Patent Document 3] S. Ito et al., "The Proceedings of AM-FPD'13 Digest of Technical Papers", 2013, p. 151-154

[Non-Patent Document 4] S. Yamazaki et al., "ECS Journal of Solid State Science and Technology", 2014, volume 3, issue 9, p. Q3012-Q3022

[Non-Patent Document 5] S. Yamazaki, "ECS Transactions", 2014, volume 64, issue 10, p. 155-164

[Non-Patent Document 6] K. Kato et al., "Japanese Journal of Applied Physics", 2012, volume 51, p. 021201-1-021201-7

[Non-Patent Document 7] S. Matsuda et al., "2015 Symposium on VLSI Technology Digest of Technical Papers", 2015, p. T216-T217

[Non-Patent Document 8] S. Amano et al., "SID Symposium Digest of Technical Papers", 2010, volume 41, issue 1, p. 626-629

SUMMARY OF THE INVENTION

Problems to be Solved by the Invention

However, a small or no storage capacitor causes a problem of a reduction in a data retention time period or a high likelihood of being affected by operation noise or the like from an adjacent memory element.

An object of one embodiment of the present invention is to provide a semiconductor device with a high degree of integration. Another object of one embodiment of the present invention is to provide a semiconductor device which can operate at high speed. Another object of one embodiment of the present invention is to provide a semiconductor device capable of retaining data for a long time. Another object of one embodiment of the present invention is to provide a semiconductor device with reduced power consumption. Another object of one embodiment of the present invention is to provide a novel semiconductor device.

Note that the description of a plurality of objects does not preclude the existence of each object. One embodiment of the present invention does not necessarily achieve all of these objects. Objects other than those listed above will be apparent from the description of the specification, the drawings, the claims, and the like, and such objects could be objects of one embodiment of the present invention.

Means for Solving the Problems

One embodiment of the present invention is a memory device including a plurality of memory cells, and one memory cell includes a first transistor and a second transistor. One of a source and a drain of the first transistor is electrically connected to a gate of the second transistor through a node SN. Data written through the first transistor is retained at the node SN. When an OS transistor is used as the first transistor, formation of a storage capacitor is not needed. A region with a low dielectric constant is provided outside the memory cell.

Another embodiment of the present invention is a memory device including a memory cell, a first region, a first word line, a second word line, a first bit line, and a second bit line, where the memory cell includes a first transistor and a second transistor, where a semiconductor layer of the first transistor includes a metal oxide, where the first region includes a plurality of gaps, where the first bit line and the second bit line extend in a first direction, where the first word line and the second word line extend in a second direction, where a gate of the first transistor is electrically connected to the first word line, where one of a source and a drain of the first transistor is electrically connected to a gate of the second transistor, where the other of the source and the drain of the first transistor is electrically connected to the first bit line, where one of a source and a drain of the second transistor is electrically connected to the second word line, where the other of the source and the drain of the second transistor is electrically connected to the second bit line, where the first region includes a region extending in the first direction, and where in the region extending in the first direction, each of the plurality of gaps includes a region extending in a direction intersecting with the first direction.

Another embodiment of the present invention is a memory device including a memory cell, a first region, a first word line, a second word line, a first bit line, a second bit line, and a first conductive layer, where the memory cell includes a first transistor and a second transistor, where a semiconductor layer of the first transistor includes a metal oxide, where the first region includes a plurality of gaps, where the first bit line and the second bit line extend in a first direction, where the first word line and the second word line extend in a second direction, where a gate of the first transistor is electrically connected to the first word line, where one of a source and a drain of the first transistor is electrically connected to a gate of the second transistor, where the other of the source and the drain of the first transistor is electrically connected to the first bit line, where one of a source and a drain of the second transistor is electrically connected to the second word line, where the other of the source and the drain of the second transistor is electrically connected to the second bit line, where the first conductive layer includes a region overlapping with the semiconductor layer of the first transistor and a region overlapping with the one of the source and the drain of the first transistor, where the first region includes a region extending in the first direction, where in the region extending in the first direction, each of the plurality of gaps includes a region extending in a direction intersecting with the first direction.

The first conductive layer includes a region that functions as a back gate of the first transistor.

The semiconductor layer preferably contains at least one or both of In and Zn.

The first region may include a region extending in the second direction. A plurality of gaps are provided in the region extending in the second direction. Each of the plurality of gaps preferably includes a region extending in a direction intersecting with the second direction.

An area where the gate electrode and a semiconductor layer of the second transistor overlap with each other is preferably larger than an area where the gate electrode and the semiconductor layer of the first transistor overlap with each other. For example, the area where the gate electrode and the semiconductor layer of the second transistor overlap with each other is preferably greater than or equal to 1 time and less than or equal to 10 times the area where the gate electrode and the semiconductor layer of the first transistor overlap with each other.

Effect of the Invention

According to one embodiment of the present invention, a semiconductor device with a high integration density can be provided. According to one embodiment of the present invention, a semiconductor device which can operate at high speed can be provided. According to one embodiment of the present invention, a semiconductor device capable of retaining data for a long time can be provided. According to one embodiment of the present invention, a semiconductor device with reduced power consumption can be provided. According to one embodiment of the present invention, a novel semiconductor device can be provided.

Note that the descriptions of the effects do not disturb the existence of other effects. One embodiment of the present invention does not have to have all of these effects. Effects other than these will be apparent from the description of the specification, the drawings, the claims, and the like and effects other than these can be derived from the description of the specification, the drawings, the claims, and the like.

MODE FOR CARRYING OUT THE INVENTION

Figure 1:
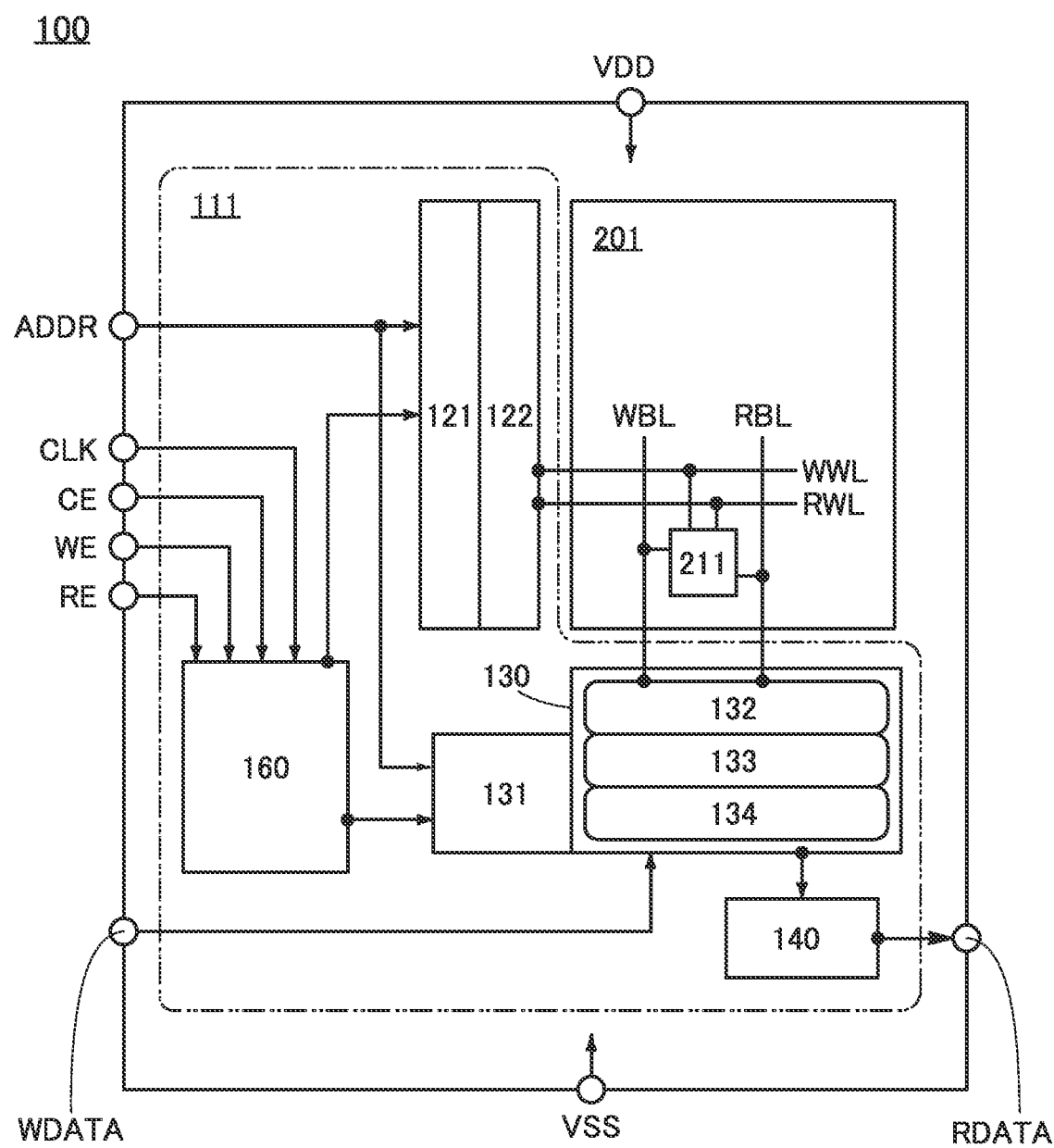
FIG. 1 is a diagram illustrating a structure example of a semiconductor device.

Embodiments of the present invention will be described in detail with reference to the drawings. However, the present invention is not limited to the following description, and it is readily appreciated by those skilled in the art that modes and details can be modified in various ways without departing from the spirit and the scope of the present invention. Therefore, the present invention should not be limited to description of the following embodiments and examples.

Note that in the structures of the present invention described below, the same portions or portions having similar functions are denoted by the same reference numerals in different drawings, and description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification, a high power supply potential and a low power supply potential are sometimes referred to as an H level (also referred to as "VDD" or an "H potential") and an L level (also referred to as "VSS" or an "L potential"), respectively.

Note that voltage refers to a difference between potentials of two points, and a potential refers to electrostatic energy (electric potential energy) of a unit charge at a given point in an electrostatic field. In general, a difference between a potential of one point and a reference potential (e.g., a ground potential) is merely called a potential or voltage, and a potential and voltage are used as synonyms in many cases. Therefore, in this specification and the like, potential is interchangeable with voltage and voltage is interchangeable with potential unless explicitly stated.

In this specification, the embodiments and the examples described below can be combined as appropriate. In addition, in the case where a plurality of structure examples are described in one embodiment, some of the structure examples can be combined as appropriate.

In this specification and the like, a metal oxide is an oxide of metal in a broad sense. Metal oxides are classified into an oxide insulator, an oxide conductor (including a transparent oxide conductor), an oxide semiconductor, and the like. For example, in the case where a metal oxide is used in a semiconductor layer of a transistor, the metal oxide is referred to as an oxide semiconductor in some cases. In the case where an OS transistor is mentioned, the OS transistor can also be referred to as a transistor including a metal oxide or an oxide semiconductor. In this specification and the like, a metal oxide containing nitrogen is also referred to as a metal oxide in some cases.

Unless otherwise specified, transistors described in this specification and the like are enhancement (normally-off) n-channel field-effect transistors. Thus, unless otherwise specified, the threshold voltage (also referred to as "Vth") is higher than 0 V.

Embodiment 1

In this embodiment, a memory device of one embodiment of the present invention will be described.

<Memory device>

FIG. 1 is a block diagram illustrating a structure example of a memory device. A memory device 100 includes a peripheral circuit 111 and a memory cell array 201. The peripheral circuit 111 includes a row decoder 121, a word line driver circuit 122, a column decoder 131, a bit line driver circuit 130, an output circuit 140, and a control logic circuit 160. The cell array 201 includes a memory cell 211, a word line WWL, a word line RWL, a bit line WBL, and a bit line RBL.

The word line driver circuit 122 has a function of supplying a potential to the word line WWL and the word line RWL. The bit line driver circuit 130 includes a precharge circuit 132, an amplifier circuit 133, and an input/output circuit 134. The precharge circuit 132 has a function of precharging the bit line RBL or the like. The amplifier circuit 133 has a function of amplifying a data signal read from the wiring RBL.

The word line WWL, the word line RWL, the bit line WBL, and the bit line RBL are connected to the memory cell 211, which are described in details later. An amplified data signal is output to the outside of the memory device 100 as a digital data signal RDATA through the output circuit 140.

The memory device 100 is supplied with VDD and VSS as power supply potentials from the outside.

Furthermore, to the memory device 100, a clock signal CLK, a chip enable signal CE, a write enable signal WE, a read enable signal RE, an address signal ADDR, a data signal WDATA, and the like are input from the outside. The address signal ADDR is input to the row decoder 121 and the column decoder 131, and the data signal WDATA is input to the input/output circuit 134.

The control logic circuit 160 processes the chip enable signal CE, the write enable signal WE, and the read enable signal RE and generates control signals for the row decoder 121 and the column decoder 131. For example, in the case where the chip enable signal CE is at a high level and the write enable signal WE is at a low level, the row decoder 121 and the column decoder 131 perform reading operation; in the case where the chip enable signal CE is at a high level and the write enable signal WE is at a high level, the row decoder 121 and the column decoder 131 perform writing operation; and in the case where the chip enable signal CE is at a low level, the row decoder 121 and the column decoder 131 can perform standby operation regardless of whether the write enable signal WE is at a high level or a low level.

Note that a signal processed by the control logic circuit 160 is not limited to the above. Another signal may be input to the control logic circuit 160 as necessary.

Note that whether each circuit or each signal described above is provided or not can be appropriately determined as needed.

OS transistors can be used as transistors included in the cell array 201. Moreover, OS transistors can be used as transistors included in the peripheral circuit 111. When the cell array 201 and the peripheral circuit 111 are formed using OS transistors, the cell array 201 and the peripheral circuit 111 can be formed in the same manufacturing process, and the manufacturing cost can be kept low.

Note that the OS transistor can be applied not only to a memory device but also to a logic circuit typified by a CPU (Central Processing Unit) or a GPU (Graphics Processing Unit). A general term of an integrated circuit including an OS transistor is called an "OS-LSI".

[Structure Example of Cell Array]

Figure 2A:
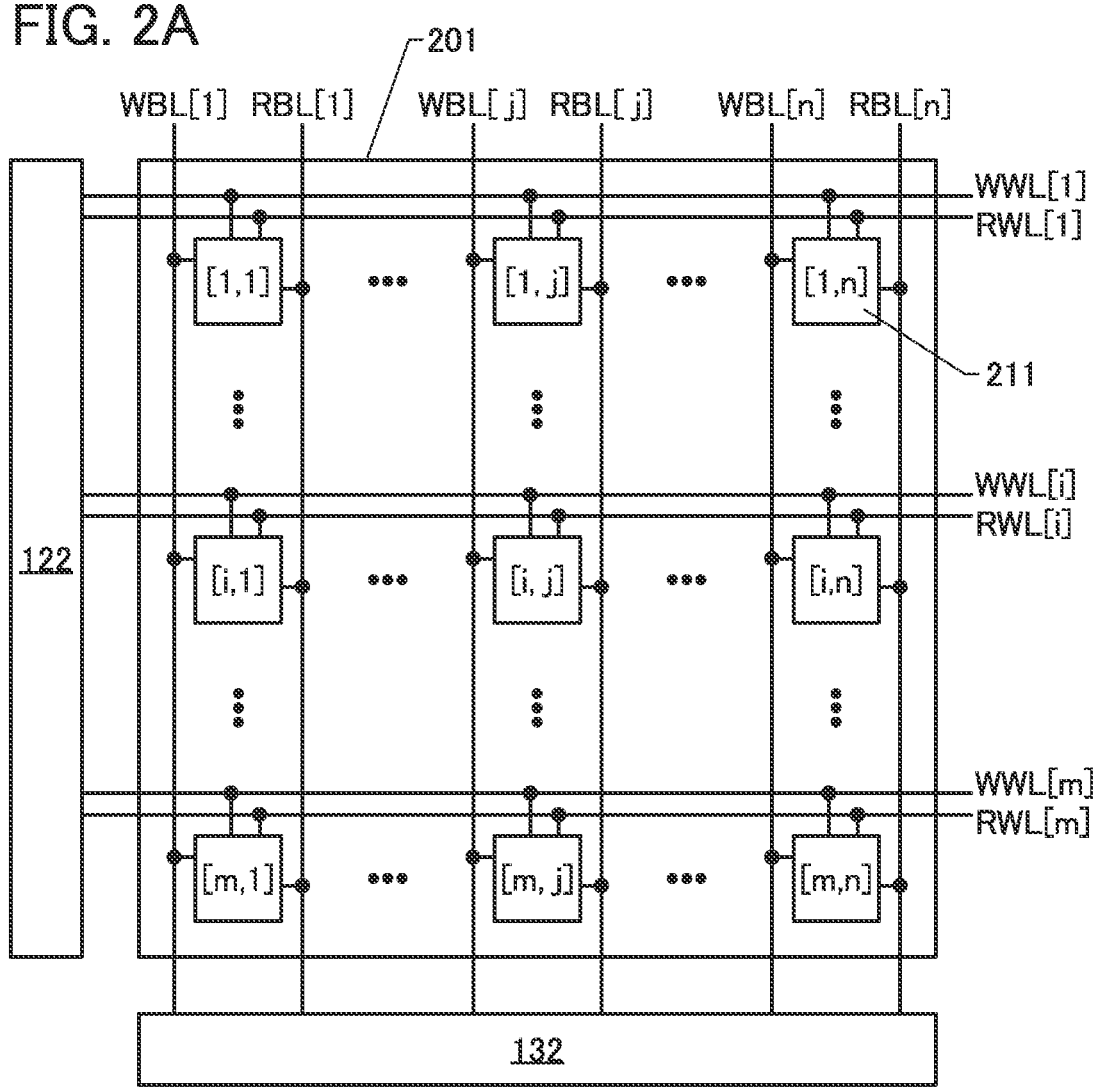
FIG. 2(A) to FIG. 2(C) are diagrams illustrating a structure example of a cell array or a memory cell.

FIG. 2(A) illustrates the details of the cell array 201. The cell array 201 includes a total of m×n memory cells 211 of m cells (m is an integer of 1 or more) in one column and n cells (n is an integer of 1 or more) in one row, and the memory cells 211 are arranged in a matrix.

FIG. 2(A) also illustrates addresses of the memory cells 211. For example, [1,1] represents a memory cell 211 positioned at an address of the first row and the first column, and [i,j] (i is an integer of 1 to m, and j is an integer of 1 to n) represents a memory cell 211 positioned at an address of the i-th row and the j-th column. The number of wirings connecting the cell array 201 and the word line driver circuit 122 is determined by the configuration of the memory cell 211, the number of memory cells 211 included in one column, or the like. The number of wirings connecting the cell array 201 and the bit line driver circuit 130 is determined by the configuration of the memory cell 211, the number of memory cells 211 included in one row, or the like.

In this embodiment, the cell array 201 includes n bit lines WBL (WBL[1] to WBL[n]), n bit lines RBL (RBL[1] to RBL[n]), m word lines WWL (WWL[1] to WWL[m]), and m word lines RWL (RWL[1] to RWL[m]).

The memory cell 211 is connected to the bit line WBL, the bit line RBL, the word line WWL, and the word line RWL.

As illustrated in FIG. 2(A), the memory cell 211 whose address is [i, j] is electrically connected to the word line driver circuit 122 through the word line WWL[i] and the word line RWL[i] and is electrically connected to the bit line driver circuit 130 through the bit line WBL[j] and the bit line RBL[j].

[Configuration Example of Memory Cell]

Figure 2B:
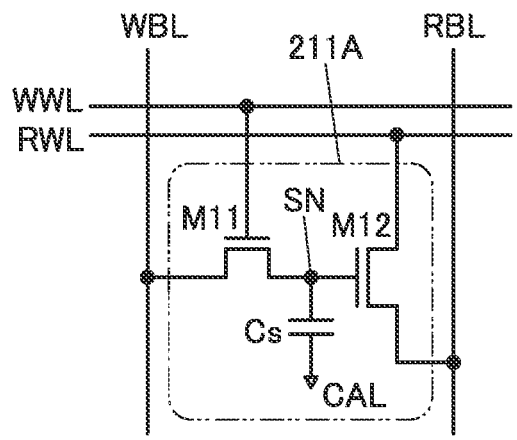

FIGS. 2(B) and 2(C) and FIGS. 5(A) to 5(D) illustrate a circuit structure example that can be used for the memory cell 211. FIG. 2(B) illustrates a circuit structure example of a gain cell type memory cell 211A including two transistors and one capacitor (also referred to as "2Tr1C type"). The memory cell 211A includes a transistor M11, a transistor M12, and a capacitor Cs.

In the memory cell 211A, one of a source and a drain of the transistor M11 is electrically connected to a first terminal of the capacitor Cs and a gate of the transistor M12, the other of the source and the drain of the transistor M11 is connected to the bit line WBL, and a gate of the transistor M11 is connected to the word line WWL. One of a source and a drain of the transistor M12 is electrically connected to the word line RWL, and the other of the source and the drain of the transistor M12 is electrically connected to the bit line RBL. A second terminal of the capacitor Cs is electrically connected to a wiring CAL. The wiring CAL functions as a wiring for applying a predetermined potential to the second terminal of the capacitor Cs. A node where the one of the source and the drain of the transistor M11, the first terminal of the capacitor Cs, and the gate of the transistor M12 are electrically connected to each other is called a node SN.

The bit line WBL functions as a write bit line, the bit line RBL functions as a read bit line, the word line WWL functions as a write word line, and the word line RWL functions as a read word line. The transistor M11 has a function of a switch for controlling conduction or non-conduction between the node SN and the bit line WBL.

Figure 3:
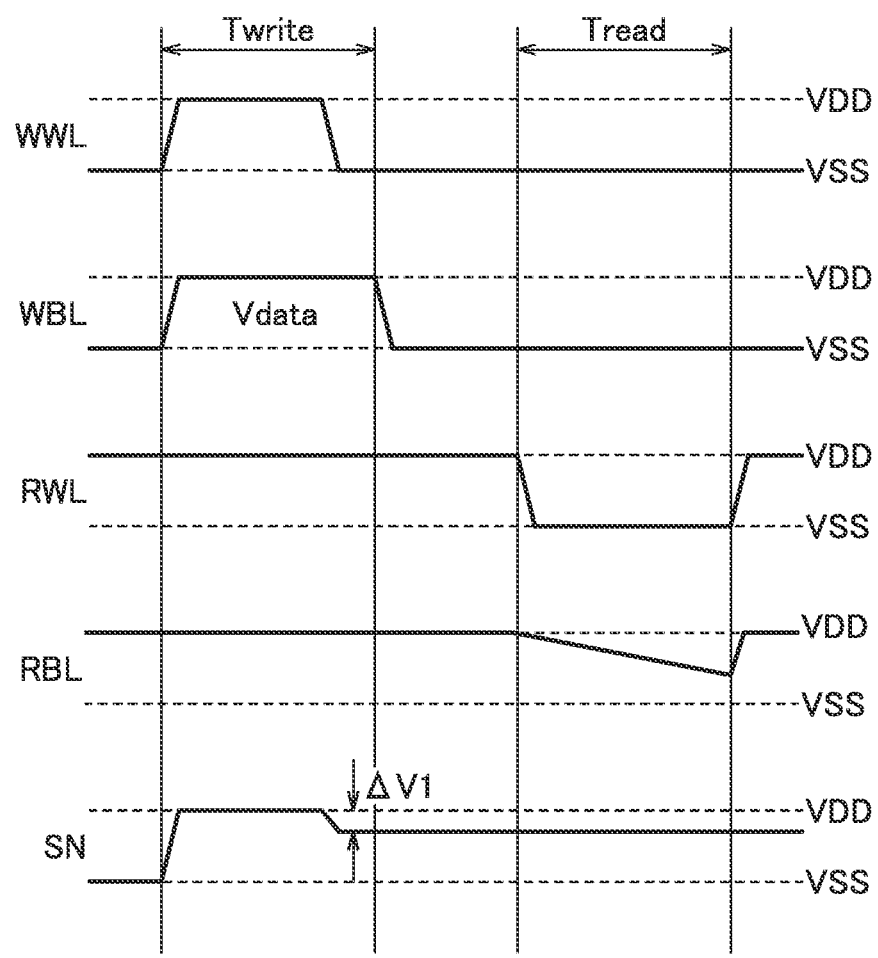
FIG. 3 is a timing chart showing an operation of a memory cell.

Data writing operation and data reading operation of the memory cell 211A will be described with reference to FIG. 3. FIG. 3 is a timing chart showing an operation of the memory cell 211A. Data writing is performed by applying VDD to the word line WWL in a data writing period (Twrite) to turn the transistor M11 into a conduction state (also referred to as "on-state") so that the node SN and the bit line WBL are electrically connected to each other. At this time, the potential of the word line RWL is set to VDD. It is also preferable that the potential of the bit line RBL be set to VDD.

Specifically, when the transistor M11 is in an on-state, a potential (e.g., VDD) corresponding to data to be written (Vdata) is applied to the bit line WBL so that the potential is written to the node SN through the transistor M11. After that, VSS is applied to the word line WWL to turn the transistor M11 into a non-conduction state (also referred to as "off-state"), so that the potential at the node SN is held.

Parasitic capacitance Cz is often generated between the gate of the transistor M11 and one of the source and the drain of the transistor M11. The word line WWL and the node SN are capacitively coupled through the parasitic capacitance Cz. Thus, when the potential of the word line WWL is decreased from VDD to VSS at the end of the writing operation, the potential of the node SN decreases by a voltage $\Delta V1$.

When the capacitance of the node SN is defined as capacitance Csn, the voltage $\Delta V1$ is determined by a ratio of the parasitic capacitance Cz to the capacitance Csn. The larger the parasitic capacitance Cz is than the capacitance Csn, the lower the voltage $\Delta V1$ can be.

The capacitance Csn includes parasitic capacitance Cx generated at the node SN and gate capacitance of the transistor M12. The larger the gate capacitance of the transistor M12 is, the larger the capacitance Csn is.

The capacitance value of the parasitic capacitance Cz is proportional to the gate capacitance of the transistor M11. In particular, the capacitance value is proportional to the channel width of the transistor M11. In the case where the parasitic capacitance Cx is sufficiently smaller than the gate capacitance of the transistor M12, the gate capacitance of the transistor M12 becomes dominant in the capacitance value of the capacitance Csn. In this case, the voltage $\Delta V1$ can be reduced by increasing the gate capacitance of the transistor M12 more than the gate capacitance of the transistor M11.

Data reading is performed by applying a predetermined potential to the bit line RBL in a data reading period (Tread), making the bit line RBL in an electrically floating state, and then applying a low-level potential to the word line RWL. Hereinafter, applying a predetermined potential to the bit line RBL to make the bit line RBL in a floating state is expressed as precharging the bit line RBL.

For example, VDD is precharged to the bit line RBL and then VSS is applied to the word line RWL. At this time, when the potential difference between the node SN and the word line RWL is equal to or higher than the threshold voltage of the transistor M12, the potential of the bit line RBL decreases at a rate in accordance with the potential difference. In other words, by measuring a change in potential of the bit line RBL, the potential held at the node SN can be read out.

A row where the memory cell 211A to which data is to be written is arranged is selected by the word line WWL to which VDD is applied, and a row where the memory cell 211 from which data is to be read is arranged is selected by the word line RWL to which VSS is applied. In contrast, a row where the memory cell 211 to which data is not written is arranged can be in a non-selected state by applying VSS to the word line WWL, and a row where the memory cell 211A from which data is not read is arranged can be in a non-selected state by applying, to the world line RWL, the potential higher than or equal to a potential precharged to the bit line RBL.

Here, transistors containing a metal oxide in their channel formation regions (OS transistors) can be used as the transistor M11 and the transistor M12. For example, in the channel formation regions of the transistor M11 and the transistor M12, a metal oxide containing any one of indium, an element M (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like), and zinc can be used. In particular, a metal oxide formed of indium, gallium, and/or zinc is preferable.

Since the OS transistor has extremely low off-state current, a potential written to the node SN can be retained for a long time when the OS transistor is used as the transistor M11. In other words, data written to the memory cell 211A can be retained for a long time.

There is not particular limitation on the transistor used as the transistor M12. As the transistor M12, an OS transistor, a Si transistor, or another transistor may be used.

Note that in the case where a Si transistor is used as the transistor M12, silicon used for a semiconductor layer in which a channel is formed may be amorphous silicon, polycrystalline silicon, low temperature poly-silicon (LTPS), or single crystal silicon. Since a Si transistor has higher field-effect mobility than an OS transistor in some cases, the use of the Si transistor as a reading transistor enables the operation speed in reading data to increase.

In the case where an OS transistor is used as the transistor M11 and a Si transistor is used as the transistor M12, they may be provided in different layers to be stacked. The OS transistor can be manufactured using the same manufacturing apparatus and process as those for the Si transistor. Thus, a combination (hybrid) of the OS transistor and the Si transistor is facilitated, and high integration is facilitated.

Furthermore, when the OS transistor is used as the transistor M12, leakage current in a non-selection state can be extremely low; thus, reading accuracy can be improved. When OS transistors are used for both the transistor M11 and the transistor M12, the number of manufacturing steps of the semiconductor device can be reduced and the productivity can be increased. For example, the semiconductor device can be manufactured at a process temperature lower than or equal to 400° C.

In this specification and the like, a memory device using a 2Tr1C-type memory cell using an OS transistor as the transistor M11 is referred to as NOSRAM (non-volatile oxide semiconductor random access memory).

As described above, the memory cell 211A is a 2Tr1C-type memory cell. The memory cell 211A can operate as a memory by amplifying accumulated charge by the transistor M12 even when the capacitor Cs accumulating charge is small. Since an OS transistor has extremely low off-state current, the capacitor Cs can be downsized or eliminated by using an OS transistor as the transistor M11.

Figure 2C:
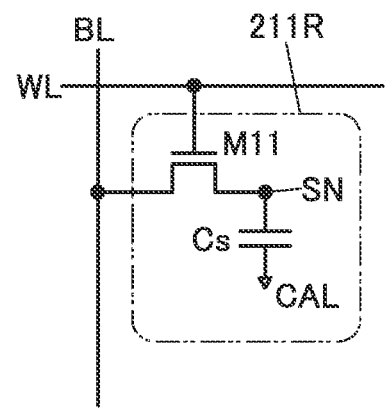

FIG. 2(C) illustrates an example of a circuit structure of a DRAM (dynamic random access memory)-type memory cell 211R including one transistor and one capacitor. The memory cell 211R includes a transistor M11 and a capacitor Cs.

In the memory cell 211R, one of a source and a drain of the transistor M11 is electrically connected to a first terminal of the capacitor Cs, the other of the source and the drain of the transistor M11 is electrically connected to a bit line BL, and a gate of the transistor M11 is electrically connected to a word line WL. A second terminal of the capacitor Cs is electrically connected to a wiring CAL. The wiring CAL functions as a wiring for applying a predetermined potential to the second terminal of the capacitor CS. A node electrically connected to the one of the source and the drain of the transistor M11 and the first terminal of the capacitor Cs is referred to as a node SN.

Also in the memory cell 211R, the OS transistor is used as the transistor M11, whereby the capacitor Cs can be downsized or eliminated. In addition, with the transistor M11, written data can be held for a long time, and thus the frequency of the refresh operation for the DRAM-type memory cell can be decreased. Moreover, refresh operation for the DRAM-type memory cell can be omitted.

In this specification and the like, a DRAM-type memory cell using an OS transistor as the transistor M11 is referred to as a DOSRAM (dynamic oxide semiconductor random access memory).

With use of the OS transistor, the area occupied by a memory cell can be reduced. Thus, the memory device can be further miniaturized or highly integrated.

Figure 4A:
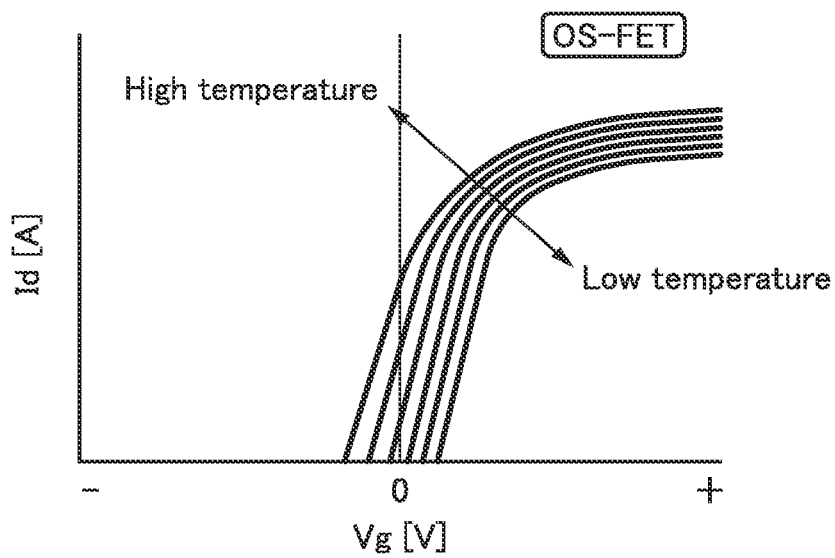
FIG. 4(A) and FIG. 4(B) are diagrams each showing electrical characteristics of a transistor.
Figure 4B:
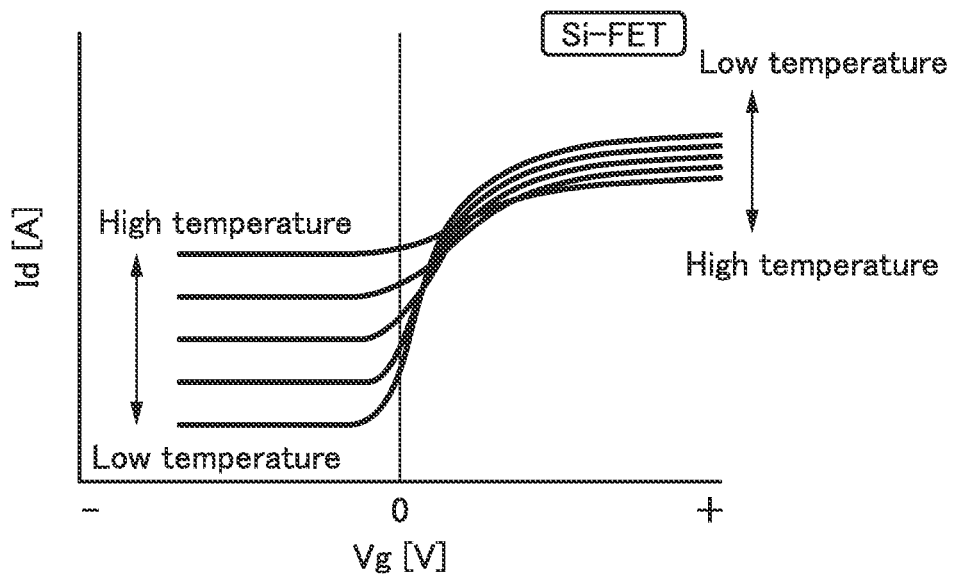

Here, temperature dependence of Id-Vg characteristics, which is one of the electrical characteristics of a transistor, is described. FIG. 4(A) and FIG. 4(B) show an example of Id-Vg characteristics, one of electrical characteristics of a transistor. The Id-Vg characteristics show a change in drain current (Id) with respect to a change in gate voltage (Vg).

The horizontal axis in FIG. 4(A) and FIG. 4(B) represents Vg on a linear scale. The vertical axis in FIG. 4(A) and FIG. 4(B) represents Id on a log scale.

FIG. 4(A) shows the Id-Vg characteristics of an OS transistor. FIG. 4(B) shows the Id-Vg characteristics of a transistor using silicon for a semiconductor layer in which a channel is formed (also referred to as a "Si transistor" of "Si-FET"). Note that both FIG. 4(A) and FIG. 4(B) show the Id-Vg characteristics of an n-channel transistor.

As shown in FIG. 4(A), the off-state current is less likely to increase in the OS transistor even in the operation in high-temperature environments. The OS transistor can achieve an on/off ratio of 10 digits or larger even when the operating temperature is higher than or equal to 125° C. and lower than or equal to 150° C. In addition, in the OS transistor, Vth shifts in the negative direction with the increase in operating temperature, and the on-state current increases. Thus, as the operating temperature increases, the frequency characteristics are likely to increase. On the other hand, in the Si transistor, the off-state current increases with the increase in temperature as shown in FIG. 4(B). Moreover, in the Si transistor, Vth shifts in the positive direction with the increase in temperature, and the on-state current decreases.

When OS transistors are used for the transistor M11 and the transistor M12, data can be retained for a long time even in operation at high temperatures. Moreover, power consumption of the memory device can be reduced even in operation at high temperatures.

When OS transistors are used as the transistor M11 and the transistor M12, operation frequency higher than or equal to 200 MHz can be achieved, for example, at a drive voltage of 2.5 V and an operation temperature ranging from −40° C. to 85° C.

Figure 5A:
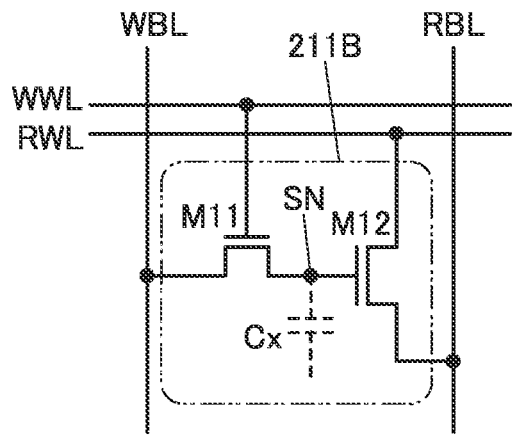
FIG. 5(A) to FIG. 5(F) are diagrams each illustrating a structure example of a memory cell.

FIG. 5(A) illustrates a circuit structure example of the memory cell 211 without the capacitor Cs. A memory cell 211B illustrated in FIG. 5(A) has a circuit structure where the capacitor Cs is excluded from the structure of the memory cell 211A. In the memory cell 211B, a charge (potential) written to the node SN is held mainly by the gate capacitance of the transistor M12 and the parasitic capacitance Cx. Note that the gate capacitance can be regarded as part of the parasitic capacitance Cx.

Alternatively, a transistor with a back gate may be used for one or both of the transistor M11 and the transistor M12.

In an actual transistor, a gate and a back gate are provided to overlap with each other with a channel formation region of a semiconductor layer positioned therebetween. Both the gate and the back gate can function as a gate. Thus, in the case where one of them is referred to as a "back gate", the other is referred to as a "front gate" in some cases. Furthermore, there is a case where one of them is referred to as a "first gate" and the other is referred to as a "second gate".

The potential of the back gate may be the same as the potential of the gate, or may be a ground potential or a given potential. By changing the potential of the back gate independently of that of the gate, the threshold voltage of the transistor can be changed.

When the back gate is provided and has the same potential as the gate, a region in the semiconductor layer where carrier flows is enlarged in a film-thickness direction; accordingly, the amount of carrier transfer is increased. As a result, the on-state current of the transistor is increased and the field-effect mobility is increased.

Therefore, a transistor has a high on-state current with respect to its occupied area can be provided. That is, the area occupied by the transistor can be small for a required on-state current. Therefore, a semiconductor device having a high degree of integration can be achieved.

Figure 5B:
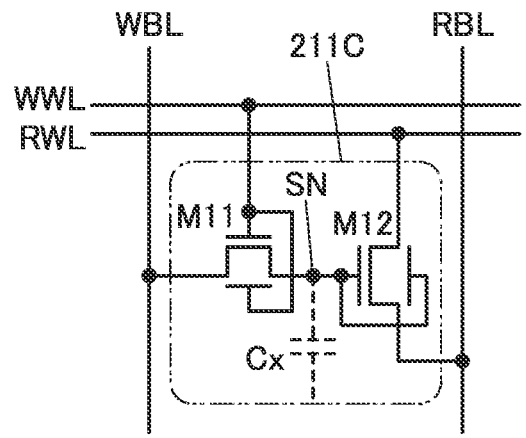
Figure 5C:
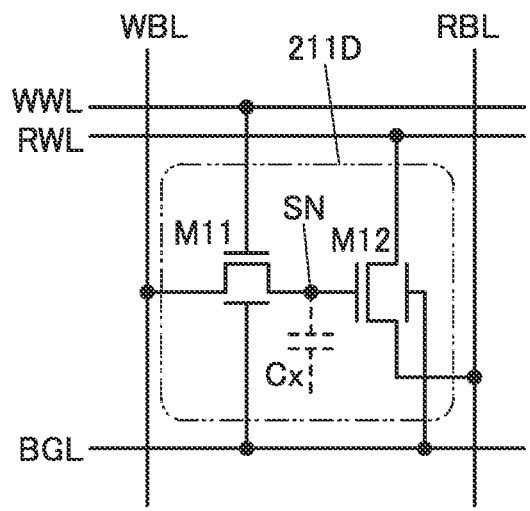
Figure 5D:
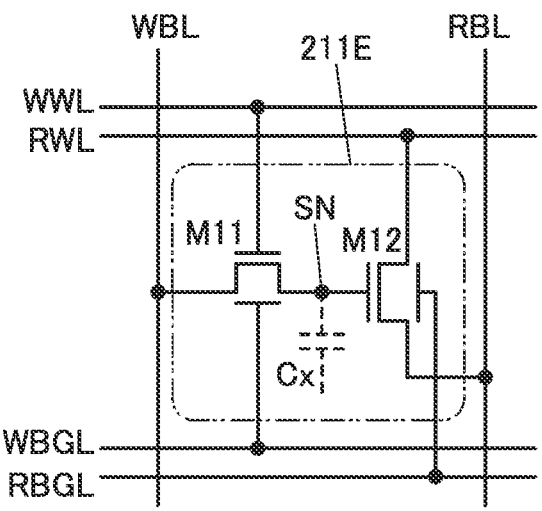

FIGS. 5(B) to 5(D) each illustrate a circuit structure example in the case where a transistor with a back gate (four-terminal transistor, also referred to as "four-terminal element") is used for each of the transistor M11 and the transistor M12. A memory cell 211C illustrated in FIG. 5(B), a memory cell 211D illustrated in FIG. 5(C), and a memory cell 211E illustrated in FIG. 5(D) are modified examples of the memory cell 211B.

In the memory cell 211C illustrated in FIG. 5(B), a gate and a back gate of the transistor M11 are electrically connected to each other. In addition, a gate and the back gate of the transistor M12 are electrically connected.

In the memory cell 211D illustrated in FIG. 5(C), a back gate of the transistor M11 and a back gate of the transistor M12 are electrically connected to a wiring BGL. A predetermined potential can be applied to the back gates of the transistor M11 and the transistor M12 through the wiring BGL.

The threshold voltages of the transistor M11 and the transistor M12 can be changed by the potential of the wiring BGL. Specifically, the voltages applied to the back gates of the transistor M11 and the transistor M12 are increased, whereby the threshold voltage of each transistor is shifted negatively. By shifting the threshold voltages negatively, the on-state currents of the transistors can be increased, and the memory cell 211D can operate at a high speed.

Furthermore, the voltage applied to the back gates of the transistor M11 and the transistor M12 is decreased, whereby the threshold voltage of each transistor is shifted positively. By shifting the threshold voltages positively, the off-state currents of the transistors can be decreased, and data written to the memory cell 211D can be retained for a long time.

In the memory cell 211E illustrated in FIG. 5(D), a back gate of the transistor M11 is electrically connected to a wiring WBGL, and a back gate of the transistor M12 is electrically connected to a wiring RBGL. When the back gate of the transistor M11 and the back gate of the transistor M12 are connected to different wirings, the threshold voltages can be changed independently.

Note that memory devices using the memory cell 211B to the memory cell 211E can be referred to as NOSRAM.

Each of the transistors illustrated in FIG. 5(B) to FIG. 5(D) is a four-terminal element; hence, its input and output can be controlled independently of each other easily in a simpler manner than that in two-terminal elements typified by MRAM (Magnetoresistive Random Access Memory) utilizing MTJ (Magnetic Tunnel Junction) properties, ReRAM (Resistive Random Access Memory), phase-change memory, and the like.

In addition, the structure of MRAM, ReRAM, and phase-change memory may change at the atomic level when data is rewritten. In contrast, in the memory device of one embodiment of the present invention, data rewriting is performed by charging or discharging of charges with the transistor; thus, the memory device has characteristics such as high rewriting endurance and a few structure changes.

In the case where the capacitor Cs is not provided in the memory cell 211, the node SN is easily affected by noise. Specifically, the node SN is easily affected by a change in potential of an adjacent memory cell due to capacitive coupling with the adjacent memory cell and the like. As a result, a reduction in the data retention time, a reduction in the reading accuracy, and the like are caused, whereby the reliability of the memory device is lowered.

The above noise can be reduced by reducing the parasitic capacitance generated between adjacent memory cells. In one embodiment of the present invention, a low dielectric constant region (LDR) is provided outside the memory cell to reduce the parasitic capacitance between adjacent memory cells. It is acceptable as long as the dielectric constant of the LDR is lower than that of the adjacent insulating layer.

Figure 5E:
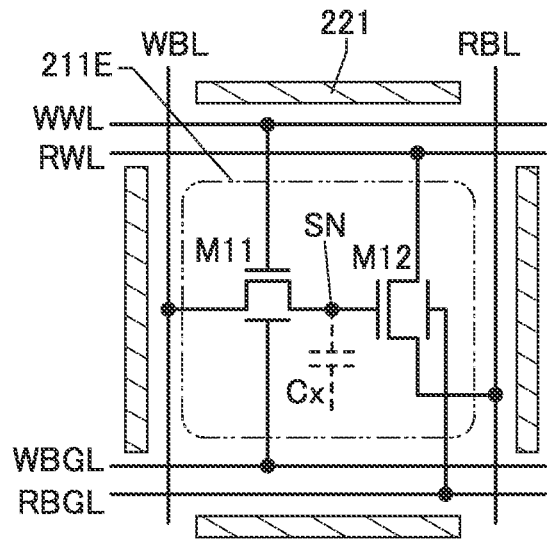
Figure 6:
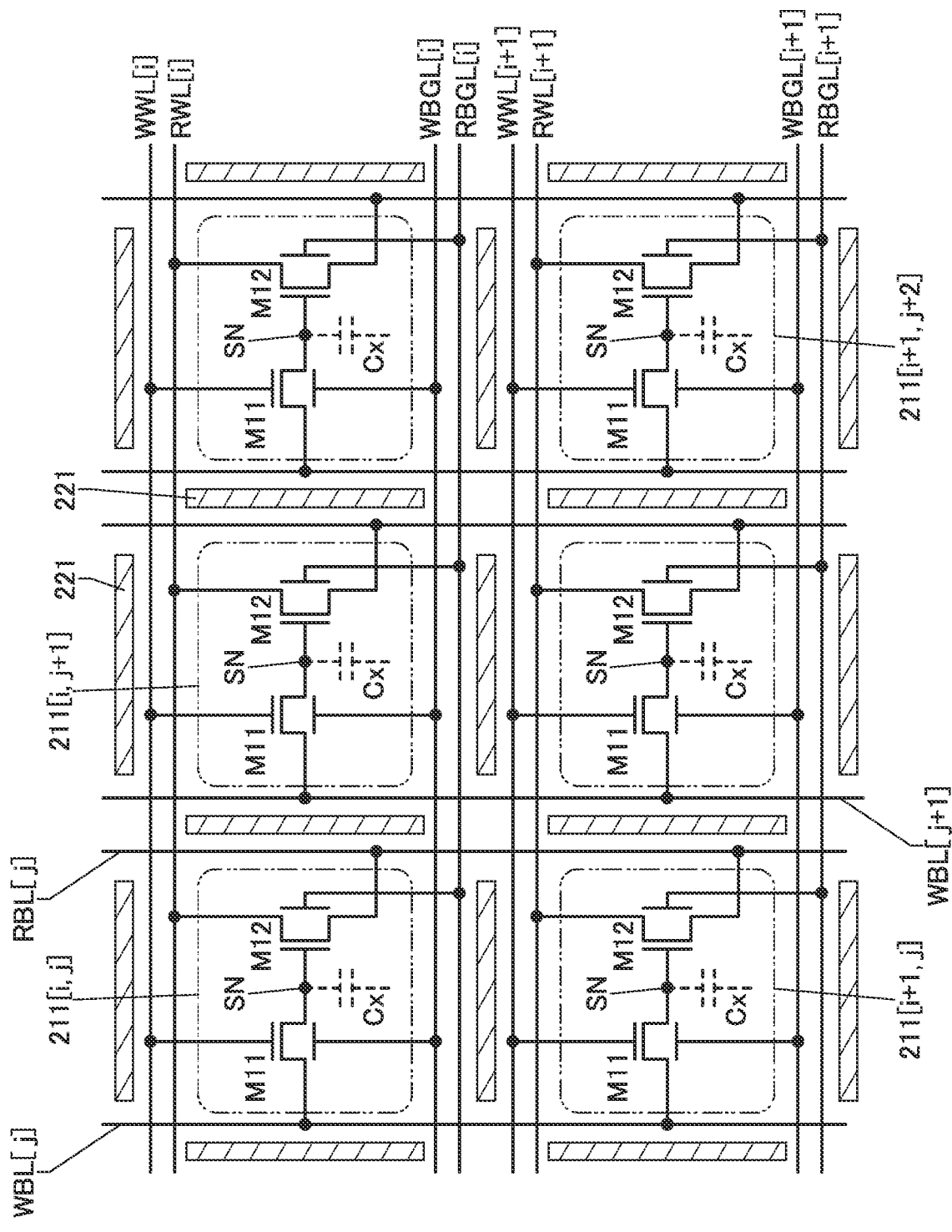
FIG. 6 is a diagram illustrating a structure example of a cell array.

For example, as illustrated in FIG. 5(E), an LDR 221 is provided outside the memory cell 211E. FIG. 6 illustrates an arrangement example of the memory cell 211 [i,j] to the memory cell 211 [i+1,j+2] arranged in a matrix and the LDR 221 illustrated in FIG. 5(E). Note that in FIG. 6, the memory cell 211E illustrated in FIG. 5(D) is used as the memory cell 211.

Figure 7:
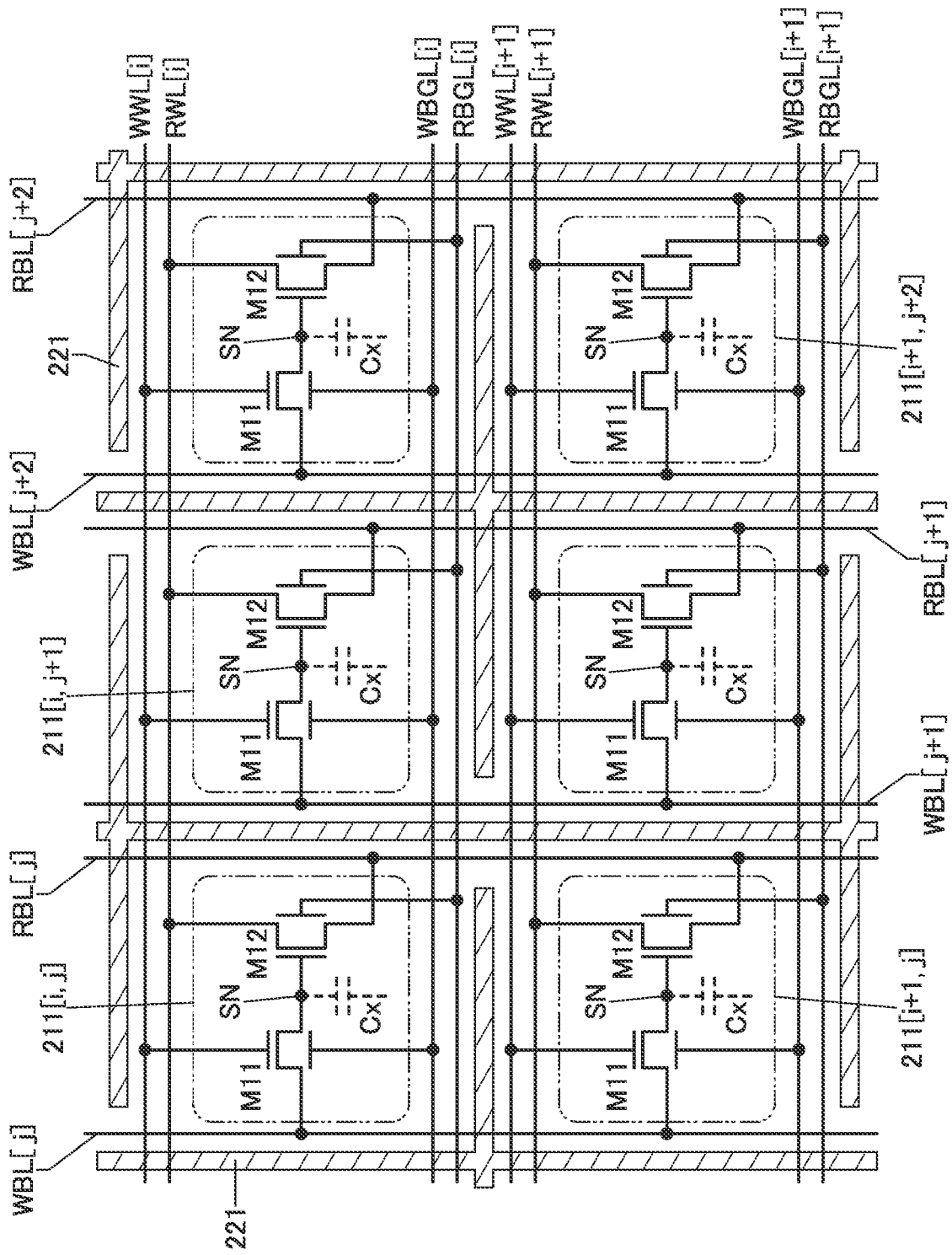
FIG. 7 is a diagram illustrating a structure example of a cell array.

FIG. 7 illustrates a modification example of FIG. 6. As illustrated in FIG. 7, some LDRs 221 may be connected to each other. The LDR 221 illustrated in FIG. 7 includes a region extending along the word line and a region extending along the bit line.

Figure 5F:
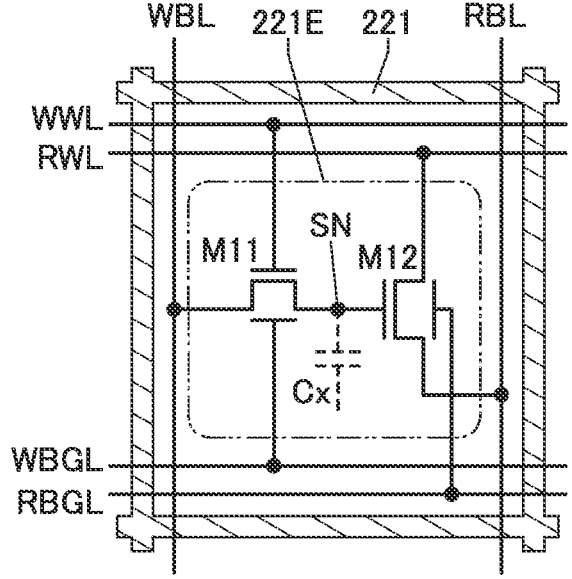
Figure 8:
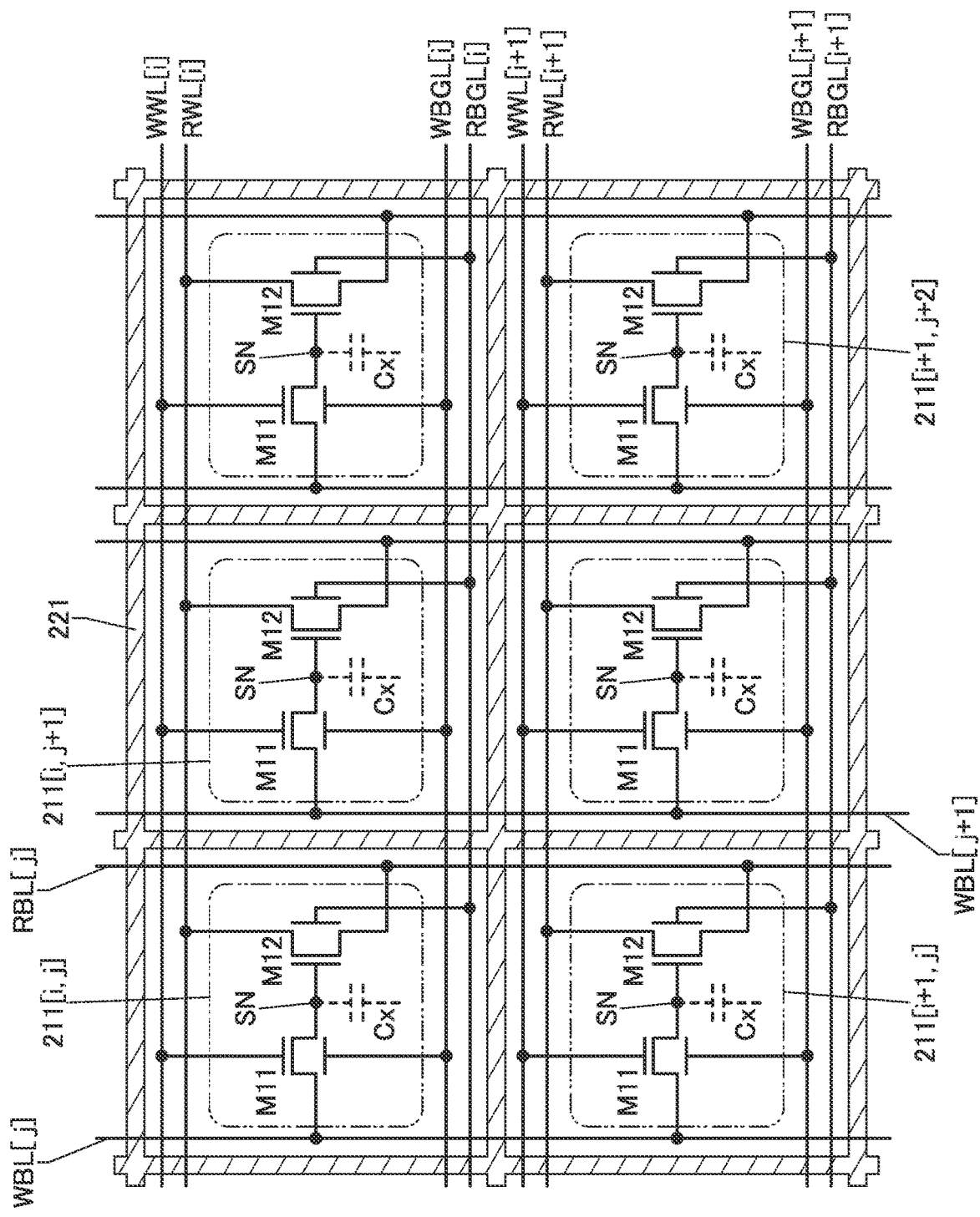
FIG. 8 is a diagram illustrating a structure example of a cell array.

As illustrated in FIG. 5(F), one memory cell 211E may be completely surrounded by the LDR 221. FIG. 8 illustrates an arrangement example of the memory cell 211[i,j] to the memory cell 211[i+1,j+2] arranged in a matrix and the LDR 221 illustrated in FIG. 5(F). In FIG. 8, the memory cell 211E is used as the memory cell 211. The LDR 221 illustrated in FIG. 8 also includes a region extending along the word line and a region extending along the bit line.

Providing the LDR enables a reduction in influence of noise, so that the reliability of the memory device can be enhanced.

This embodiment can be implemented in an appropriate combination with the structures described in the other embodiments and the like.

Embodiment 2

In this embodiment, planar structure examples and cross-sectional structure examples of the memory cell 211 and the LDR 221 will be described with reference to drawings.

Figure 9:
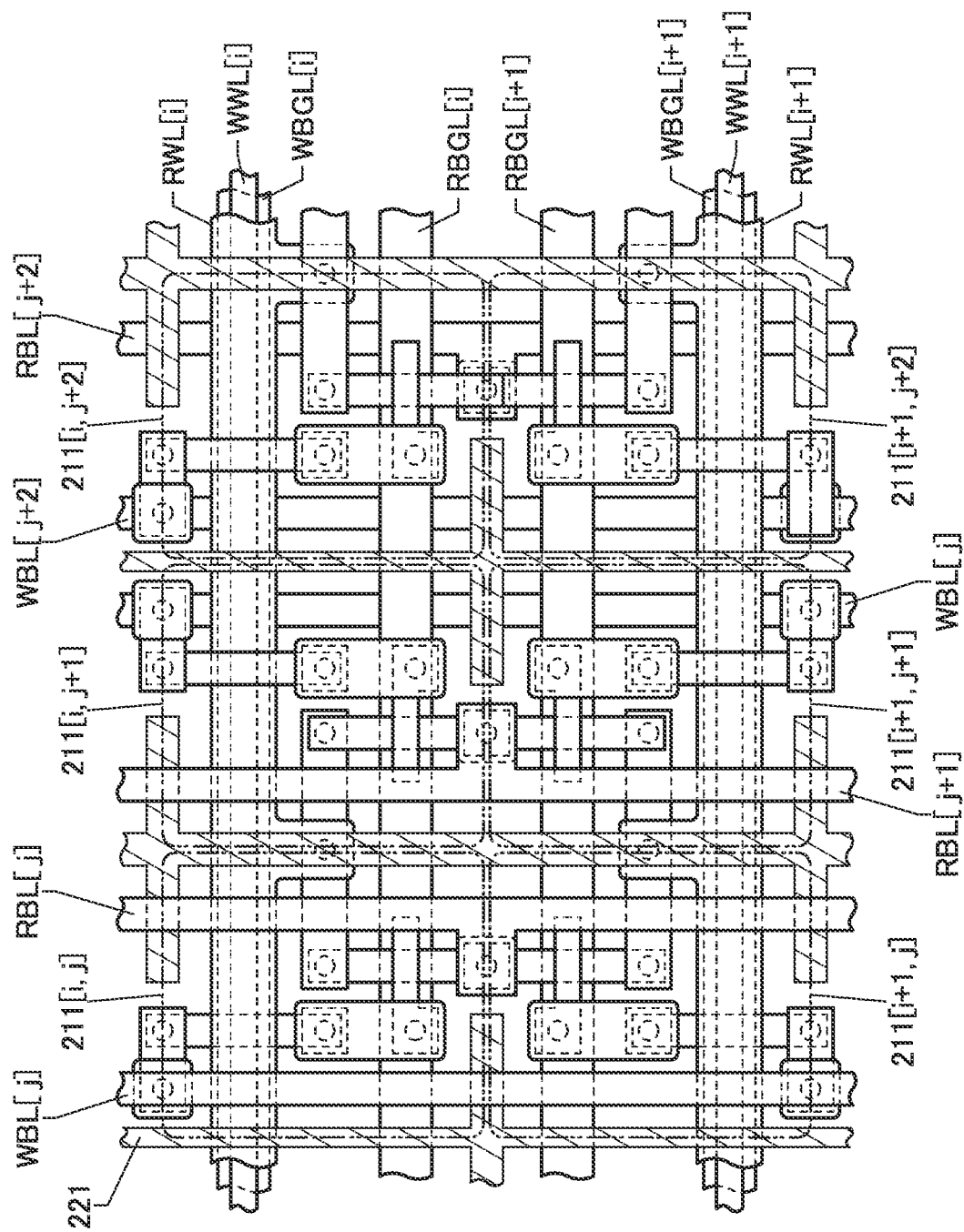
FIG. 9 is a diagram illustrating a structure example of a cell array.

FIG. 9 illustrates a planar structure example of the memory cell 211[i,j] to the memory cell 211 [i+1,j+2] arranged in a matrix. Note that FIG. 9 illustrates a planar structure example corresponding to the circuit diagram shown in FIG. 7.

In FIG. 9, two adjacent memory cells 211 are mirror symmetrically arranged. For example, the arrangement of the memory cell 211[i,j] and the memory cell 211[i,j+1] is mirror symmetry. The arrangement of the memory cell 211[i,j] and the memory cell 211[i+1,j] is also mirror symmetry. When the memory cells 211 are arranged in such a manner, a contact plug or the like can be shared between adjacent memory cells, and the memory cells 211 can be efficiently arranged. Accordingly, the degree of integration of the memory cells 211 can be improved.
<Planar Structure Example>

Figure 10A:
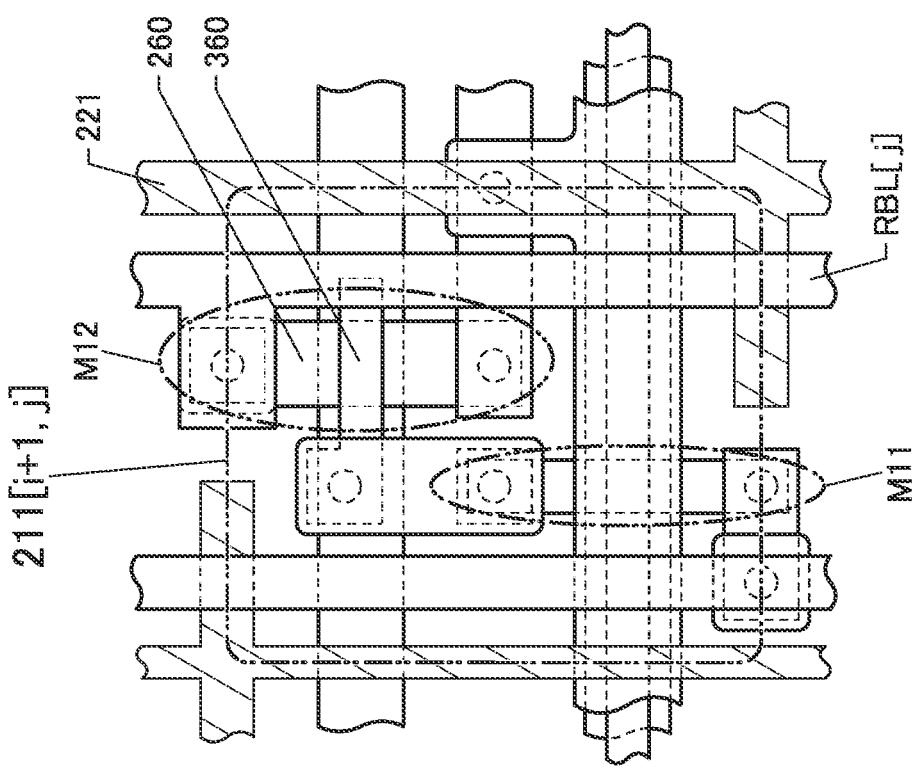
FIG. 10(A) and FIG. 10(B) are diagrams each illustrating a structure example of a memory cell.

FIG. 10(A) illustrates a planar structure example of the memory cell 211[i+1,j] in FIG. 7.

One of a source and a drain of the transistor M11 is electrically connected to a conductive layer 360 through an electrode 341. The conductive layer 360 functions as a gate electrode of the transistor M12. A region including the electrode 341 and the conductive layer 360 functions as the node SN. The other of the source and the drain of the transistor M11 is electrically connected to a conductive layer 399. The conductive layer 399 functions as the bit line WBL.

One of a source and a drain of the transistor M12 is electrically connected to a conductive layer 333 through a conductive layer 312, and the other of the source and the drain of the transistor M12 is electrically connected to a conductive layer 338. The conductive layer 333 functions as the word line RWL, and the conductive layer 338 functions as the bit line RBL.

The conductive layer 305 illustrated in FIG. 10(A) functions as the wiring RBGL, and a conductive layer 306 functions as the wiring WBGL. The conductive layer 261 functions as the word line WWL, and the conductive layer 333 functions as the word line RWL. Part of the conductive layer 305 functions as a back gate electrode of the transistor M12. Part of the conductive layer 306 functions as a back gate electrode of the transistor M11.

In FIG. 9 and FIG. 10, the LDR 221 includes a region extending along the bit line RBL (the conductive layer 338) and a region extending along the word line RWL.

The memory cell 211 of one embodiment of the present invention does not include the capacitor Cs, so that the area occupied by the memory cell 211 can be reduced. However, when the occupied area is reduced, the influence of noise generated from the adjacent memory cell is likely to increase. By providing the LDR 221, the noise transmitted to the node SN can be reduced.

Figure 10B:
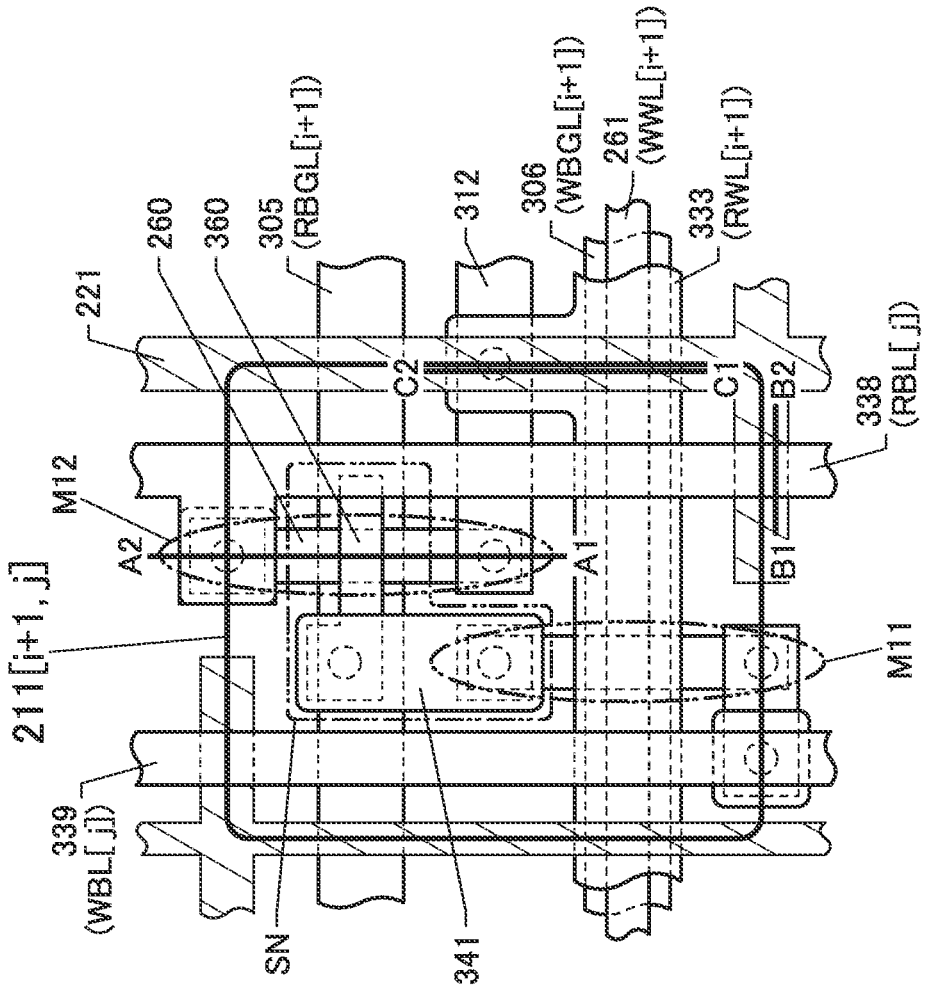

However, a reduction in noise transmitted to the node SN also means a reduction in parasitic capacitance generated in the node SN. Thus, the gate capacitance of the transistor M12 is dominant in the storage capacitor of the node SN. Thus, as shown in FIG. 10(B), an area where a semiconductor layer 260 and the conductive layer 360 of the transistor M12 overlap with each other may be increased, so that the gate capacitance of the transistor M12 can be increased. An increase in gate capacitance of the transistor M12 effectively inhibits a decrease in the potential of the node SN at the end of the writing operation.

Specifically, the area where the semiconductor layer and the gate electrode of the transistor M12 overlap with each other is preferably larger than or equal to 1 time and smaller than or equal to 5 times, further preferably larger than or equal to 1 time and smaller than or equal to 10 times, and still further preferably larger than or equal to 1 time and smaller than or equal to 50 times the area where the semiconductor layer and the gate electrode of the transistor M11 overlap with each other.
<Cross-Sectional Structure Example>

Figure 11:
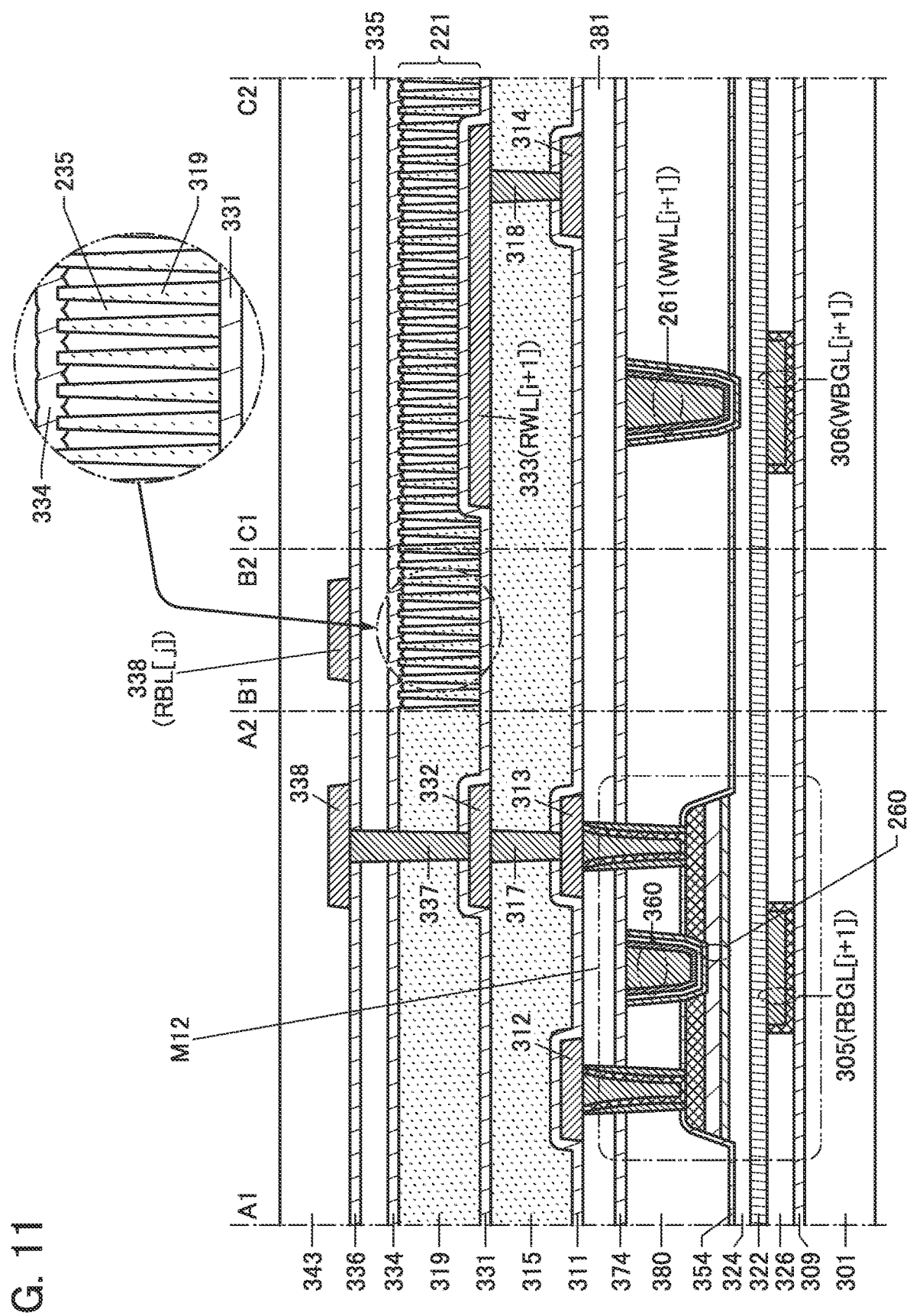
FIG. 11 is a cross-sectional diagram illustrating a structure example of a memory cell.

FIG. 11 is a diagram illustrating a structure example of a cross section of portions indicated by dashed-dotted lines A1-A2, B1-B2, and C1-C2 in FIG. 10(A).

In FIG. 11, the transistor M12 is provided over a substrate 301. Note that the transistor M11 can have a stacked structure as in the transistor M12. An insulating layer 309 and an insulating layer 326 are provided over the substrate 301, and the conductive layer 305 and the conductive layer 306 are embedded in the insulating layer 326. An insulating layer 322 and an insulating layer 324 are provided over the insulating layer 326, and the semiconductor layer 260 is provided over the insulating layer 324.

An insulating layer 354 and an insulating layer 380 are provided over the insulating layer 324 and the semiconductor layer 260. The conductive layer 360 and the conductive layer 261 are embedded in the insulating layer 380. An insulating layer 374 is provided over the insulating layer 380, the conductive layer 360, and the conductive layer 261, and an insulating layer 381 is provided over the insulating layer 374.

The conductive layer 312, a conductive layer 313, and a conductive layer 314 are provided over the insulating layer 381. The conductive layer 312 is electrically connected to one of the source and the drain of the transistor M12, and the conductive layer 313 is electrically connected to the other of the source and the drain of the transistor M12.

An insulating layer 311 and an insulating layer 315 are provided over the insulating layer 381, the conductive layer 312, the conductive layer 313, and the conductive layer 314. A conductive layer 332 and the conductive layer 333 are provided over the insulating layer 315. The conductive layer 332 is electrically connected to the conductive layer 313 through a contact plug 317, and the conductive layer 333 is electrically connected to the conductive layer 314 through a contact plug 318.

An insulating layer 331, an insulating layer 319, and an insulating layer 334 are provided over the insulating layer 315, the conductive layer 332, and the conductive layer 333. The LDR 221 is provided in part of the insulating layer 319. The LDR 221 includes a plurality of LDSs 235 (Low Dielectric constant Spaces). The LDR 221 and the LDS 235 will be described later.

The insulating layer 334 is provided over the insulating layer 319 and the LDS 235. An insulating layer 335 and an insulating layer 336 are provided over the insulating layer 334. The conductive layer 338 is provided over the insulating layer 336, and the conductive layer 338 is electrically connected to the conductive layer 332 through a contact plug 337. In addition, an insulating layer 343 is provided over the insulating layer 336 and the conductive layer 338.

Modification Example 1

Figure 12:
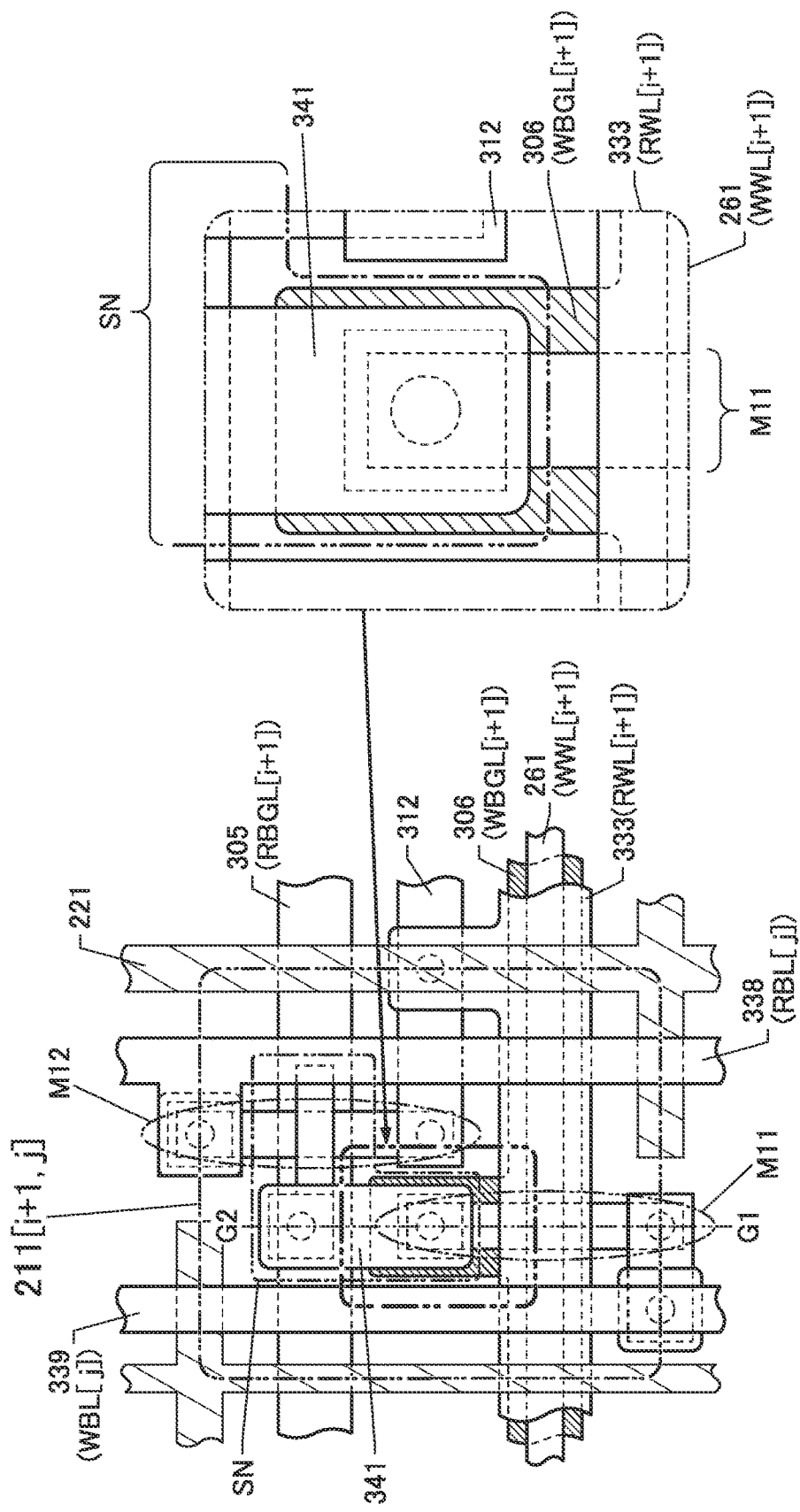
FIG. 12 is a diagram illustrating a structure example of a memory cell.
Figure 13:
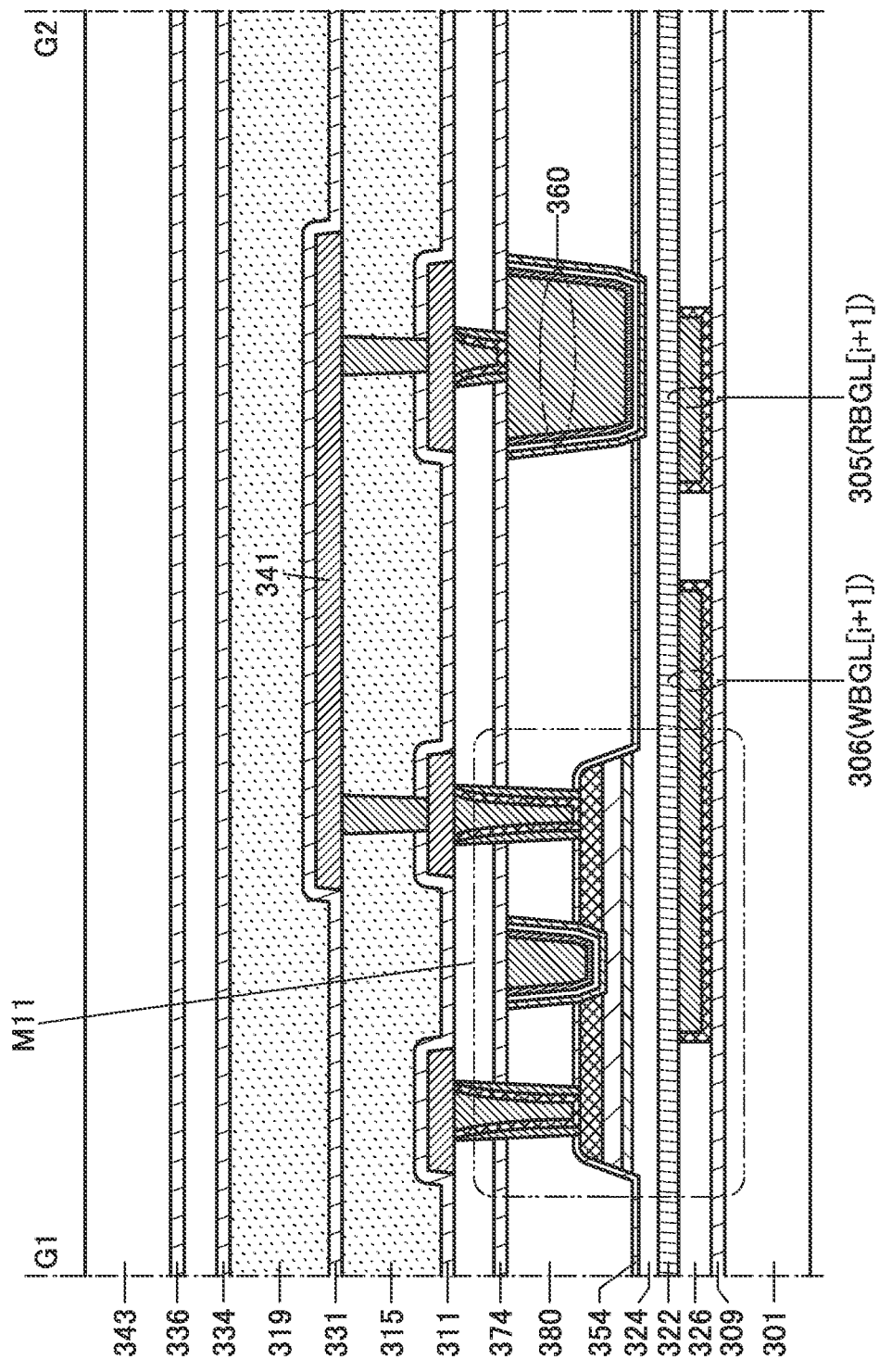
FIG. 13 is a cross-sectional diagram illustrating a structure example of a memory cell.

Alternatively, as illustrated in FIG. 12 and FIG. 13, part of the conductive layer 306 may be changed in shape, and the conductive layer 306 and the node SN may overlap with each other, so that the parasitic capacitance Cx generated at the node SN may be increased. FIG. 12 illustrates a planar structure example of the memory cell 211[i+1,j]. FIG. 13 is a diagram illustrating a structure example of a cross section of a portion indicated by a dashed-dotted line G1-G2 in FIG. 12.

In FIG. 12 and FIG. 13, one of the source and the drain of the transistor M11, the conductive layer 341 and the conductive layer 306 are provided so that an overlapping area thereof is increased as much as possible. With such a structure, the parasitic capacitance Cx at the node SN can be increased without providing the capacitor Cs.

Note that in FIG. 12, to clearly show the conductive layer 306, the conductive layer 306 is hatched. The conductive layer 306 can be formed concurrently with the conductive layer 305 that is not hatched, using the same material and method.

Modification Example 2

Figure 14:
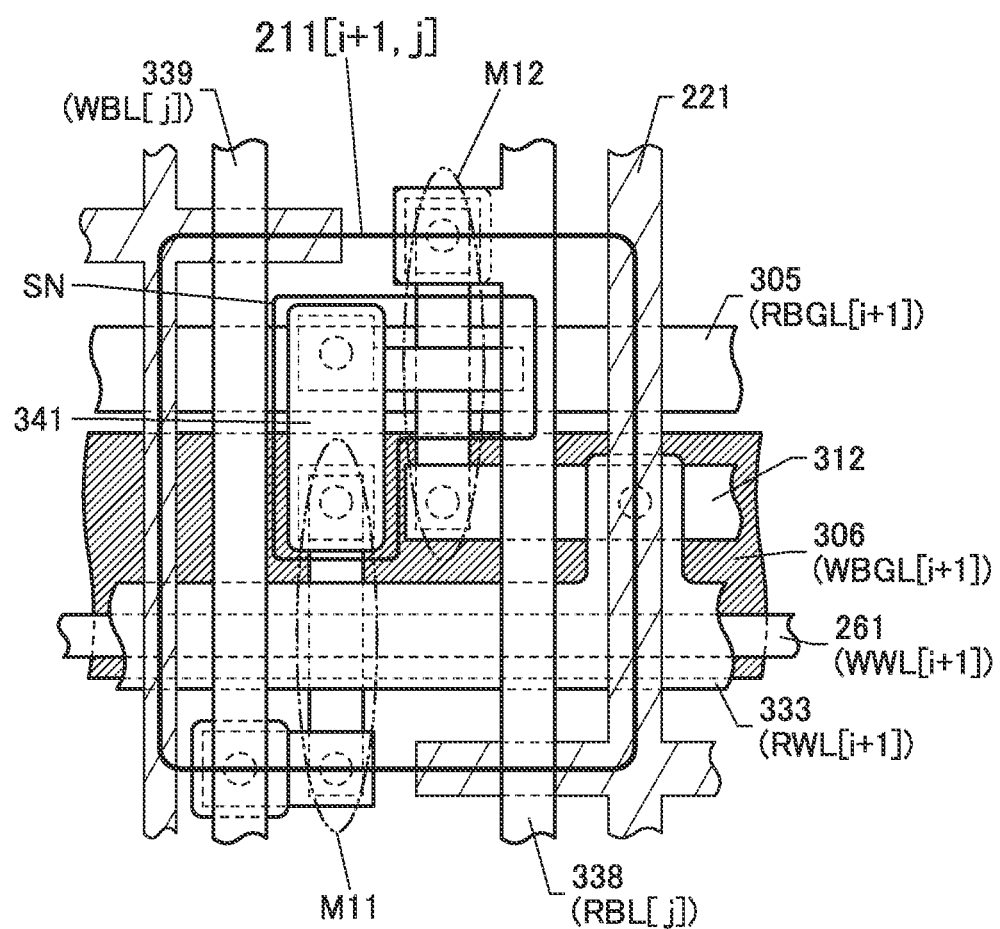
FIG. 14 is a diagram illustrating a structure example of a memory cell.

Alternatively, as illustrated in FIG. 14, the area of the conductive layer 306 may be increased so as to increase the area where the conductive layer 306 and the memory cell 211[i+1,j] overlap with each other.

Modification Example 3

Figure 15:
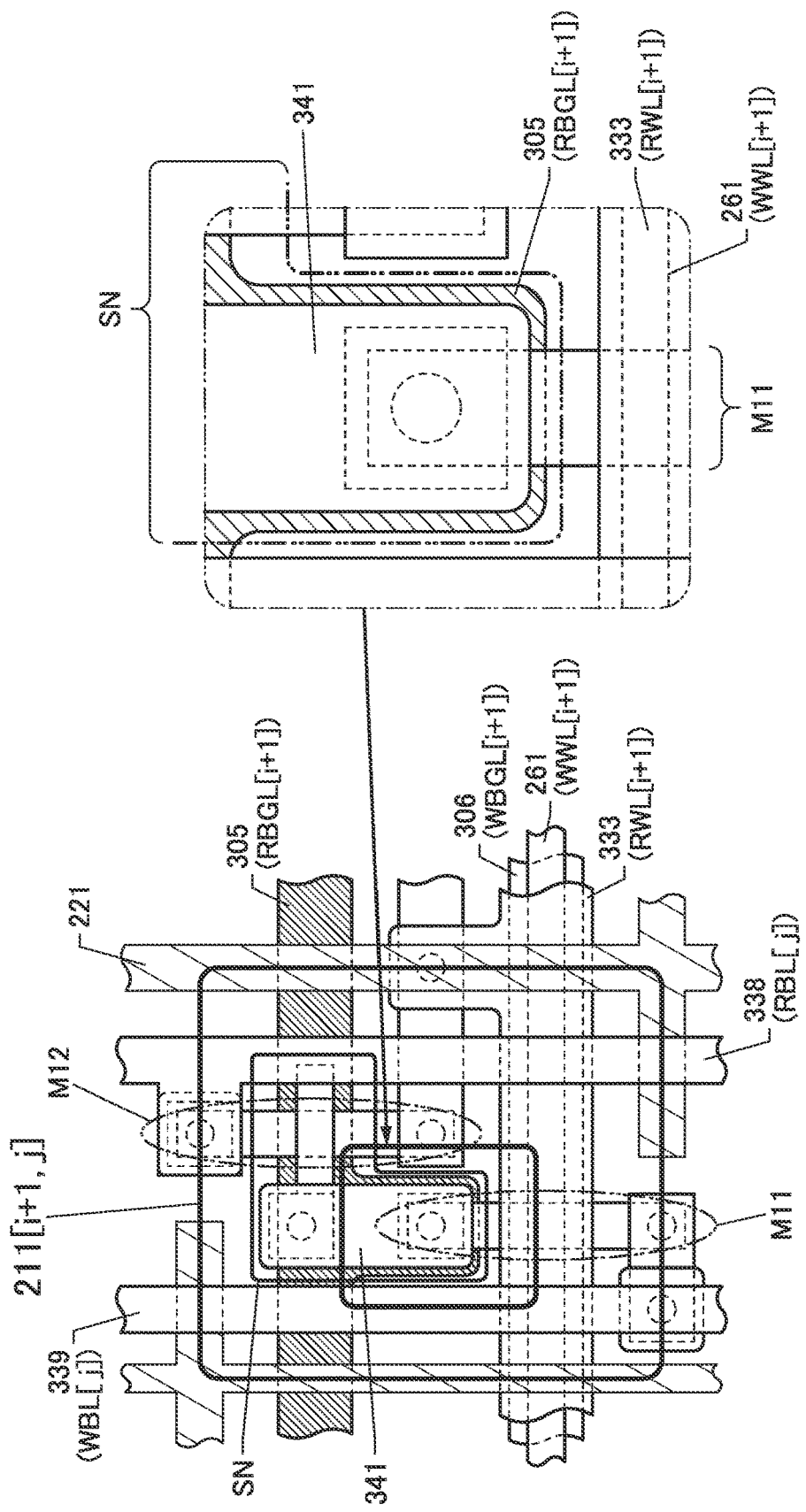
FIG. 15 is a diagram illustrating a structure example of a memory cell.

As illustrated in FIG. 15, the area of the conductive layer 305 overlapping with the node SN may be increased so as to increase the parasitic capacitance Cx relating to the node SN.

In FIG. 15, part of the conductive layer 305 is changed in shape so as to increase an overlapping area of one of the source and the drain of the transistor M11, the conductive layer 341, and the conductive layer 305 as much as possible. With such a structure, the parasitic capacitance Cx relating to the node SN can be increased without the capacitor Cs.

Note that in FIG. 15, to clearly show the conductive layer 305, the conductive layer 305 is hatched. The conductive layer 305 can be formed concurrently using the same material and method as those for the conductive layer 306 without a hatching pattern.

Modification Example 4

Figure 16:
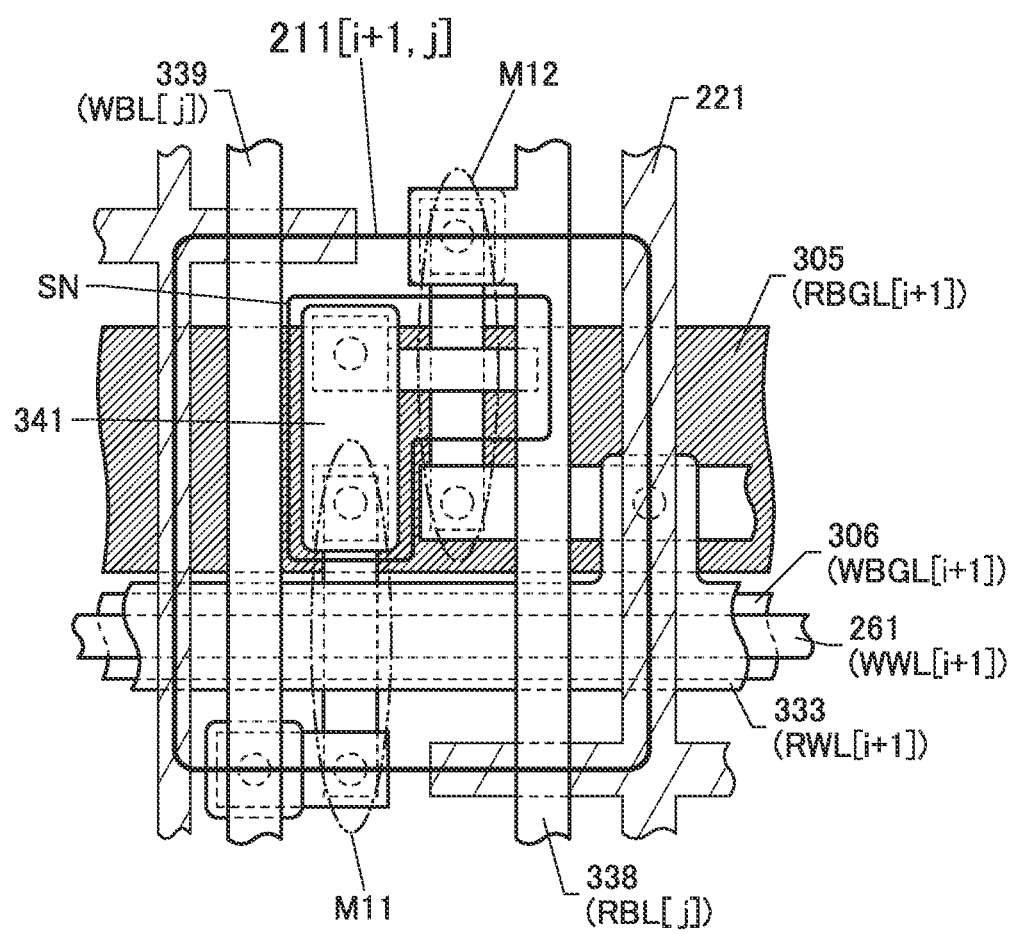
FIG. 16 is a diagram illustrating a structure example of a memory cell.

Alternatively, as illustrated in FIG. 16, the area of the conductive layer 305 may be increased so as to increase the area where the conductive layer 305 and the memory cell 211[i+1,j] overlap with each other.

<Materials>

[Substrate]

There is no great limitation on a material used for the substrate. An insulator substrate, a semiconductor substrate, or a conductor substrate may be used, for example.

Examples of the insulator substrate include a glass substrate, a quartz substrate, a sapphire substrate, a stabilized zirconia substrate (an yttria-stabilized zirconia substrate or the like), and a resin substrate.

Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. In addition, a semiconductor substrate in which an insulator region is included in the above semiconductor substrate, for example, an SOI (Silicon On Insulator) substrate or the like may be used.

Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element. Furthermore, a semiconductor substrate on which a semiconductor element such as a strained transistor or a FIN-type transistor is provided, or the like can be used. That is, the substrate is not limited to a simple supporting substrate and may be a substrate where a device such as another transistor is formed.

[Insulating Layer]

Examples of a material used for an insulating layer include an oxide, a nitride, an oxynitride, a nitride oxide, a metal oxide, a metal oxynitride, and a metal nitride oxide, each of which has an insulating property.

As scaling down and high integration of the transistor progress, for example, a problem such as leakage current may arise because of a thinner gate insulating layer. When a high-k material is used for the insulating layer functioning as a gate insulating layer, such an insulating layer enables a reduction in voltage at operation of the transistor while maintaining the physical thickness of the gate insulator. In contrast, when a material with low dielectric constant is used as an insulator functioning as an interlayer insulating film, parasitic capacitance generated between wirings can be reduced. Thus, a material is preferably selected in accordance with the function of an insulating layer.

In addition, examples of the insulator with high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

In addition, examples of the insulator with low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In the case where an OS transistor is used as the transistor, the transistor is surrounded by an insulating layer (e.g., the insulating layer 309, the insulating layer 322, the insulating layer 354, and the insulating layer 374) having a function of inhibiting transmission of oxygen and impurities such as hydrogen, so that the transistor can have stable electrical characteristics. As the insulator having a function of inhibiting transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum titanium nitride, titanium nitride, silicon nitride oxide or silicon nitride; or the like can be used.

In addition, the insulating layer functioning as the gate insulating layer is preferably an insulator including a region containing oxygen released by heating. For example, when a structure is employed in which silicon oxide or silicon oxynitride including a region containing oxygen released by heating is in contact with the semiconductor layer 260, oxygen vacancies included in the semiconductor layer 260 can be compensated for.

Note that in this specification and the like, a nitride oxide refers to a compound that includes more nitrogen than oxygen. An oxynitride refers to a compound that includes more oxygen than nitrogen. The content of each element can be measured by Rutherford backscattering spectrometry (RBS), for example.

When an oxide semiconductor, which is one kind of metal oxide, is used for the semiconductor layer, the hydrogen concentration in the insulating layer is preferably lowered in order to prevent an increase in the hydrogen concentration in the semiconductor layer. Specifically, the hydrogen concentration in the insulating layer is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$ in secondary ion mass spectrometry (SIMS). It is particularly preferable to lower the hydrogen concentration in the insulating layer in contact with the semiconductor layer.

When an oxide semiconductor, which is one kind of metal oxide, is used for the semiconductor layer, the nitrogen concentration in the insulating layer is preferably lowered in order to prevent an increase in the nitrogen concentration in the semiconductor layer. Specifically, the nitrogen concentration in the insulating layer is lower than or equal to $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$ in SIMS.

It is preferred that at least a region of the insulating layer in contact with the semiconductor layer and a region of the insulating layer in contact with at least the semiconductor layer have few defects and typically have as few signals observed by electron spin resonance (ESR) spectroscopy as possible. An example of the signals is an E' center observed at a g-factor of 2.001. Note that the E' center is due to the dangling bond of silicon. For example, in the case where a silicon oxide layer or a silicon oxynitride layer is used as the insulating layer, a silicon oxide layer or a silicon oxynitride layer whose spin density due to the E' center is lower than or equal to $3 \times 10^{17}$ spins/cm$^3$, preferably lower than or equal to $5 \times 10^{16}$ spins/cm$^3$ is used.

In addition to the above-described signal, a signal due to nitrogen dioxide (NO$_2$) may be observed. The signal is divided into the following three signals according to the N nuclear spin: a signal observed at a g-factor greater than or equal to 2.037 and less than or equal to 2.039 (referred to as a first signal), a signal observed at a g-factor greater than or equal to 2.001 and less than or equal to 2.003 (referred to as a second signal), and a signal observed at a g-factor greater than or equal to 1.964 and less than or equal to 1.966 (referred to as a third signal).

For example, as the insulating layer, it is suitable to use an insulating layer whose spin density of a signal due to nitrogen dioxide (NO$_2$) is higher than or equal to $1 \times 10^{17}$ spins/cm$^3$ and lower than $1 \times 10^{18}$ spins/cm$^3$.

Note that nitrogen oxide (NO$_x$) including nitrogen dioxide (NO$_2$) forms a state in the insulating layer. The state is positioned in the energy gap of the oxide semiconductor layer. Thus, when nitrogen oxide (NO$_x$) is diffused into the interface between the insulating layer and the oxide semiconductor layer, an electron may be trapped by the state on the insulating layer side. As a result, the trapped electron remains in the vicinity of the interface between the insulating layer and the oxide semiconductor layer; hence, the threshold voltage of the transistor is shifted in the positive direction. Accordingly, the use of a film with a low nitrogen oxide content as the insulating layer and the insulating layer can reduce a shift in the threshold voltage of the transistor.

As an insulating layer that releases a small amount of nitrogen oxide (NO$_x$), for example, a silicon oxynitride layer can be used. The silicon oxynitride layer is a film that releases more ammonia than nitrogen oxide (NO$_x$) in thermal desorption spectroscopy (TDS); the typical released amount of ammonia is greater than or equal to $1 \times 10^{18}$/cm$^3$ and less than or equal to $5 \times 10^{19}$/cm$^3$. Note that the released amount of ammonia is the total amount in the range of the heat treatment temperature in TDS from 50° C. to 650° C. or from 50° C. to 550° C.

Since nitrogen oxide (NO$_x$) reacts with ammonia and oxygen in heat treatment, the use of an insulating layer that releases a large amount of ammonia reduces nitrogen oxide (NO$_x$).

At least one of the insulating layers in contact with the oxide semiconductor layer is preferably formed using an insulating layer from which oxygen is released by heating. Specifically, it is preferable to use an insulating layer in which the amount of released oxygen converted into oxygen atoms is $1.0\times10^{18}$ atoms/cm$^3$ or more, $1.0\times10^{19}$ atoms/cm$^3$ or more, or $1.0\times10^{20}$ atoms/cm$^3$ or more in TDS performed with heat treatment where the surface temperature of the insulating layer is higher than or equal to 100° C. and lower than or equal to 700° C., preferably higher than or equal to 100° C. and lower than or equal to 500° C. Note that in this specification and the like, oxygen released by heating is also referred to as "excess oxygen".

Furthermore, an insulating layer containing excess oxygen can also be formed by performing treatment for adding oxygen to an insulating layer. The treatment for adding oxygen can be performed by heat treatment, plasma treatment, or the like in an oxidizing atmosphere. Alternatively, oxygen may be added by an ion implantation method, an ion doping method, a plasma immersion ion implantation method, or the like. Examples of a gas used in the treatment for adding oxygen include an oxygen gas such as $^{16}O_2$ or $^{18}O_2$ and a gas containing oxygen, such as a nitrous oxide gas or an ozone gas. Note that in this specification, the treatment for adding oxygen is also referred to as "oxygen doping treatment". The oxygen doping treatment may be performed while the substrate is heated.

For the insulating layer, a heat-resistant organic material such as polyimide, an acrylic-based resin, a benzocyclobutene-based resin, polyamide, or an epoxy-based resin can be used. Other than the above organic materials, it is also possible to use a low dielectric constant material (a low-k material), a siloxane-based resin, PSG (phosphosilicate glass), BPSG (borophosphosilicate glass), or the like. Note that the insulating layer may be formed by stacking a plurality of insulating layers formed of these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

There is no particular limitation on the method for forming the insulating layer. Note that a baking step is necessary in some cases depending on a material used for the insulating layer. In this case, when the baking step of the insulating layer also serves as another heat treatment step, the transistor can be manufactured efficiently.

There is no particular limitation on the method for forming the insulating layer. Note that a baking step is necessary in some cases depending on a material used for the insulating layer. In this case, when the baking step of the insulating layer also serves as another heat treatment step, the transistor can be manufactured efficiently.

[Conductive Layer]

For the conductive layer, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide semiconductor that is a kind of metal oxides is used for a semiconductor layer, a stacked-layer structure in which a material containing the above metal element and a conductive material containing oxygen are combined is preferably used for the conductive layer functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductive layer functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With use of such a material, hydrogen contained in the metal oxide where the channel is formed can be trapped in some cases. Alternatively, hydrogen entering from an external insulator or the like can be trapped in some cases.

For the conductive material used for a contact plug or the like, a conductive material with high embeddability, such as tungsten or polysilicon, can be used, for example. A conductive material with high embeddability and a barrier layer (a diffusion prevention layer) such as a titanium layer, a titanium nitride layer, or a tantalum nitride layer may be used in combination.

[Semiconductor Layer]

For the semiconductor layer, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Alternatively, a compound semiconductor such as silicon germanium, silicon carbide, gallium arsenide, an oxide semiconductor, or a nitride semiconductor, an organic semiconductor, or the like can be used.

In the case of using an organic semiconductor for the semiconductor layer, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, polyparaphenylene vinylene, or the like can be used.

Note that semiconductor layers may be stacked. In the case of stacking semiconductor layers, semiconductors having different crystal states may be used or different semiconductor materials may be used.

The bandgap of an oxide semiconductor, which is one kind of metal oxide, is greater than or equal to 2 eV; thus, the use of the oxide semiconductor for the semiconductor layer can achieve a transistor with an extremely low off-state current. Specifically, the off-state current per micrometer of channel width at room temperature (typically 25° C.) at a voltage between a source and a drain of 3.5 V can be lower than $1\times10^{-20}$ A, lower than $1\times10^{-22}$ A, or lower than $1\times10^{-24}$ A. That is, the on/off ratio can be greater than or equal to 20 digits. In addition, a transistor using an oxide semiconductor for the semiconductor layer (an OS transistor) has high withstand voltage between its source and drain. Thus, a transistor with high reliability can be provided. A transistor with high output voltage and high withstand voltage can be provided. A memory device or the like with high reliability can be provided. A memory device with high output voltage and high withstand voltage can be provided.

The crystalline Si transistor tends to have relatively high mobility compared with the OS transistor. On the other hand, the crystalline Si transistor has difficulty in achieving an extremely low off-state current such as one in the OS transistor. Thus, it is important that the semiconductor material used for the semiconductor layer be properly selected depending on the purpose and the usage. For example, depending on the purpose and the usage, the OS transistor and the crystalline Si transistor and the like may be used in combination.

In the case where an oxide semiconductor layer is used as the semiconductor layer, the oxide semiconductor layer is preferably formed by a sputtering method. The oxide semiconductor layer is preferably formed by a sputtering method, in which case the density of the oxide semiconductor layer can be increased. When the oxide semiconductor layer is formed by a sputtering method, a rare gas (typically argon), oxygen, or a mixed gas of a rare gas and oxygen may be used as a sputtering gas. In addition, increasing the purity of a sputtering gas is necessary. For example, as an oxygen gas or a rare gas used as a sputtering gas, a gas that is highly purified to have a dew point of −60° C. or lower, preferably −100° C. or lower is used. When the highly purified sputtering gas is used for the deposition, entry of moisture or the like into the oxide semiconductor layer can be prevented as much as possible.

Furthermore, in the case where the oxide semiconductor layer is formed by a sputtering method, moisture in a deposition chamber of a sputtering apparatus is preferably removed as much as possible. For example, with an adsorption vacuum evacuation pump such as a cryopump, the deposition chamber is preferably evacuated to be a high vacuum state (to a degree of approximately $5\times10^{-7}$ Pa to $1\times10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1\times10^{-4}$ Pa, further preferably lower than or equal to $5\times10^{-5}$ Pa.

[Metal Oxide]

By changing the composition of elements contained in a metal oxide, a conductor, a semiconductor, and an insulator can be formed separately. The metal oxide with conductor properties is referred to as "conductive oxide" in some cases. The metal oxide having semiconductor properties is referred to as "oxide semiconductor" in some cases. The metal oxide having insulator properties is referred to as "insulating oxide" in some cases.

An oxide semiconductor, which is one kind of metal oxide, preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter referred to as an In layer) and a layer containing the element M, zinc, and oxygen (hereinafter referred to as an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, entry of impurities, formation of defects, or the like might decrease the crystallinity of a metal oxide, which means that the CAAC-OS is a metal oxide including few impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that In—Ga—Zn oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the above metal oxide is used in a channel formation region of a transistor is described.

Note that when the above metal oxide is used in a channel formation region of a transistor, a transistor having high field-effect mobility can be achieved. In addition, the transistor having high reliability can be achieved.

Furthermore, a metal oxide with a low carrier density is preferably used as the transistor. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. For example, a metal oxide has a carrier density lower than $8\times10^{11}$ cm$^{-3}$, preferably lower than $1\times10^{11}$ cm$^{-3}$, further preferably lower than $1\times10^{10}$ cm$^{3}$, and higher than or equal to $1\times10^{-9}$ cm$^{3}$.

The highly purified intrinsic or substantially highly purified intrinsic metal oxide has a low density of defect states and accordingly has a low density of trap states in some cases.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the impurity concentration in the metal oxide. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

[Impurities]

Here, the influence of each impurity in the metal oxide will be described.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1\times10^{18}$ atoms/cm$^{3}$, preferably lower than or equal to $2\times10^{16}$ atoms/cm$^{3}$.

Hydrogen contained in a metal oxide reacts with oxygen bonded to a metal atom to be water, and thus forms an oxygen vacancy in some cases. Moreover, when the channel formation region of the metal oxide includes oxygen vacancies, the transistor tends to have normally-on characteristics. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide obtained by SIMS is set lower than $1\times10^{20}$ atoms/cm$^{3}$, preferably lower than $1\times10^{19}$ atoms/cm$^{3}$, further preferably lower than $5\times10^{18}$ atoms/cm$^{3}$, still further preferably lower than $1\times10^{18}$ atoms/cm$^{3}$. When a metal oxide in which the impurities are sufficiently reduced is used in a channel formation region of a transistor, stable electrical characteristics can be given.

Note that as a metal oxide used as a semiconductor of a transistor, a thin film having high crystallinity is preferably used. With use of the thin film, the stability or reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, manufacturing cost is increased, and throughput is decreased.

Non-Patent Document 1 and Non-Patent Document 2 have reported that an In—Ga—Zn oxide having a CAAC structure (referred to as CAAC-IGZO) was found in 2009. Here, it has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, an In—Ga—Zn oxide having an nc structure (referred to as nc-IGZO) was found in 2013 (see Non-Patent Document 3). Here, it has been reported that nc-IGZO has a periodic atomic arrangement in a microscopic region (for example, a region within a size of 1 nm to 3 nm) and there is no regularity of crystal orientation between different regions.

Non-Patent Document 4 and Non-Patent Document 5 have shown changes in average crystal size due to electron beam irradiation to thin films of CAAC-IGZO, nc-IGZO, and IGZO having low crystallinity. In the thin film of IGZO having low crystallinity, crystalline IGZO with a size of approximately 1 nm was observed even before electron beam irradiation. Thus, here, it has been reported that the existence of a completely amorphous structure could not be observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used as the semiconductor of the transistor.

Non-Patent Document 6 shows that a transistor using a metal oxide has an extremely low leakage current in an off state; specifically, the off-state current per micrometer in the channel width of the transistor is of the order of yA/μm ($10^{-24}$ A/μm). For example, a low-power-consumption CPU applying a characteristic of low leakage current of the transistor using a metal oxide is disclosed (see Non-Patent Document 7).

Furthermore, application of a transistor using a metal oxide to a display device that utilizes the characteristic of a low leakage current of the transistor has been reported (see Non-Patent Document 8). In the display device, a displayed image is changed several tens of times per second. The number of times an image is changed per second is referred to as a refresh rate. The refresh rate is also referred to as drive frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate can reduce the power consumption of the display device. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the characteristics of a low leakage current of the transistor have been studied.

[Deposition Method]

An insulating material for forming the insulating layer, a conductive material for forming the conductive layer, or a semiconductor material for forming the semiconductor layer can be formed by a sputtering method, a spin coating method, a CVD (Chemical Vapor Deposition) method (including a thermal CVD method, an MOCVD (Metal Organic Chemical Vapor Deposition) method, a PECVD (Plasma Enhanced CVD) method, a high density plasma CVD method, an LPCVD (low pressure CVD) method, an APCVD (atmospheric pressure CVD) method, and the like), an ALD (Atomic Layer Deposition) method, or an MBE (Molecular Beam Epitaxy) method, or a PLD (Pulsed Laser Deposition) method, a dipping method, a spray coating method, a droplet discharging method (e.g., an inkjet method), or a printing method (e.g., screen printing or offset printing).

By a plasma CVD method, a high-quality film can be obtained at a relatively low temperature. With use of a deposition method that does not use plasma at the time of deposition, such as an MOCVD method, an ALD method, or a thermal CVD method, damage is not easily caused on a surface where the film is deposited. For example, a wiring, an electrode, an element (e.g., a transistor or a capacitor), or the like included in a memory device might be charged up by receiving charges from plasma. In that case, accumulated charges might break the wiring, electrode, element, or the like included in the memory device. By contrast, in the case of a film formation method not using plasma, such plasma damage is not caused; thus, the yield of memory devices can be increased. Moreover, since plasma damage during film formation is not caused, a film with few defects can be obtained.

In an ALD method, one atomic layer can be deposited at a time using self-regulating characteristics of atoms. Thus, the ALD method has advantages such as deposition of an extremely thin film, deposition on a component with a high aspect ratio, deposition of a film with a small number of defects such as pinholes, deposition with good coverage, and low-temperature deposition. Furthermore, the ALD method includes a PEALD (plasma enhanced ALD) method using plasma. The use of plasma is sometimes preferable because deposition at lower temperature is possible. Note that a precursor used in the ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a film formation method in which particles ejected from a target or the like are deposited, a CVD method and an ALD method are film deposition methods in which a film is deposited by reaction at a surface of an object. Thus, a CVD method and an ALD method are film deposition methods that enable favorable step coverage almost regardless of the shape of an object. In particular, an ALD method has excellent step coverage and excellent thickness uniformity and thus is suitable for covering a surface of an opening with a high aspect ratio, for example. On the other hand, an ALD method has a relatively low deposition rate, and thus is preferably used in combination with another film deposition method with a high deposition rate, such as a CVD method, in some cases.

Each of a CVD method and an ALD method enables the composition of a film that is to be deposited to be controlled with a flow rate ratio of source gases. For example, by each of a CVD method and an ALD method, a film with a certain composition can be deposited depending on the flow rate ratio of the source gases. Moreover, with each of a CVD method and an ALD method, by changing the flow rate ratio of the source gases while depositing the film, a film whose composition is continuously changed can be formed. In the case of forming a film while changing the flow rate ratio of the source gases, as compared with the case of forming a film with use of a plurality of deposition chambers, the time taken for the film formation can be shortened because the time taken for transfer and pressure adjustment is omitted. Thus, memory devices can be manufactured with improved productivity in some cases.

<Low Dielectric Region (LDR)>

[Structure Example]

Next, structure examples of the LDR 221 will be described with reference to FIG. 17 to FIG. 19. Note that arrows indicating the X direction, the Y direction, and the Z direction are illustrated in the drawings. Note that the X direction, the Y direction, and the Z direction are directions orthogonal to each other.

Figure 17A:
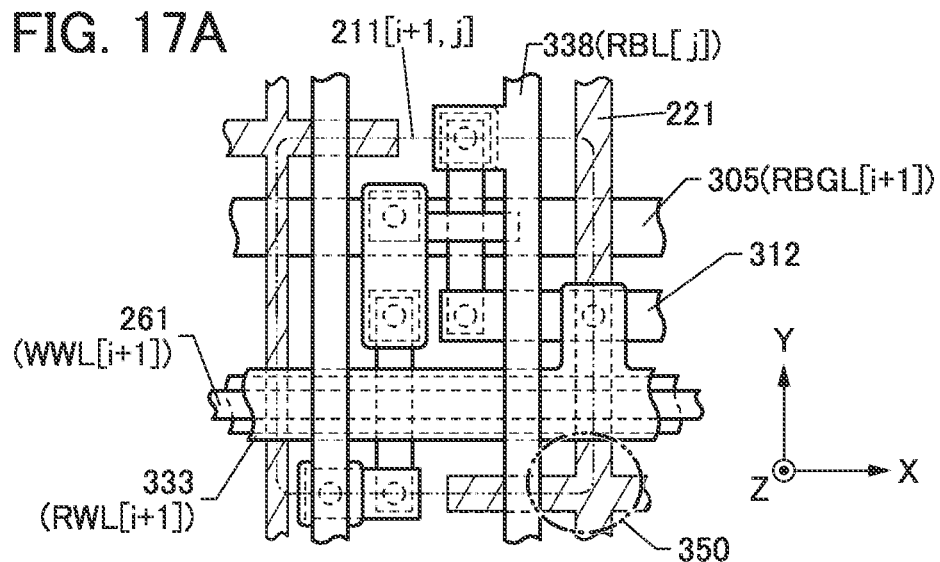
FIG. 17(A) and FIG. 17(B) are diagrams illustrating a structure example of a low dielectric constant region.
Figure 17B:
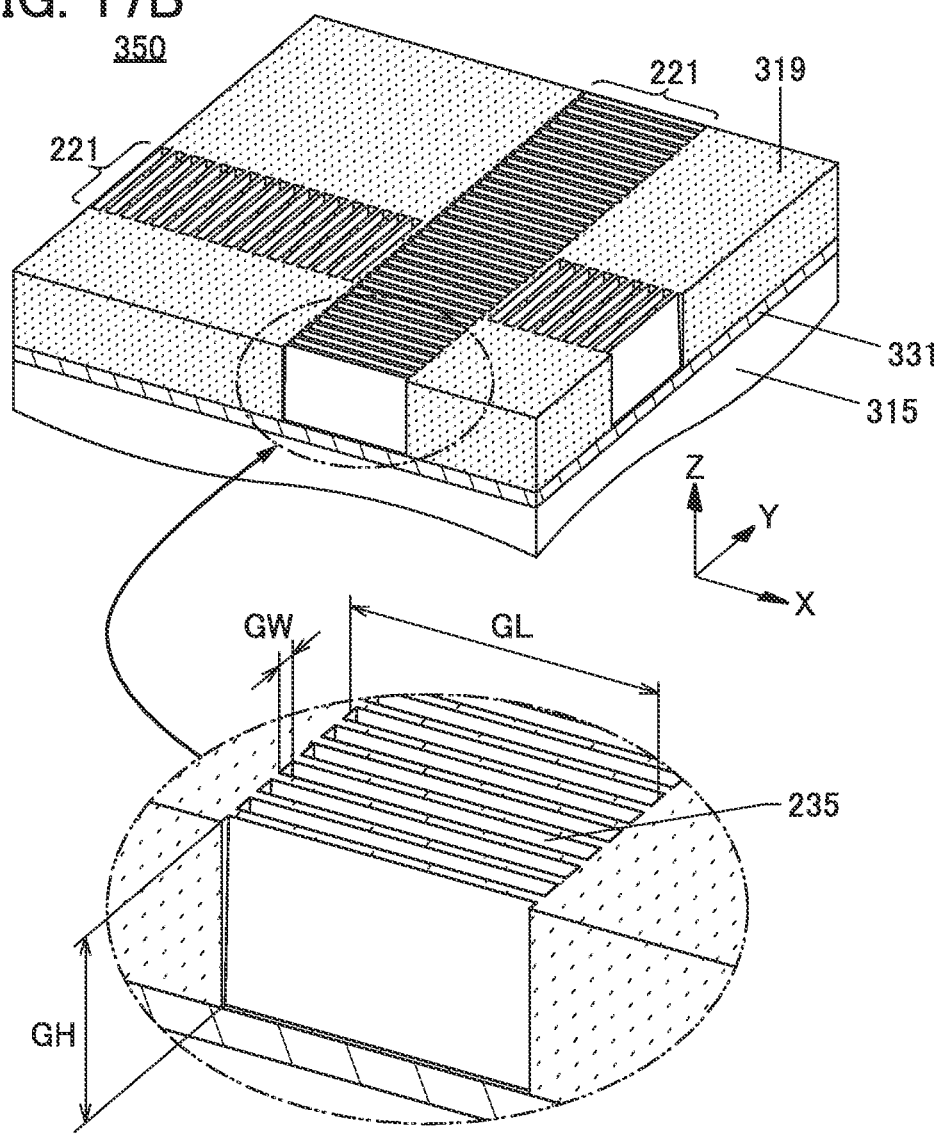

FIG. 17(A) is a planar view of the memory cell 211[i+1,j] the same as that illustrated in FIG. 10(A). FIG. 17(B) is a schematic perspective view of a portion 350 illustrated in FIG. 17(A). FIG. 17(B) illustrates only the insulating layer 315, the insulating layer 331, the insulating layer 319, and the LDR 221.

As described above, the LDR 221 includes a plurality of LDSs 235. The LDS 235 can be provided by selectively removing part of the insulating layer 319. In this specification and the like, the length of an opening of the LDS 235 is referred to as "length GL", the width of the opening of the LDS 235 is referred to as "width GW", and the height (depth) of the opening of the LDS 235 is referred to as "height GH".

The LDR 221 includes a region extending in the Y direction and a region extending in the X direction. In FIG. 17(B), the LDS 235 is arranged so that the direction of the length GL is aligned with the X direction in the region of the LDR 221 extending in the Y direction. Note that it is not necessary to align the direction of the length GL completely with the X direction. In the region of the LDR 221 extending in the Y direction, the LDS 235 may be arranged so that the direction of the length GL intersects with the Y direction.

In FIG. 17(B), the LDS 235 is arranged so that the direction of the length GL is aligned with the Y direction in the region of the LDR 221 extending in the X direction. Note that it is not necessary to align the direction of the length GL completely with the Y direction. In the region of the LDR 221 extending in the X direction, the LDS 235 may be arranged so that the direction of the length GL intersects with the X direction.

Figure 18A:
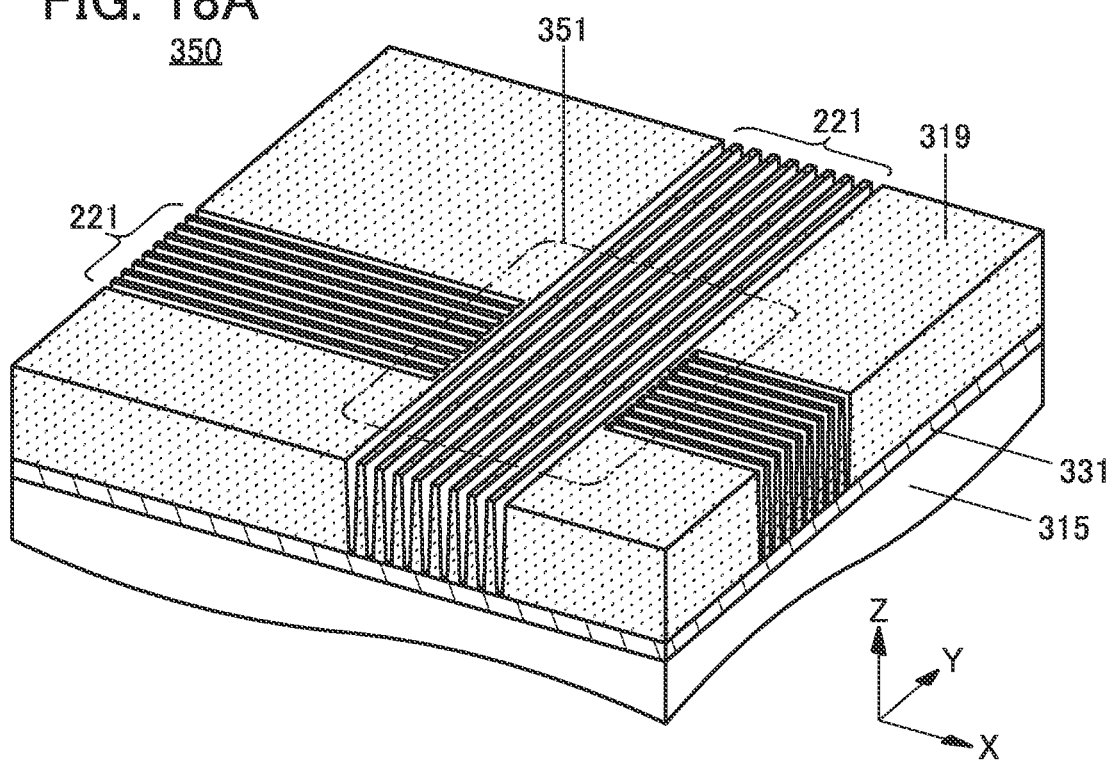
FIG. 18(A) and FIG. 18(B) are diagrams illustrating a structure example of a low dielectric constant region.
Figure 18B:
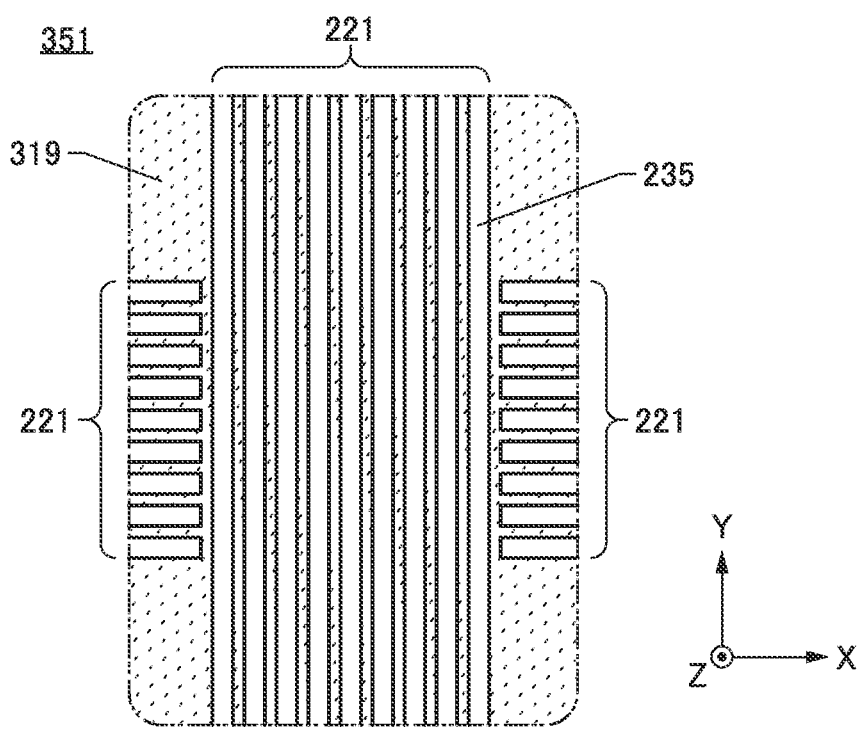

As illustrated in FIG. 18(A) and FIG. 18(B), the LDS 235 may be arranged so that the direction of the length GL is aligned or substantially aligned with the Y direction in the region of the LDR 221 extending in the Y direction. In the region of the LDR 221 extending in the X direction, the LDS 235 may be arranged so that the direction of the length GL may be aligned or substantially aligned with the X direction. FIG. 18(A) is a perspective view of the portion 350. FIG. 18(B) is a top view of a portion 351 illustrated in FIG. 18(A).

When the length GL is much long with respect to the height GH and the width GW of the LDS 235, the mechanical strength of the LDR 221 is reduced, and there is a risk of reducing the reliability of the memory cell 211. In other words, there is a risk of reducing the reliability of the memory device 100. Specifically, the insulating layer 319 positioned between the adjacent LDSs 235 is easily damaged. A portion of the insulating layer sandwiched between the adjacent LDSs 235 is also called "rib".

Figure 19A:
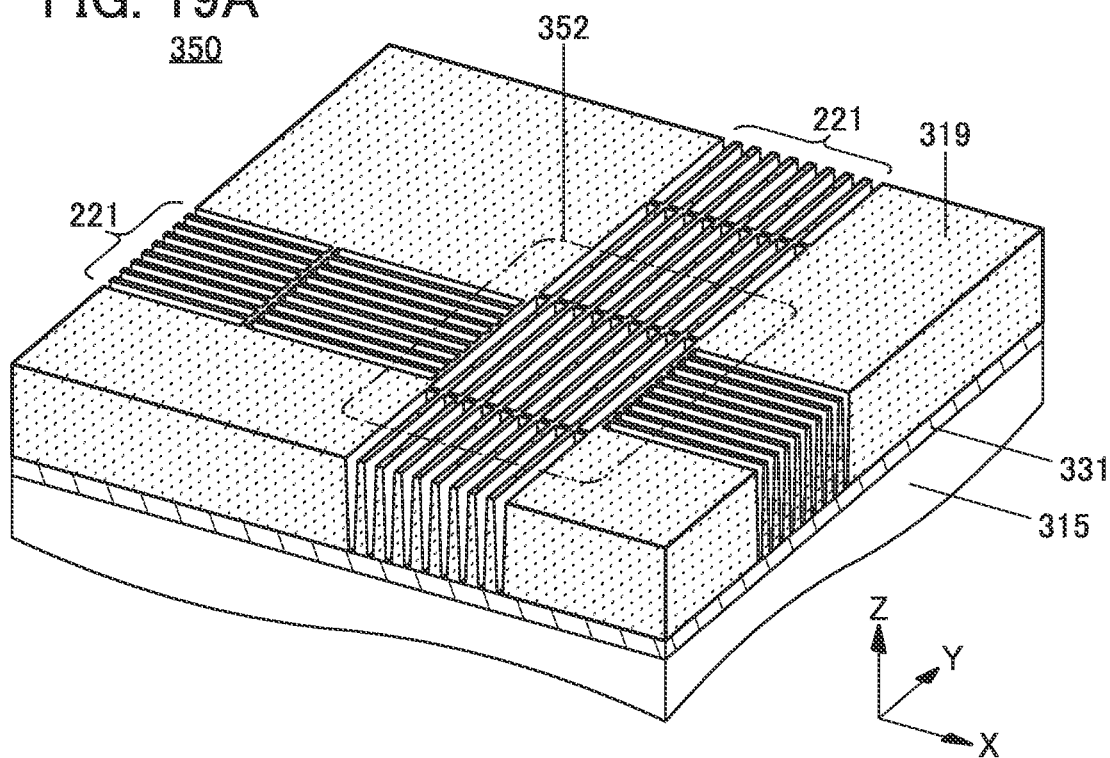
FIG. 19(A) and FIG. 19(B) are diagrams illustrating a structure example of a low dielectric constant region.
Figure 19B:
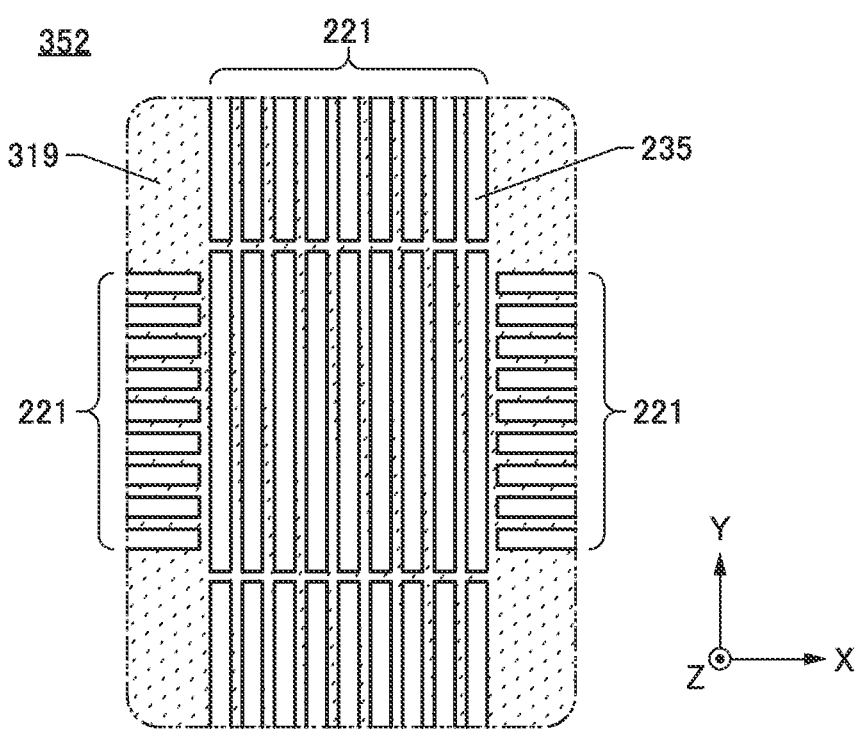

Thus, preferable arrangement is such that the LDSs 235 are divided every certain length GL as illustrated in FIG. 19(A) and FIG. 19(B). Specifically, the length GL is preferably less than or equal to 50 times, further preferably less than or equal to 30 times the width GW. The length GL is preferably less than or equal to 20 times, further preferably less than or equal to 10 times the height GH. Note that FIG. 19(A) is a perspective view of the portion 350. FIG. 19(B) is a top view of a portion 352 illustrated in FIG. 19(A).

A portion in the insulating layer, which is sandwiched between the adjacent LDSs 235, is also called "rib". The height GH is preferably less than or equal to 20 times, further preferably less than or equal to 10 times a width RW of the rib (see FIG. 22(B)).

Figure 20A:
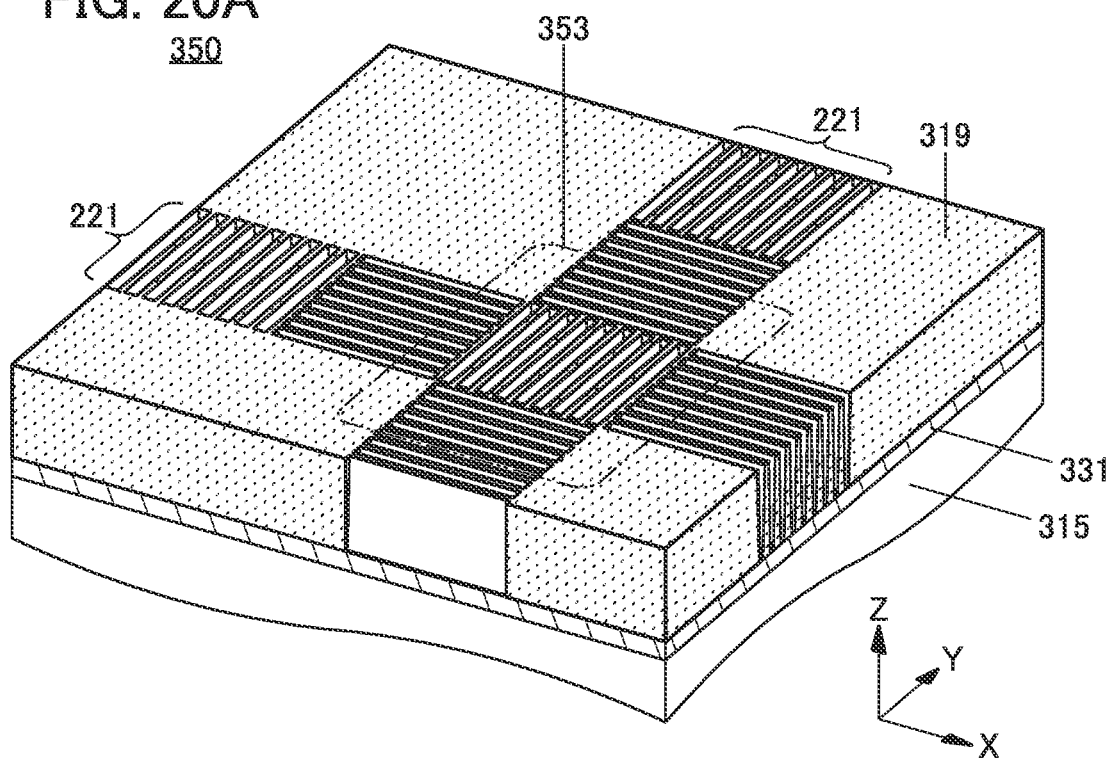
FIG. 20(A) and FIG. 20(B) are diagrams illustrating a structure example of a low dielectric constant region.
Figure 20B:
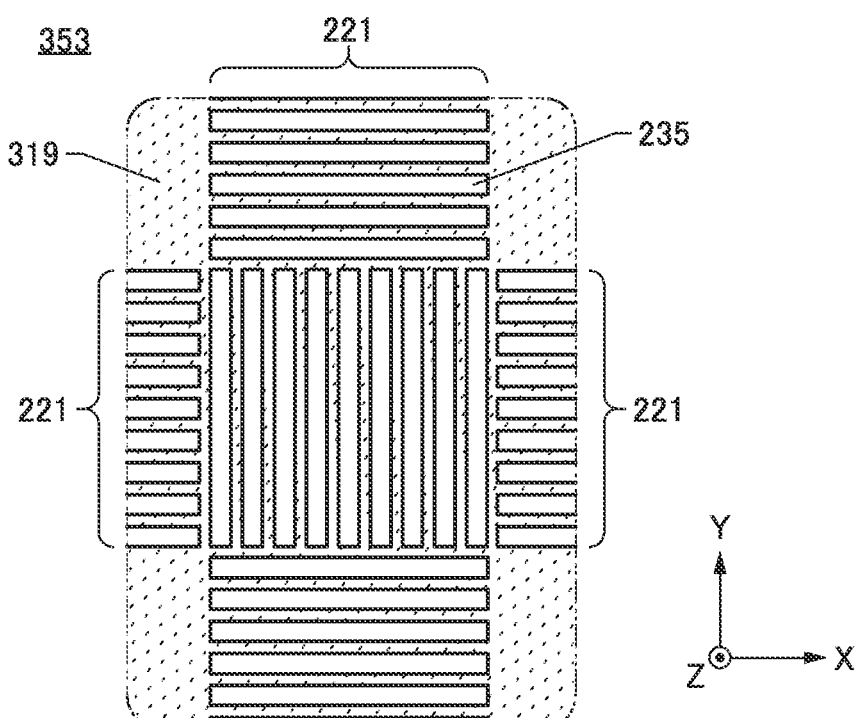

As illustrated in FIG. 20(A) and FIG. 20(B), the direction of the length GL may be changed every certain section. FIG. 20(A) is a perspective view of the portion 350. FIG. 20(B) is a top view of a portion 353 illustrated in FIG. 20(A). In FIG. 20(A) and FIG. 20(B), the direction of the length GL is rotated 90° every certain section; however, the angle of rotation every section is not limited to 90°.

Figure 21A:
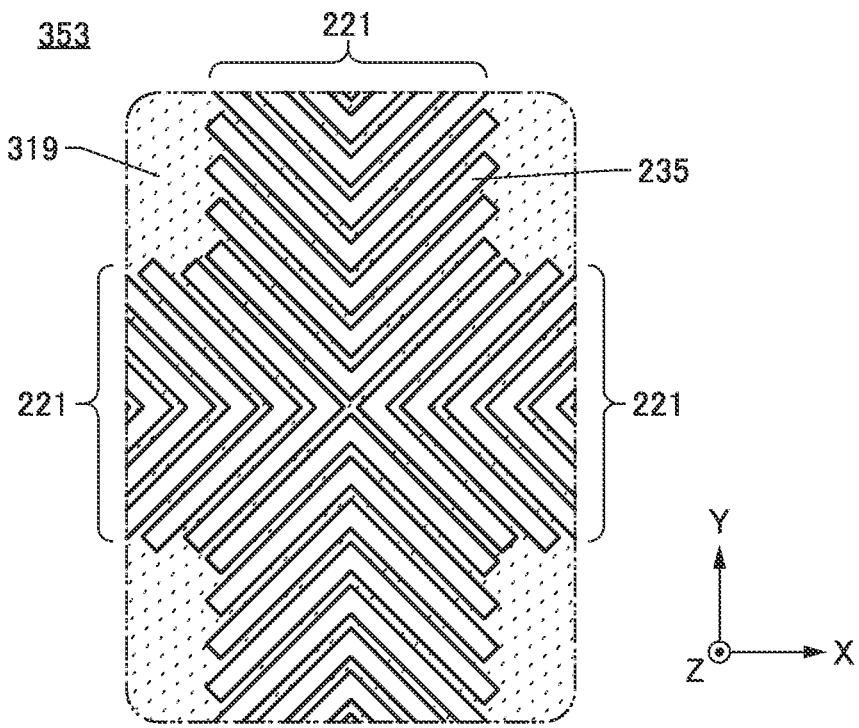
FIG. 21(A) and FIG. 21(B) are diagrams illustrating a structure example of a low dielectric constant region.
Figure 21B:
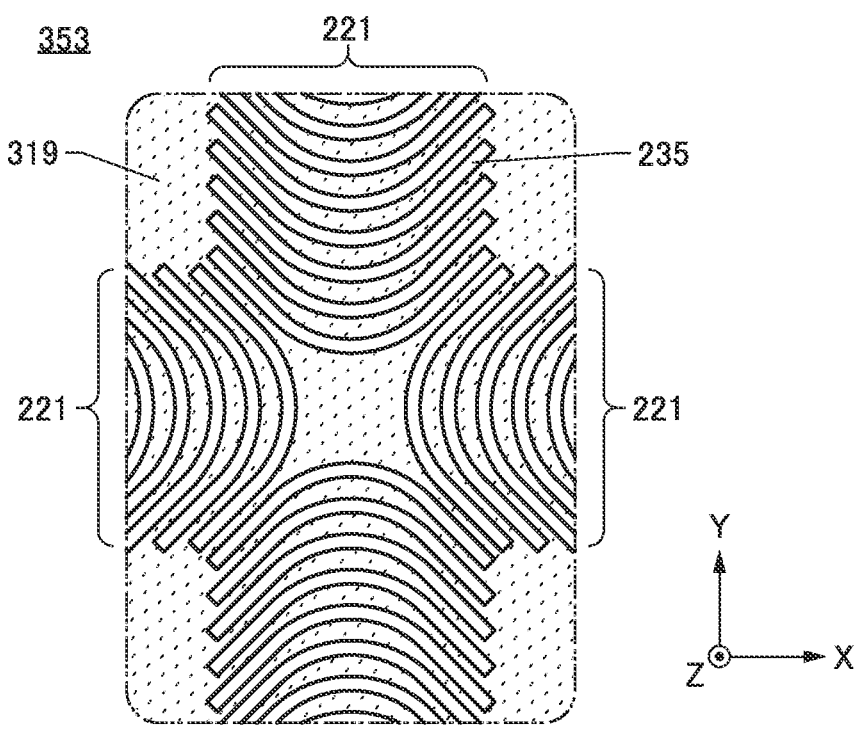

Furthermore, in a view of the LDS 235 in the Z direction, the shape of the LDS 235 does not need to be composed only of straight lines. For example, the LDS 235 may have a bent portion as illustrated in FIG. 21(A), or the LDS 235 may have a curved portion as illustrated in FIG. 21(B). In the region of the LDR 221 extending in the Y direction, the LDS 235 has a region extending in a direction intersecting with the Y direction.

[Example of Manufacturing Process]

Next, an example of a manufacturing process of the LDR 221 will be described with reference to FIG. 22 to FIG. 24. In this embodiment, a manufacturing process from a step after formation of the insulating layer 331 up to a step of formation of the insulating layer 343 is described. FIG. 22 to FIG. 24 correspond to cross-sectional views of portions indicated by dashed-dotted lines A1-A2 and B1-B2 shown in FIG. 10(A). Note that the cross sections along A1-A2 shown in FIG. 22 to FIG. 24 only illustrate a portion across the conductive layer 338.

Figure 22A:
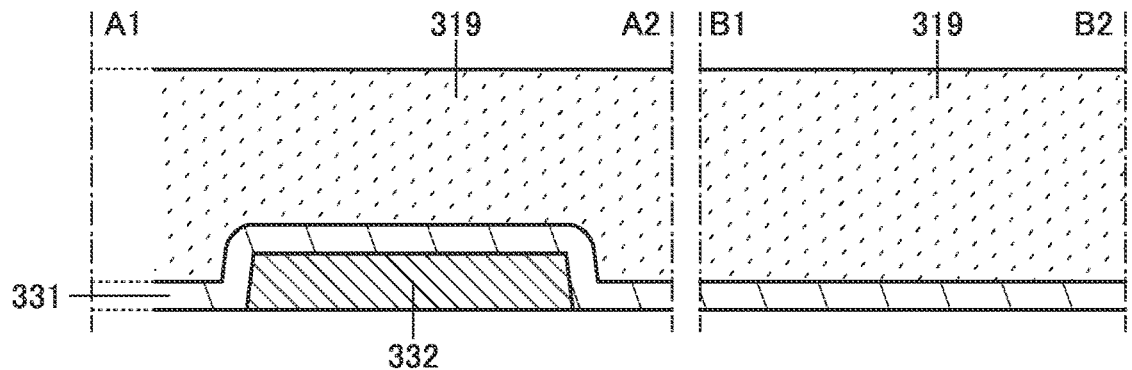
FIG. 22(A) and FIG. 22(B) are diagrams illustrating an example of manufacturing steps of a low dielectric constant region.
Figure 23A:
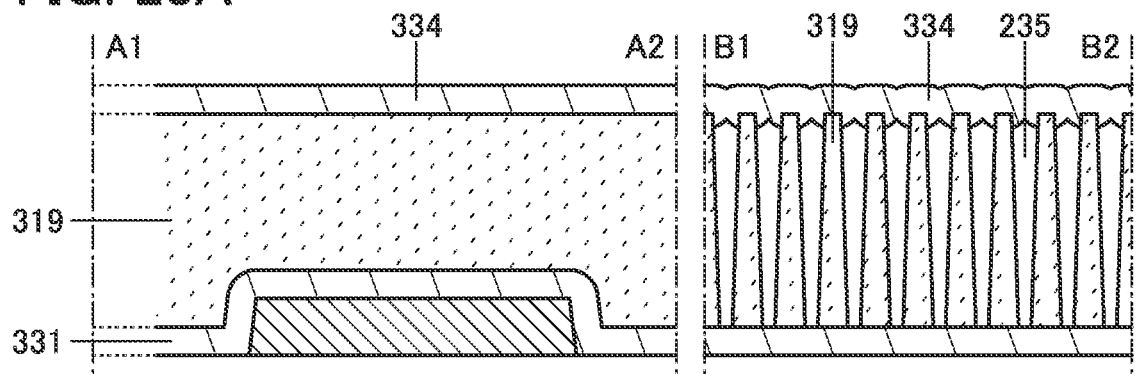
FIG. 23(A) to FIG. 23(C) are diagrams illustrating an example of manufacturing steps of a low dielectric constant region.

After the insulating layer 331 is formed to cover the conductive layer 332, the insulating layer 319 is formed (see FIG. 22(A)). In this embodiment, as the insulating layer 331, an aluminum oxide layer is formed by an ALD method. The insulating layer 331 may have a multilayer structure. For example, such a structure may be employed that an aluminum oxide layer is deposited by an ALD method and an aluminum oxide layer is deposited over the aluminum oxide layer by a sputtering method. Alternatively, such a structure may be employed that an aluminum oxide layer is deposited by a sputtering method and an aluminum oxide layer is deposited by an ALD method over the aluminum oxide layer.

Next, an insulating layer to be the insulating layer 319 is formed over the insulating layer 331. In this embodiment, as the insulating layer to be the insulating layer 319, a silicon oxynitride layer is deposited by a CVD method. Note that heat treatment may be performed before formation of the insulating layer to be the insulating layer 319. Heat treatment may be performed under reduced pressure, and the insulating layer 319 may be successively deposited without exposure to the air. With such treatment, moisture and hydrogen adsorbed onto the surface of the insulating layer 331 and the like can be removed, and the moisture concentration and the hydrogen concentration of the insulating layer 331 and the insulating layer 319 can be reduced.

The heat treatment may be performed at a temperature within the range of 250° C. to 650° C., preferably within the range of 300° C. to 500° C., further preferably within the range of 320° C. to 450° C. Note that the heat treatment is performed in a nitrogen gas or inert gas atmosphere, or an atmosphere containing an oxidizing gas at 10 ppm or more, 1% or more, or 10% or more. Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

Next, the insulating layer 319 is subjected to CMP (Chemical Mechanical Polishing) treatment. Thus, the insulating layer 319 whose top surface is flat can be formed.

Figure 22B:
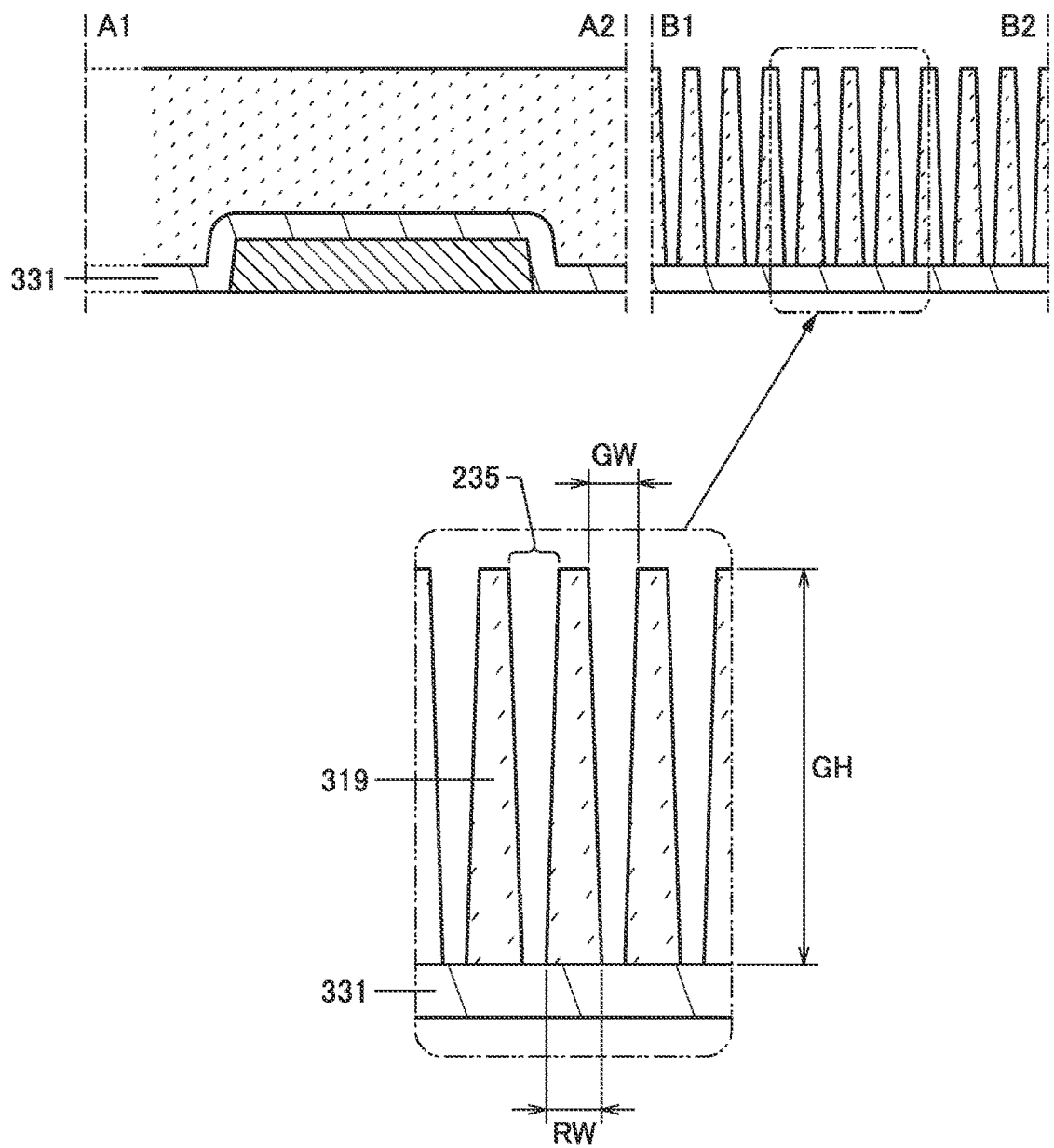

Next, part of the insulating layer 319 is selectively removed by a lithography method, so that the LDS 235 is formed (see FIG. 22(B)).

Note that in the lithography method, first, a resist is exposed to light through a mask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask may be formed by, for example, exposure of the resist to light such as KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case where a hard mask is used, a hard mask with a desired shape can be formed by forming an insulating film or a conductive film serving as the hard mask material over the insulating layer 319, forming a resist mask thereover, and then etching the hard mask material. The insulating layer 319 may be etched after removal of the resist mask or while the resist mask remains. In the latter case, the resist mask sometimes disappears during the etching. The hard mask may be removed by etching after the etching of the insulating layer 319. Meanwhile, the hard mask is not necessarily removed when the hard mask material does not affect a post-process or can be utilized in the post-process.

After the resist mask and/or the hard mask are formed, an opening reaching the insulating layer 331 is formed in the insulating layer 319 by a dry etching method. The opening serves as the LDS 235. Wet etching can be used for the formation of the opening; however, dry etching is preferably used for microfabrication. The insulating layer 331 is preferably formed using an material that functions as an etching stopper used in formation of the LDS 235 by etching the insulating layer 319. For example, in the case where a silicon oxynitride is used as the insulating layer 319 in which the LDS 235 is to be formed, silicon nitride, aluminum oxide, or hafnium oxide is preferably used as the insulating layer 331.

As a dry etching apparatus used for etching, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

The width GW of the LDS 235 is preferably greater than or equal to 3 nm and less than or equal to 20 nm, further preferably greater than or equal to 3 nm and less than or equal to 10 nm. When the width GW is too large, the insulating layer 334 formed in the following step easily intrudes into the LDS 235. In other words, an excessively large width GW might induce a reduction in the LDS 235.

In addition, the width RW of the insulating layer 319, which is sandwiched between adjacent LDSs 235 and corresponds to the above-described "rib", is preferably greater than or equal to 0.5 times and less than or equal to 5 times the width GW, further preferably greater than or equal to 0.5 times and less than or equal to 3 times the width GW. A large width RW enables the mechanical strength of the LDR 221 to increase; meanwhile, when the width RW is too large, the effect of reduction in parasitic capacitance of the LDR 221 is lowered. A reduction in the width RW enables the effect of reduction in parasitic capacitance of the LDR 221 to be enhanced; meanwhile, when the width RW is too small, the mechanical strength of the LDR 221 of the LDR 221 is reduced more than necessary.

Next, the insulating layer 334 is formed over the insulating layer 319 and the LDS 235. A formation of the insulating layer 334 is conducted by a sputtering method, a CVD method, or the like, in a condition with poor coverage. A sputtering method is particularly preferable because deposition in a condition with poor coverage is easily conducted. In this embodiment, as the insulating layer 334, a silicon nitride layer is formed by a sputtering method (see FIG. 23(A)).

The LDS 235 is a gap surrounded by the insulating layer 331, the insulating layer 319, and the insulating layer 334. Thus, the dielectric constant of the LDS 235 can be approximately 1. The LDS 235 contains some sort of gas in some cases. Furthermore, in the case where the insulating layer 334 is formed under reduced pressure, the LDS 235 may be under reduced pressure. For example, in the case where the insulating layer 334 is formed by a sputtering method using a gas containing oxygen as a sputtering gas, the LDS 235 may contain oxygen. In this case, the LDS 235 can function as an oxygen storage.

The LDS 235 may remain as a gap, or a structure body having a lower dielectric constant than the insulating layer 319 may be provided in the LDS 235. For example, in the case where the insulating layer 319 is a silicon oxide having a dielectric constant of 3.8, the LDS 235 may be filled with polyethylene having a dielectric constant of 2.4 and polypropylene having a dielectric constant of 2.1. When the structure body is provided in the LDS 235, the mechanical strength of the LDR 221 can be increased.

Figure 23B:
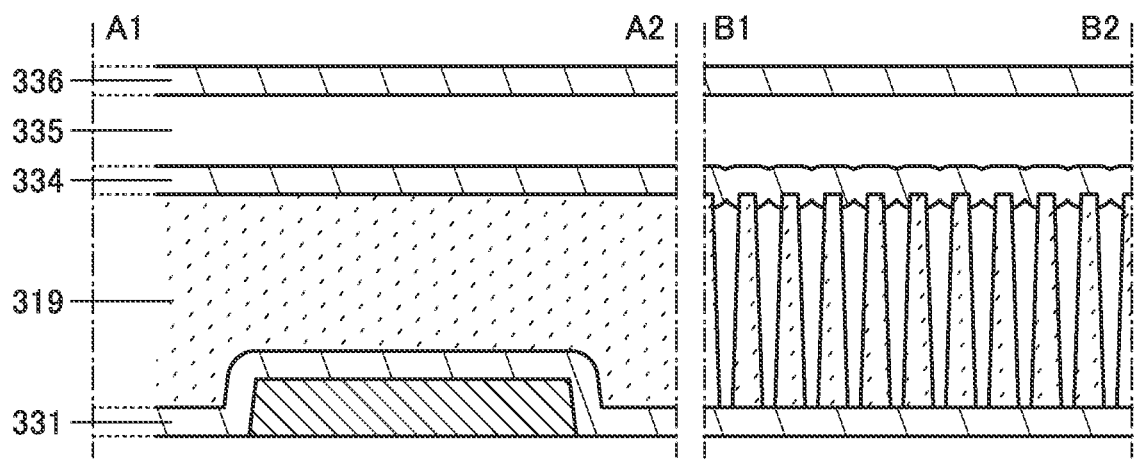
Figure 24A:
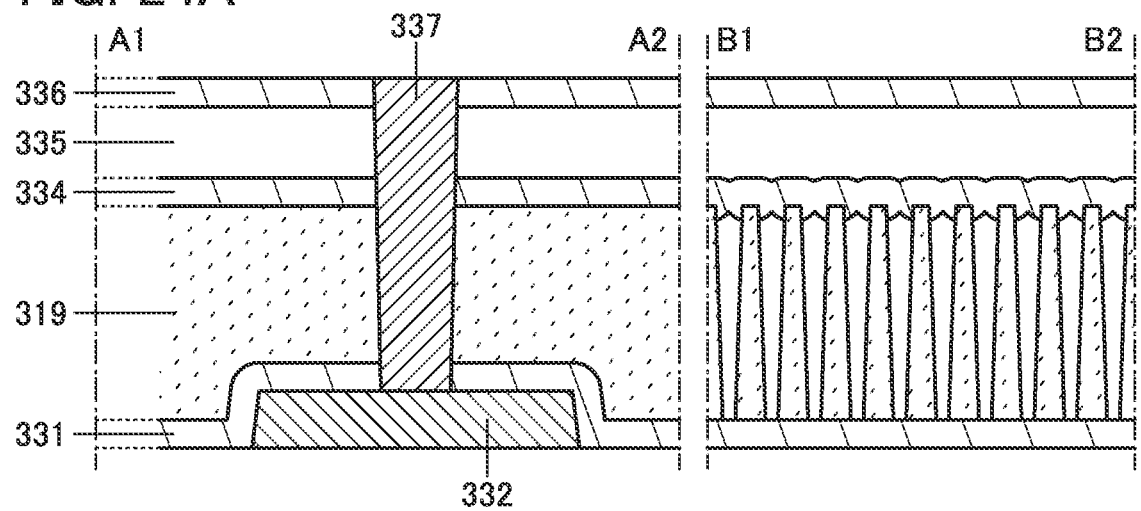
FIG. 24(A) and FIG. 24(B) are diagrams illustrating an example of manufacturing steps of a low dielectric constant region.
Figure 24B:
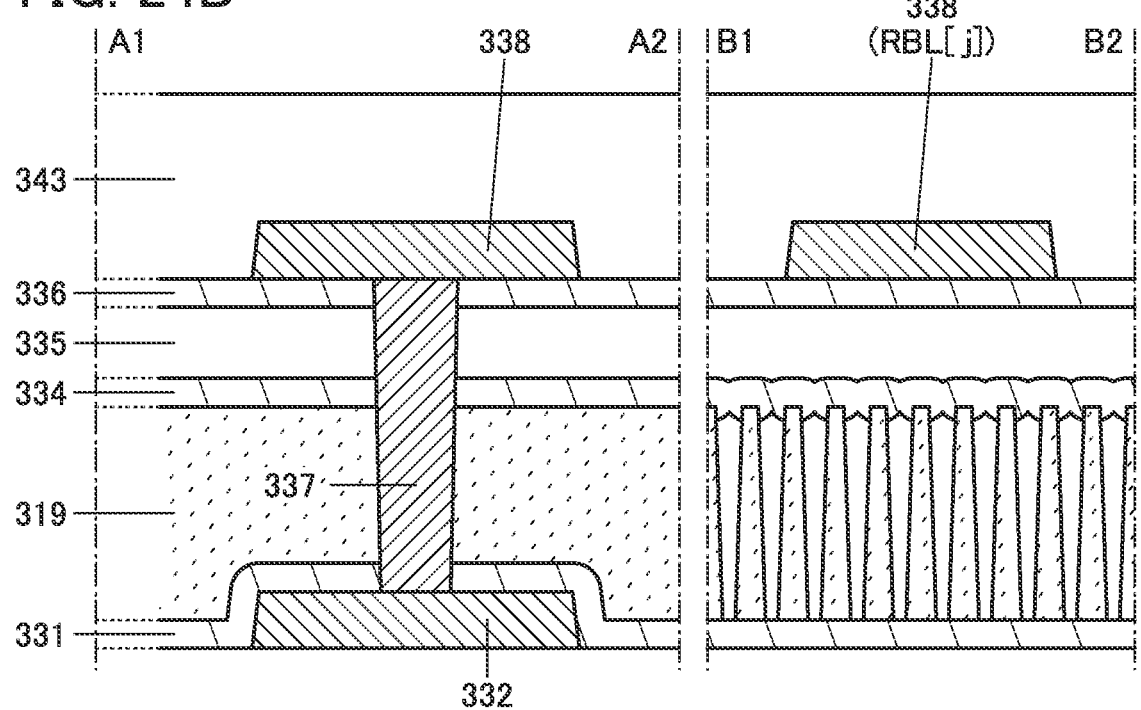

Next, the insulating layer 335 and the insulating layer 336 are formed over the insulating layer 334 (see FIG. 23(B)). In this embodiment, a silicon oxynitride layer is formed by a CVD method as the insulating layer 335. As the insulating layer 336, a silicon nitride layer is formed by a CVD method. After the formation of the insulating layer 335 or after the formation of the insulating layer 336, CMP treatment may be performed.

Figure 23C:
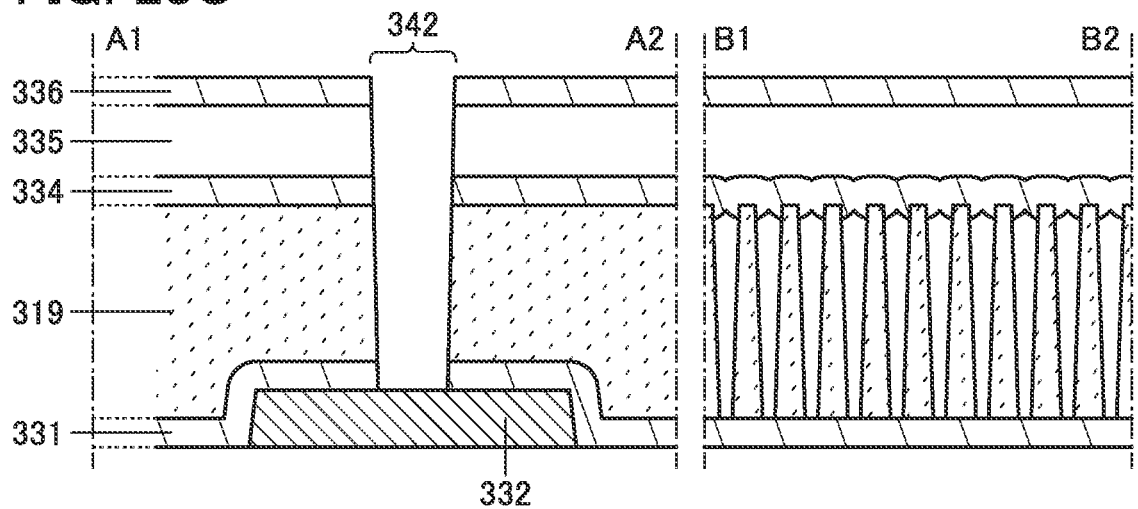

Next, the insulating layer 336, the insulating layer 335, the insulating layer 334, the insulating layer 319, and the insulating layer 331 are partly removed, so that an opening 342 reaching the conductive layer 332 is formed (see FIG. 23(C)).

Next, a conductive layer for forming the contact plug 337 is formed in the opening 342 and over the insulating layer 336. The conductive film can be deposited by a plating method, a sputtering method, a CVD method, an MBE method, a PLD method, an ALD method, or the like. In this embodiment, as the conductive layer, a tungsten layer is deposited by a sputtering method. Next, part of the conductive layer is removed by CMP treatment, so that the insulating layer 336 is exposed. As a result, the conductive layer is left only in the opening 342, so that the contact plug 337 is formed (see FIG. 24(A)).

Next, the conductive layer 338 is formed over the insulating layer 336, and the insulating layer 343 is formed over the conductive layer 338. In this manner, the LDR 221 can be formed.

Modification Example 1

Figure 25:
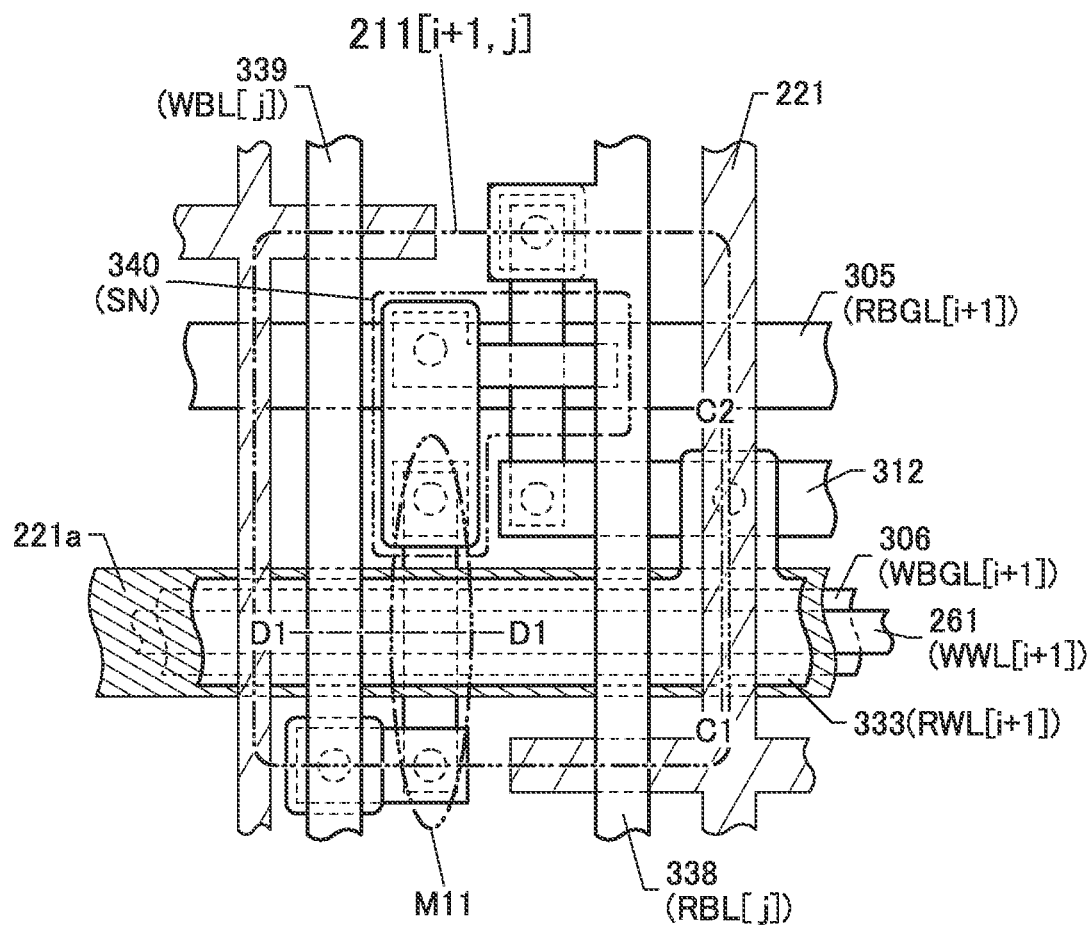
FIG. 25 is a diagram illustrating a structure example of a memory cell.
Figure 26:
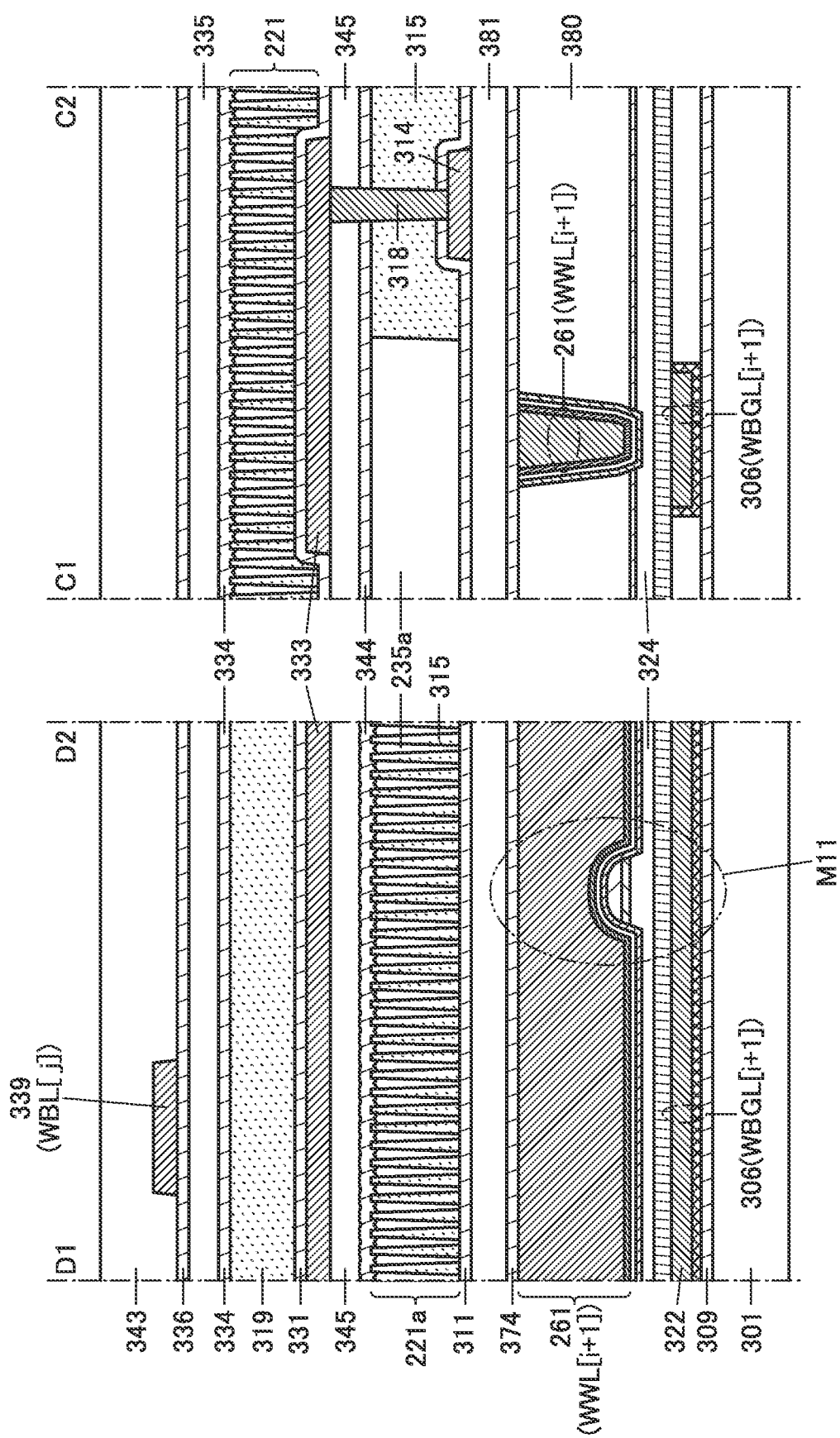
FIG. 26 is a cross-sectional diagram illustrating a structure example of a memory cell.

The LDR 221 may be provided in an insulating layer other than the insulating layer 319. Another arrangement example of the LDR 221 is described with reference to FIG. 25 to FIG. 28. FIG. 25 is a top view of the memory cell 211[i+1,j]. FIG. 26 is cross-sectional views of portions indicated by dashed-dotted lines C1-C2 and D1-D2 illustrated in FIG. 25.

FIG. 25 and FIG. 26 each show an example in which the LDR 221 is provided not only in the insulating layer 319 but also in the insulating layer 315. In FIG. 25 and FIG. 26, the LDR 221 provided in the insulating layer 315 is referred to as an LDR 221a. In addition, the LDS 235 included in the LDR 221a is referred to as an LDS 235a. An insulating layer 344 and an insulating layer 345 are provided between the insulating layer 315 and the conductive layer 333.

The insulating layer 311 can be formed using a material and a method similar to those of the insulating layer 331. The insulating layer 315 can be formed by a material and a method similar to those of the insulating layer 319. The insulating layer 344 can be formed using a material and a method similar to those of the insulating layer 334. The insulating layer 345 can be formed using a material and a method similar to those of the insulating layer 335.

Thus, the LDS 235a can be formed in a manner similar to that of the LDS 235. By providing the LDR 221a in addition to the LDR 221, parasitic capacitance between the adjacent memory cells can be further reduced.

Furthermore, the LDR 221a is provided between the conductive layer 261 (the word line WWL[i+1]) and the conductive layer 333 (the word line RWL[i+1]), whereby parasitic capacitance generated therebetween can be reduced. By providing the LDR 221a at an intersection portion of the wirings, distortion of signals is reduced, so that reliability of the memory device can be increased. In addition, power consumption of the memory device can be reduced.

Modification Example 2

Figure 27:
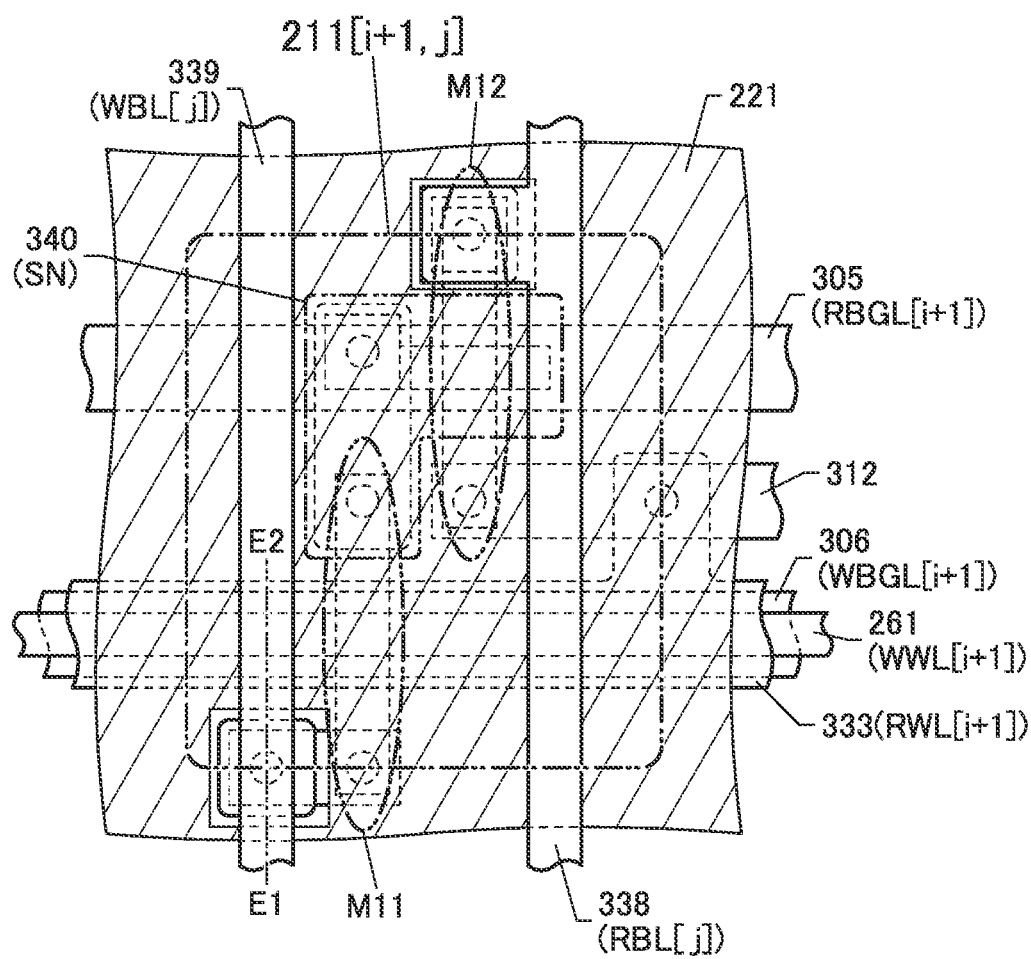
FIG. 27 is a diagram illustrating a structure example of a memory cell.
Figure 28:
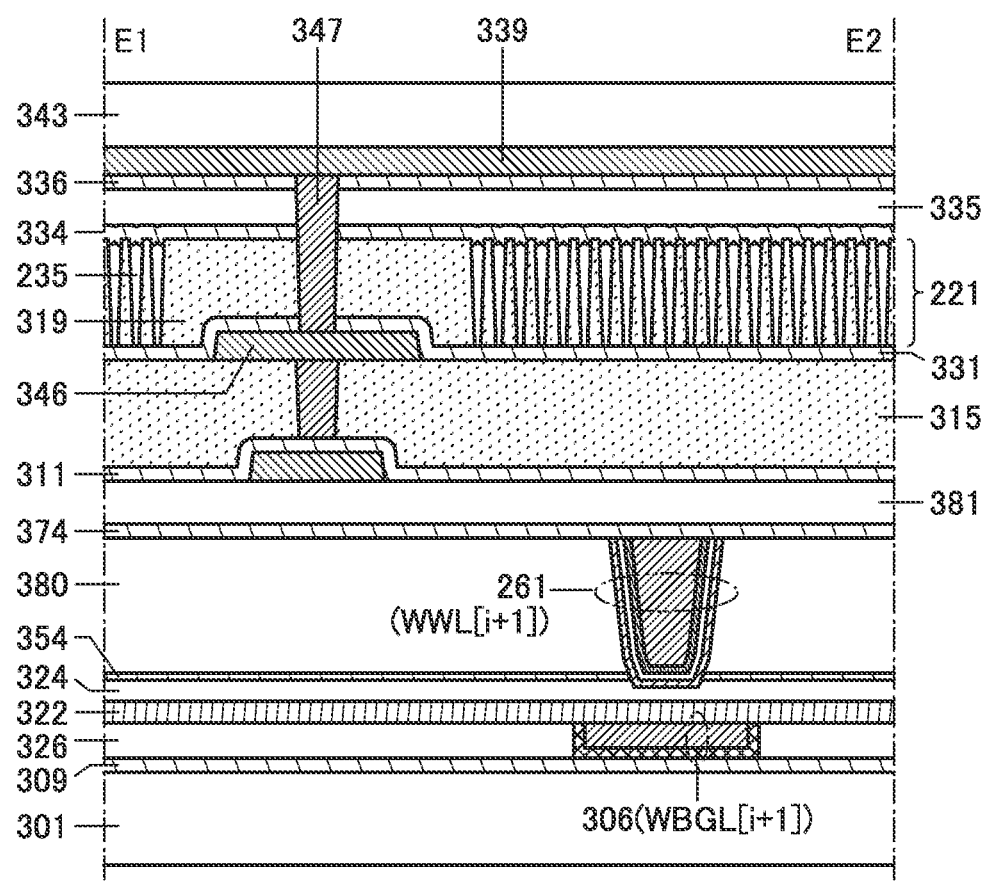
FIG. 28 is a cross-sectional diagram illustrating a structure example of a memory cell.

FIG. 27 is a top view of the memory cell 211[i+1,j]. FIG. 28 is a cross-sectional view of a portion indicated by a dashed-dotted line E1-E2 illustrated in FIG. 27.

As illustrated in FIG. 27 and FIG. 28, the LDR 221 may be provided to cover the memory cell and not to include a region where the contact plug is to be formed. FIG. 28 illustrates an example in which the LDR 221 is provided in the insulating layer 319 excluding a peripheral area of the contact plug 347. Although the LDR 221 is not provided over a conductive layer 346 electrically connected to the contact plug 347 in FIG. 28, the LDR 221 may be provided over the conductive layer 346 in a range where the LDR 221 does not interfere with the contact plug 347.

In addition, although not illustrated, the LDR 221a may be provided to overlap with the memory cell in a manner similar to that of the LDR 221 illustrated in FIG. 27 and FIG. 28. An area where the LDR 221 and the LDR 221a are provided is expanded, parasitic capacitance generated between the adjacent memory cells can be further reduced. Moreover, the parasitic capacitance generated between the conductive layers can be further reduced; thus, distortion of signals is reduced, so that reliability of the memory device can be increased. In addition, power consumption of the memory device can be reduced.

This embodiment can be implemented in an appropriate combination with the structures described in the other embodiments and the like.

Embodiment 3

In this embodiment, structure examples of transistors that can be used as the transistor M11 and the transistor M12 will be described with reference to drawings.

<Transistor Structure Example 1>

Figure 29A:
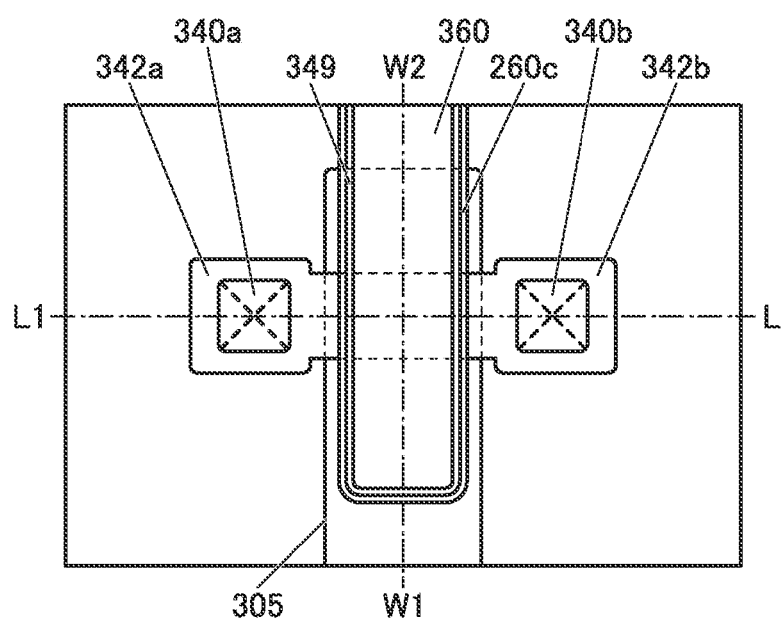
FIG. 29(A) to FIG. 29(C) are diagrams illustrating a structure example of a transistor.
Figure 29C:
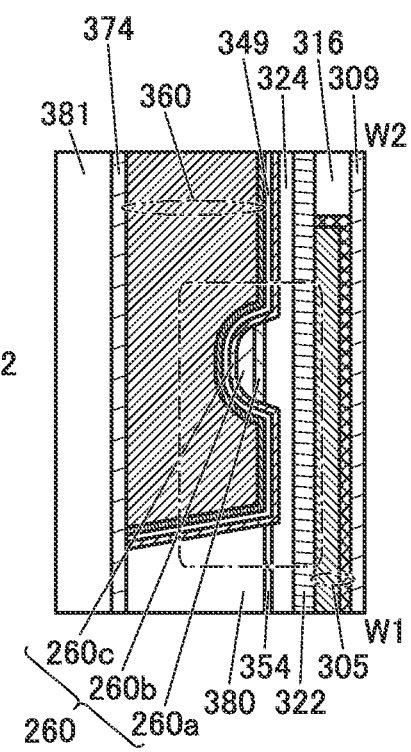
Figure 29B:
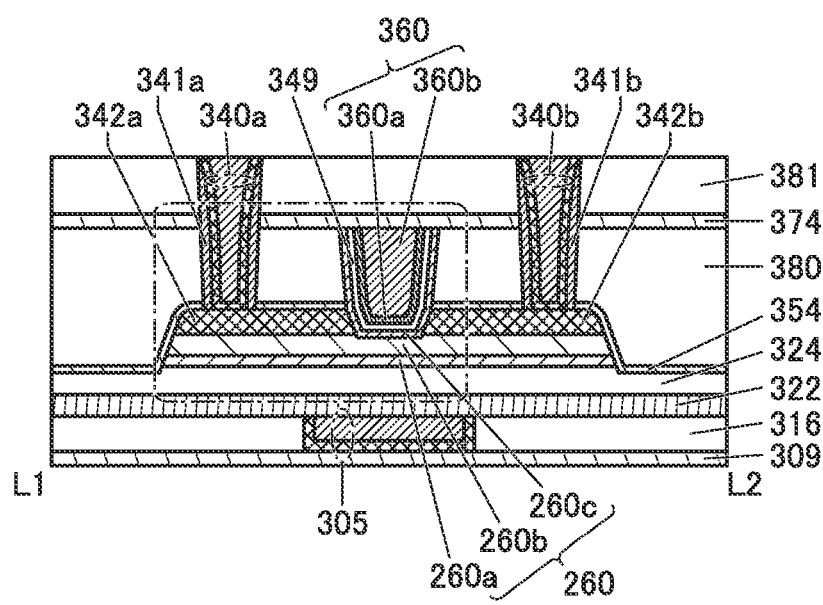

A structure example of a transistor 200A is described with reference to FIGS. 29(A), 29(B), and 29(C). FIG. 29(A) is a top view of the transistor 200A. FIG. 29(B) is a cross-sectional view of a portion indicated by a dashed-dotted line L1-L2 in FIG. 29(A). FIG. 29(C) is a cross-sectional view of a portion indicated by a dashed-dotted line W1-W2 in FIG. 29(A). Note that for simplification of the drawing, some components are not illustrated in the top view in FIG. 29(A).

FIGS. 29(A), 29(B), and 29(C) illustrate the transistor 200A, the insulating layer 309 functioning as an interlayer insulating layer, an insulating layer 316, the insulating layer 322, the insulating layer 324, the insulating layer 354, the insulating layer 380, the insulating layer 374, and the insulating layer 381. In addition, a conductive layer 340 (a conductive layer 340a and a conductive layer 340b) that is electrically connected to the transistor 200A and functions as a contact plug is illustrated. Note that an insulating layer 341 (an insulating layer 341a and an insulating layer 341b) is provided in contact with a side surface of the conducting layer 340 functioning as a contact plug.

As the interlayer insulating film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or barium strontium titanate (($Ba,Sr)TiO_3$) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

The transistor 200A includes the conductive layer 360 (a conductive layer 360a and a conductive layer 360b) functioning as a first gate electrode; the conductive layer 305 functioning as a second gate electrode; an insulating layer 349 functioning as a first gate insulating film; the insulating layer 322 and the insulating layer 324 that function as a second gate insulating layer; the semiconductor layer 260 (a semiconductor layer 260a, a semiconductor layer 260b, and a semiconductor layer 260c) including a region where a channel is formed; a conductive layer 342a functioning as one of a source and a drain; a conductive layer 342b functioning as the other of the source and the drain; and the insulating layer 354.

The conductive layer 305 is provided to be embedded in the insulating layer 316, and the insulating layer 322 is provided over the insulating layer 316 and the conductive layer 305. The insulating layer 324 is provided over the insulating layer 322. The semiconductor layer 260 (the semiconductor layer 260a, the semiconductor layer 260b, and the semiconductor layer 260c) is provided over the insulating layer 324. The insulating layer 349 is provided over the semiconductor layer 260, and the conductive layer 360 (the conductive layer 360a and the conductive layer 360b) is provided over the insulating layer 349.

The conductive layer 342a and the conductive layer 342b are provided in contact with part of the top surface of the semiconductor layer 260b, and the insulating layer 354 is provided in contact with part of the top surface of the insulating layer 324, the side surface of the semiconductor layer 260a, the side surface of the semiconductor layer 260b, the side surface of the conductive layer 342a, the top surface of the conductive layer 342a, the side surface of the conductive layer 342b, and the top surface of the conductive layer 342b.

The insulating layer 341 is provided in contact with the inner wall of an opening formed in the insulating layer 380, the insulating layer 374, and the insulating layer 381. Moreover, a first conductor of the conductive layer 340 is provided in contact with the side surface of the insulating layer 341, and a second conductor of the conductive layer 340 is further provided on the inner side. Here, the height of a top surface of the conductive layer 340 and the height of a top surface of the insulating layer 381 can be substantially level with each other. Note that although the transistor 200A having a structure in which the first conductor of the conductive layer 340 and the second conductor of the conductive layer 340 are stacked is shown, the present invention is not limited thereto. For example, the conductive layer 340 may be provided as a single layer or a stacked-layer structure of three or more layers. In the case where a structure body has a stacked-layer structure, layers may be distinguished by ordinal numbers corresponding to the formation order.

The semiconductor layer 260 preferably includes the semiconductor layer 260a positioned over the insulating layer 324, the semiconductor layer 260b positioned over the semiconductor layer 260a, and the semiconductor layer 260c that is positioned over the semiconductor layer 260b and at least partly in contact with the top surface of the semiconductor layer 260b. When the semiconductor layer 260a is provided below the semiconductor layer 260b, impurities can be inhibited from diffusing into the semiconductor layer 260b from the structures formed below the semiconductor layer 260a. When the semiconductor layer 260c is provided over the semiconductor layer 260b, impurities can be inhibited from diffusing into the semiconductor layer 260b from the structures formed above the semiconductor layer 260c.

In the transistor 200A, an oxide semiconductor that is a kind of a metal oxide is preferably used for the semiconductor layer 260.

A transistor in which the oxide semiconductor is used in a semiconductor layer where the channel is formed exhibits an extremely low leakage current (off-state current) in the off state. Thus, a semiconductor device with reduced power consumption can be achieved. Since the oxide semiconductor can be formed by a sputtering method or the like, a highly integrated semiconductor device can be easily achieved.

For example, for the semiconductor layer 260, a metal oxide such as In-M-Zn oxide (the element M is one or more kinds selected from gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, gallium, yttrium, or tin is preferably used as the element M. Alternatively, an In-M oxide, an In—Zn oxide, or an M-Zn oxide may be used as the semiconductor layer 260.

In the transistor 200A, the conductive layer 360 functioning as the first gate (top gate) electrode is formed in a self-aligned manner to fill an opening formed in the insulating layer 380 and the like. Forming the conductive layer 360 in this manner allows the conductive layer 360 to be surely positioned in a region between the conductive layer 342a and the conductive layer 342b without alignment.

The conductive layer 360 preferably includes the conductive layer 360a and the conductive layer 360b positioned over the conductive layer 360a. For example, the conductive layer 360a is preferably positioned so as to cover the bottom surface and side surface of the conductive layer 360b. Moreover, as illustrated in FIG. 29(B), a top surface of the conductor 360 is substantially aligned with a top surface of the insulating layer 349 and a top surface of the oxide 330c.

The conductive layer 305 sometimes functions as a second gate (also referred to as bottom gate) electrode. In that case, by changing the potential applied to the conductive layer 305 not in conjunction with but independently of the potential applied to the conductive layer 360, the threshold voltage (Vth) of the transistor 200A can be controlled. In particular, by applying a negative potential to the conductive layer 305, Vth of the transistor 200A can be higher than 0 V, and its off-state current can be reduced. Thus, drain current at the time when a potential applied to the conductive layer 360 is 0 V can be lower in the case where a negative potential is applied to the conductive layer 305 than in the case where a negative potential is not applied to the conductive layer 305.

For example, the conductive layer 305 and the conductive layer 360 are provided to overlap with the channel formation region of the semiconductor layer 260 provided therebetween, whereby when a voltage is applied to the conductive layer 305 and the conductive layer 360, an electric field generated from the conductive layer 360 and an electric field generated from the conductive layer 305 are connected and can cover the channel formation region of the semiconductor layer 260.

In other words, the channel formation region can be electrically surrounded by the electric field of the conductive layer 360 having a function of the first gate electrode and the electric field of the conductive layer 305 having a function of the second gate electrode. In this specification and the like, the transistor structure in which the channel formation region is electrically surrounded by the electric fields of the first gate electrode and the second gate electrode is referred to as a surrounded channel (S-channel) structure.

The insulating layer 322 and the insulating layer 354 preferably have a function of inhibiting diffusion of hydrogen (for example, at least one of a hydrogen atom, a hydrogen molecule, and the like). In addition, the insulating layer 322 and the insulating layer 354 preferably have a function of inhibiting diffusion of oxygen (for example, at least one of an oxygen atom and an oxygen molecule, and the like). For example, the insulating layer 322 and the insulating layer 354 preferably have a function of inhibiting diffusion of one or both of hydrogen and oxygen than the insulating layer 324. The insulating layer 322 and the insulating layer 354 preferably have a function of inhibiting diffusion of one or both of hydrogen and oxygen than the insulating layer 349. The insulating layer 322 and the insulating layer 354 preferably have a function of inhibiting diffusion of one or both of hydrogen and oxygen than the insulating layer 380.

Note that in this specification and the like, a film having a function of inhibiting diffusion of hydrogen or oxygen may be referred to as a film through which hydrogen or oxygen does not pass easily, a film having low permeability of hydrogen or oxygen, a film having a barrier property against hydrogen or oxygen, or a barrier film against hydrogen or oxygen, for example. A barrier film having conductivity is sometimes referred to as a conductive barrier film.

As illustrated in FIG. 29(B), the insulating layer 354 is preferably in contact with the top surfaces of the conductive layer 342*a* and the conductive layer 342*b*, the side surfaces of the conductive layer 342*a* and the conductive layer 342*b* except facing side surfaces of the conductive layer 342*a* and the conductive layer 342*b*, the side surfaces of the semiconductor layer 260*a* and the semiconductor layer 260*b*, and the part of the top surface of the insulating layer 324. Accordingly, the insulating layer 380 is electrically isolated from the insulating layer 324, the semiconductor layer 260*a*, and the semiconductor layer 260*b* by the insulating layer 354. This can inhibit entry of impurities such as hydrogen contained in the insulating layer 380 and the like into the insulating layer 324, the semiconductor layer 260*a*, and the semiconductor layer 260*b*.

As illustrated in FIG. 29(B), the transistor 200A has a structure in which the insulating layer 374 is in contact with the top surfaces of the conductive layer 360, the insulating layer 349, and the semiconductor layer 260*c*. With such a structure, impurities such as hydrogen contained in the insulating layer 381 and the like can be inhibited from entering the insulating layer 349. Thus, adverse effects on the electric characteristics of the transistor and the reliability of the transistor can be suppressed.

With the above structure, a transistor having a high on-state current can be provided. Alternatively, a transistor with low off-state current can be provided. Alternatively, a semiconductor device that has small variations in electrical characteristics, stable electrical characteristics, and high reliability can be provided.

<Transistor Structure Example 2>

Figure 30A:
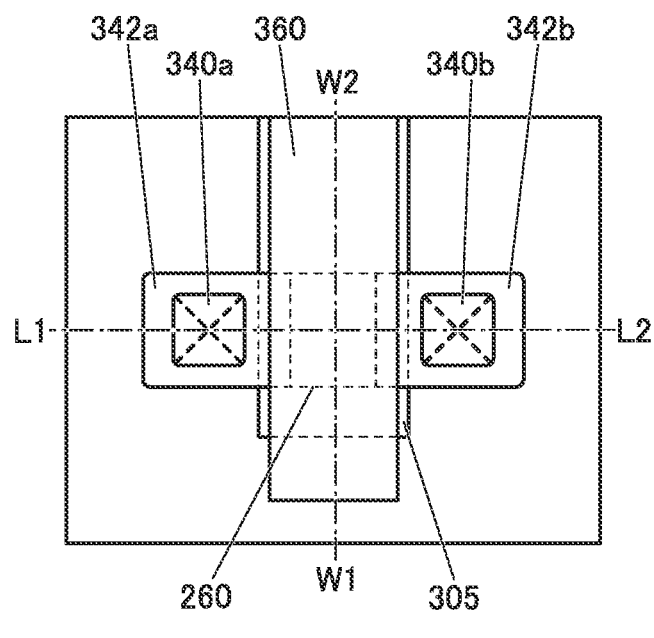
FIG. 30(A) to FIG. 30(C) are diagrams illustrating a structure example of a transistor.
Figure 30C:
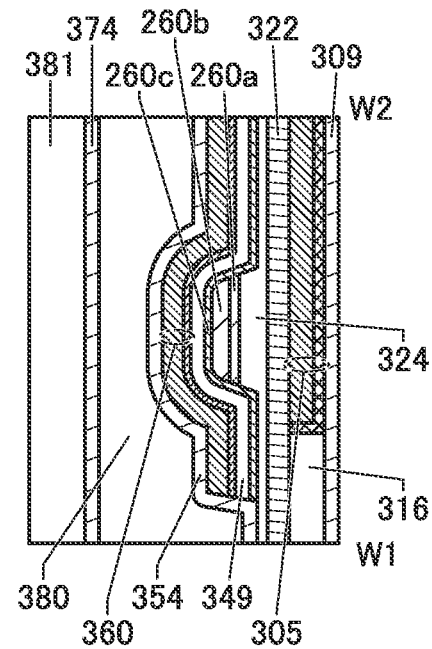
Figure 30B:
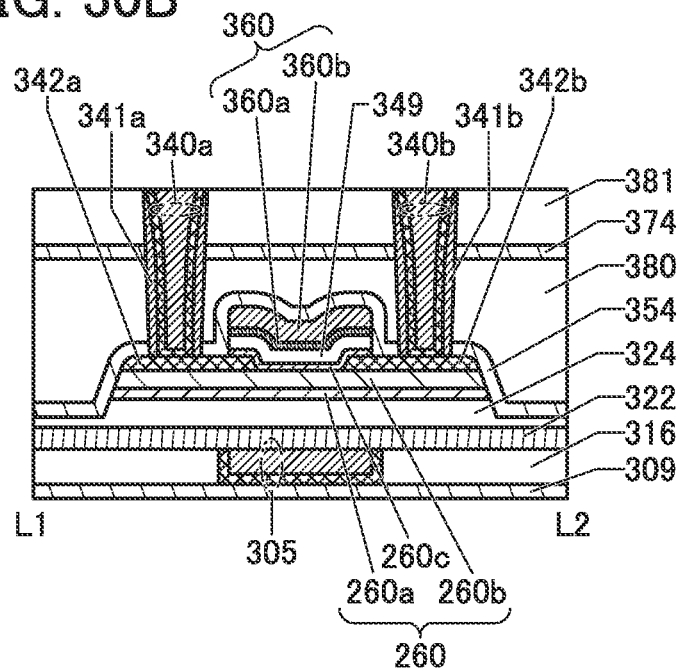

A structure example of a transistor 200B is described with reference to FIGS. 30(A), 30(B), and 30(C). FIG. 30(A) is a top view of the transistor 200B. FIG. 30(B) is a cross-sectional view of a portion indicated by a dashed-dotted line L1-L2 in FIG. 30(A). FIG. 30(C) is a cross-sectional view of a portion indicated by a dashed-dotted line W1-W2 in FIG. 30(A). For clarity of the drawing, some components are not illustrated in the top view of FIG. 30(A).

The transistor 200B is a variation example of the transistor 200A. Therefore, differences from the transistor 200A are mainly described to avoid repeated description.

The conductive layer 360 functioning as a first gate electrode includes the conductive layer 360*a* and the conductive layer 360*b* over the conductive layer 360*a*. The conductor 360*a* is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductive layer 360*a* has a function of inhibiting oxygen diffusion, the range of choices for the material of the conductive layer 360*b* can be expanded. That is, the conductive layer 360*a* inhibits oxidation of the conductive layer 360*b*, thereby preventing the decrease in conductivity of the conductive layer 360*b*.

The insulating layer 354 is preferably provided to cover the top surface and the side surface of the conductive layer 360, the side surface of the insulating layer 349, and the side surface of the semiconductor layer 260*c*. For the insulating layer 354, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulating layer 354 is provided, whereby oxidation of the conductive layer 360 can be inhibited. Moreover, including the insulating layer 354 can inhibit diffusion of impurities such as water and hydrogen contained in the insulating layer 580 into the transistor 200B.

The transistor 200B has the conductive layer 360 overlapping with part of the conductive layer 342*a* and part of the conductive layer 342*b* and thus tends to have larger parasitic capacitance than the transistor 200A. Thus, the transistor 200B tends to have a lower operation frequency than the transistor 200A. However, the transistor 200B does not require a step of embedding the conductive layer 360, the insulating layer 349, and the like in the opening formed in the insulating layer 380 and the like; thus, the productivity of the transistor 200B is higher than that of the transistor 200A.

This embodiment can be implemented in an appropriate combination with the structures described in the other embodiments and the like.

Embodiment 4

In this embodiment, electronic components and electronic devices in which the memory device or the semiconductor device relating to this embodiment of the present invention can be employed will be described.

The memory device or the semiconductor device of one embodiment of the present invention can be incorporated in a variety of electronic devices. In particular, the semiconductor device of one embodiment of the present invention can be used as a memory incorporated in an electronic device. Examples of electronic devices include a digital camera, a digital video camera, a digital photo frame, a mobile phone, a portable game console, a portable information terminal, and an audio reproducing device in addition to electronic devices provided with a relatively large screen, such as a television device, a desktop or laptop personal computer, a monitor for a computer and the like, digital signage, and a large game machine like a pachinko machine.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

<Electronic Components>

Figure 31A:
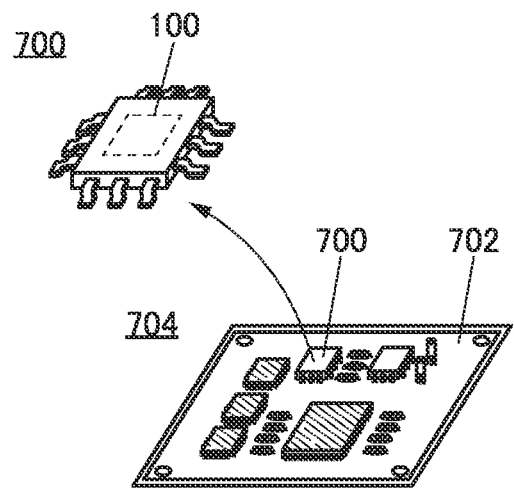
FIG. 31(A) and FIG. 31(B) are diagrams illustrating electronic components.
Figure 31B:
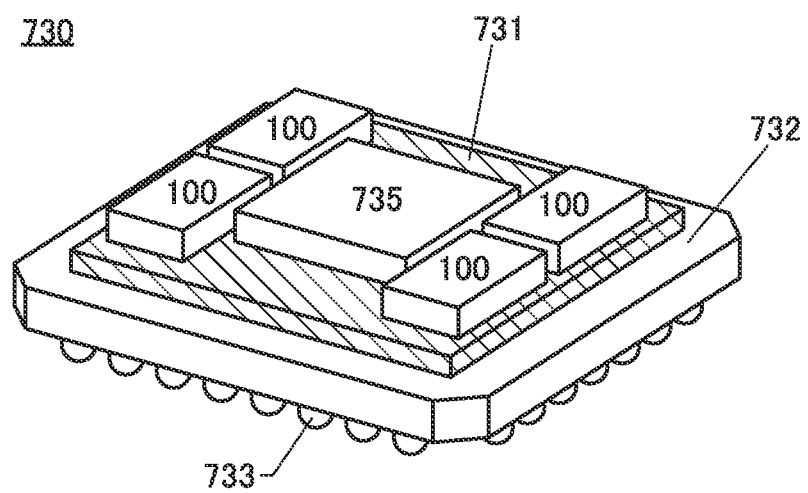

Examples of an electronic component including a memory device 100 are illustrated in FIGS. 31(A) and 31(B).

FIG. 31(A) is a perspective view of an electronic component 700 and a substrate on which the electronic component 700 is mounted (a mounting board 704). The electronic component 700 illustrated in FIG. 31(A) is an IC semiconductor device and includes a lead and a circuit portion. The electronic component 700 is mounted on a printed circuit board 702, for example. A plurality of such IC semiconductor devices are combined and electrically connected to each other on the printed circuit board 702, whereby the mounting board 704 is completed.

The memory device 100 described in the above embodiment is provided as the circuit portion of the electronic component 700. Although a QFP (Quad Flat Package) is used as a package of the electronic component 700 in FIG. 31(A), the embodiment of the package is not limited thereto.

FIG. 31(B) is a perspective view of an electronic component 730. The electronic component 730 is an example of a SiP (System in package) or an MCM (Multi Chip Module). In the electronic component 730, an interposer 731 is provided on a package substrate 732 (a printed circuit board), and a semiconductor device 735 and a plurality of memory devices 100 are provided on the interposer 731.

The electronic component 730 using the memory devices 100 as high bandwidth memory (HBM) is shown as an example. An integrated circuit such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. Moreover, the interposer 731 has a function of electrically connecting an integrated circuit provided on the interposer 731 to an electrode provided on the package substrate 732. Accordingly, the interposer is referred to as a "redistribution substrate" or an "intermediate substrate" in some cases. A through electrode may be provided in the interposer 731 and used for electrically connecting an integrated circuit and the package substrate 732. For a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be used for HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer does not easily occur. Furthermore, the surface of a silicon interposer has high planarity, so that a poor connection between the silicon interposer and an integrated circuit provided on the silicon interposer does not easily occur. It is particularly preferable to use a silicon interposer for a 2.5D package (2.5D mounting) in which a plurality of integrated circuits are arranged on an interposer.

A heat sink (a radiator plate) may be provided to overlap with the electronic component 730. In the case of providing a heat sink, the heights of integrated circuits provided on the interposer 731 are preferably equal to each other. For example, in the electronic component 730 described in this embodiment, the heights of the memory device 100 and the semiconductor device 735 are preferably equal to each other.

To mount the electronic component 730 on another substrate, an electrode 733 may be provided on the bottom portion of the package substrate 732. FIG. 31(B) illustrates an example in which the electrode 733 is formed of a solder ball. Solder balls are provided in a matrix on the bottom portion of the package substrate 732, whereby BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

<Electronic Device>

Next, examples of electronic devices including the above electronic component will be described with reference to FIG. 32 and FIG. 35.

Figure 32:
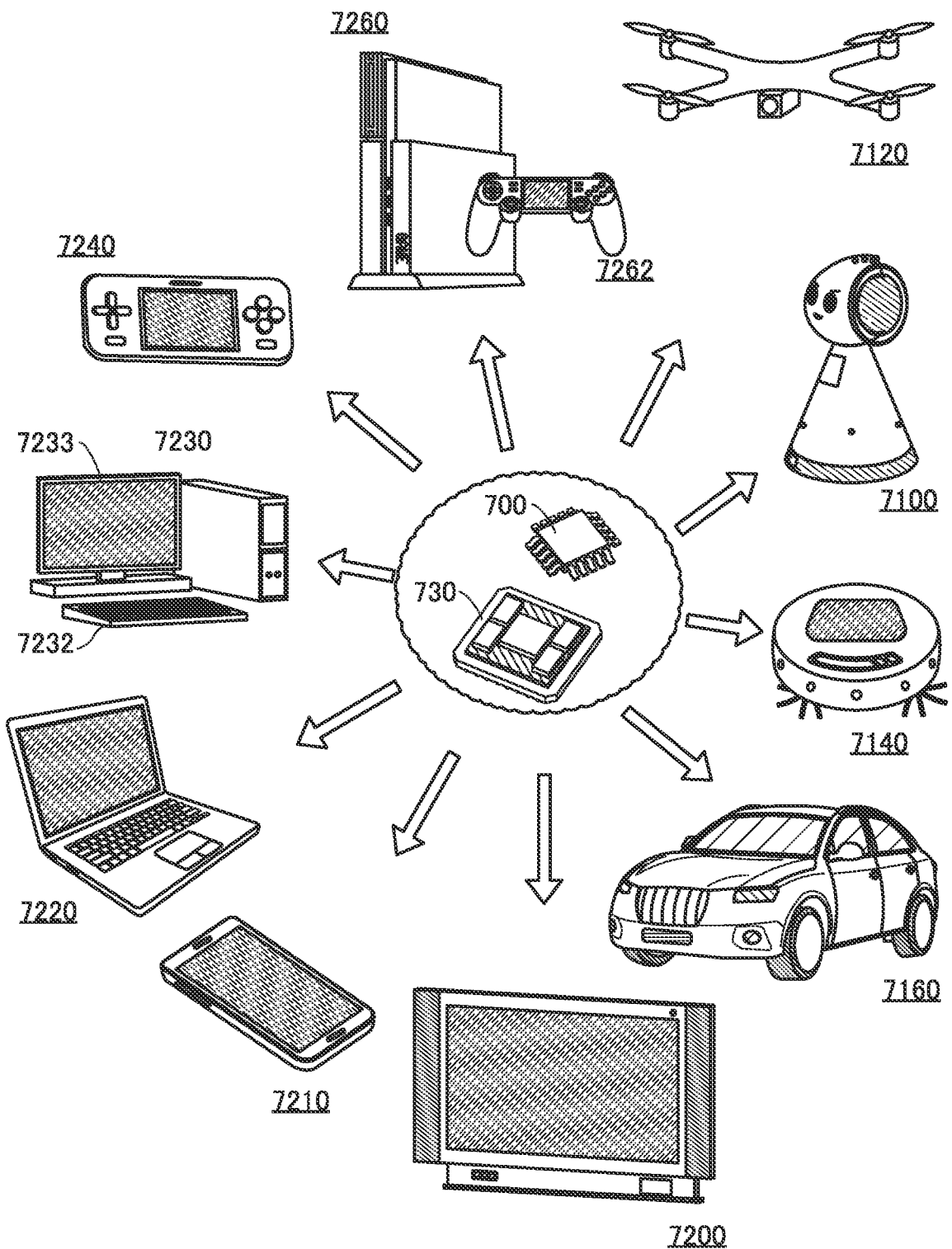
FIG. 32 is a diagram illustrating electronic devices.

A robot 7100 illustrated in FIG. 32 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The electronic component 730 includes a processor or the like and has a function of controlling these peripheral devices. For example, the electronic component 700 has a function of storing data obtained by the sensors.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user of the microphone and the speaker.

The camera has a function of taking images of the surroundings of the robot 7100. Furthermore, the robot 7100 has a function of moving with use of the moving mechanism. The robot 7100 can take images of the surroundings with use of the camera, and can analyze the images to sense whether there is an obstacle in the way of the movement.

A flying object 7120 includes propellers, a camera, a battery, and the like and has a function of flying autonomously. The electronic component 730 has a function of controlling these peripheral devices.

For example, image data taken by the camera is stored in the electronic component 700. The electronic component 730 can analyze the image data to sense whether there is an obstacle in the way of the movement. Moreover, the electronic component 730 can estimate the remaining battery level from a change in the power storage capacity of the battery.

A cleaning robot 7140 includes a display provided on the top surface, a plurality of cameras provided on the side surface, a brush, an operation button, various kinds of sensors, and the like. Although not illustrated, the cleaning robot 7140 is provided with a tire, an inlet, and the like. The cleaning robot 7140 can run autonomously, detect dust, and vacuum the dust through the inlet provided on the bottom surface.

For example, the electronic component 730 can judge whether there is an obstacle such as a wall, furniture, or a step by analyzing an image taken by the cameras. In the case where an object that is likely to be caught in the brush, such as a wire, is detected by image analysis, the rotation of the brush can be stopped.

An automobile 7160 is shown as an example of a moving object. The automobile 7160 includes an engine, tires, a brake, a steering gear, a camera, and the like. For example, the electronic component 730 performs control for optimizing the running state of the automobile 7160 on the basis of navigation information, the speed, the state of the engine, the gearshift state, the use frequency of the brake, and other data. For example, image data taken by the camera is stored in the electronic component 700.

Note that although an automobile is described above as an example of a moving vehicle, the moving vehicle is not limited to an automobile. Examples of moving objects also include a train, a monorail train, a ship, and a flying object (a helicopter, an unmanned aircraft (a drone), an airplane, and a rocket), and these moving objects can include a system utilizing artificial intelligence when equipped with the computer of one embodiment of the present invention.

The electronic component 700 and/or the electronic component 730 can be incorporated in a TV device 7200 (a television receiver), a smartphone 7210, PCs 7220 (personal computers) and 7230, a game machine 7240, a game console 7260, and the like.

For example, the electronic component 730 incorporated in the TV device 7200 can function as an image processing engine. The electronic component 730 performs, for example, image processing such as noise removal and resolution up-conversion.

The smartphone 7210 is an example of a portable information terminal. The smartphone 7210 includes a microphone, a camera, a speaker, various kinds of sensors, and a display portion. These peripheral devices are controlled by the electronic component 730.

The PC 7220 and the PC 7230 are examples of a notebook PC and a desktop PC. To the PC 7230, a keyboard 7232 and a monitor device 7233 can be connected with or without a wire.

The game machine 7240 is an example of a portable game machine. The game console 7260 is an example of a home-use stationary game machine. To the game machine 7260, a controller 7262 is connected with or without a wire. The electronic component 700 and/or the electronic component 730 can be incorporated in the controller 7262.

A game machine in which the semiconductor device of one embodiment of the present invention is used is not limited to these. Examples of game machines using the semiconductor device of one embodiment of the present invention include an arcade game machine installed in entertainment facilities (a game center, an amusement park, and the like), and a throwing machine for batting practice installed in sports facilities.

The memory device or the semiconductor device of one embodiment of the present invention can be used for a variety of removable memory devices such as memory cards (e.g., SD cards), USB memories, and SSDs (solid state drives). FIG. 33 schematically illustrates some structure examples of removable memory devices. The memory device or the semiconductor device of one embodiment of the present invention can be used for a variety of storage devices and removable memory devices.

Figure 33A:
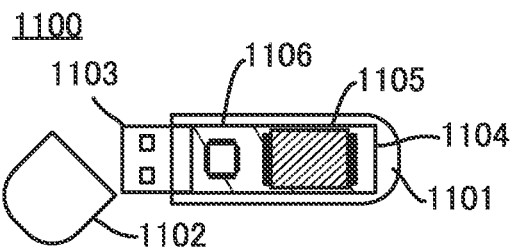
FIG. 33(A) to FIG. 33(E) are diagrams illustrating electronic devices.

FIG. 33(A) is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The memory device or the semiconductor device of one embodiment of the present invention can be incorporated into the memory chip 1105 or the like on the substrate 1104.

Figure 33B:
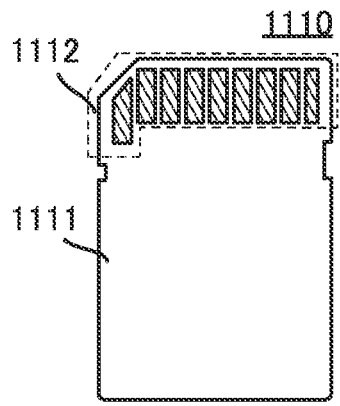
Figure 33C:
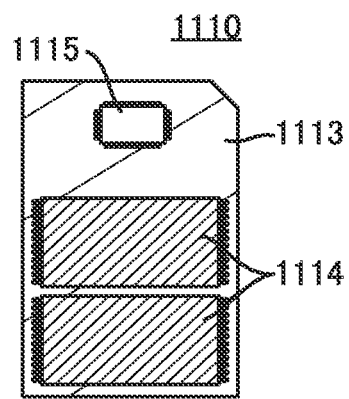

FIG. 33(B) is a schematic external view of an SD card, and FIG. 33(C) is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

Figure 33D:
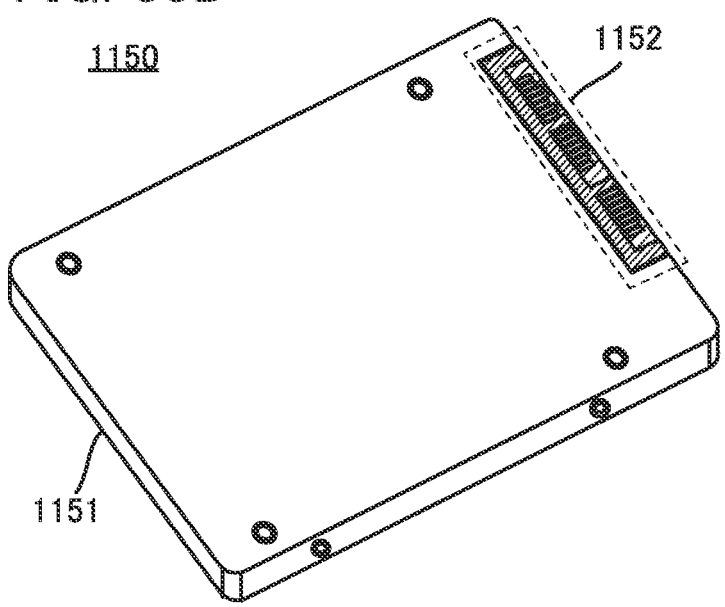
Figure 33E:
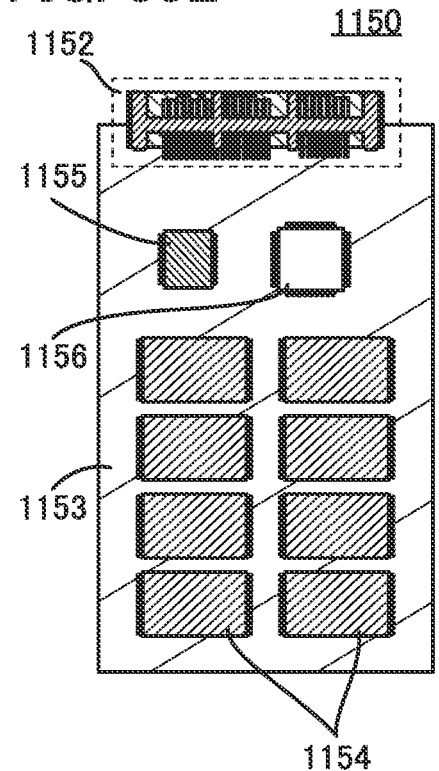

FIG. 33(D) is a schematic external view of an SSD, and FIG. 33(E) is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like on the substrate 1153.

Figure 34A:
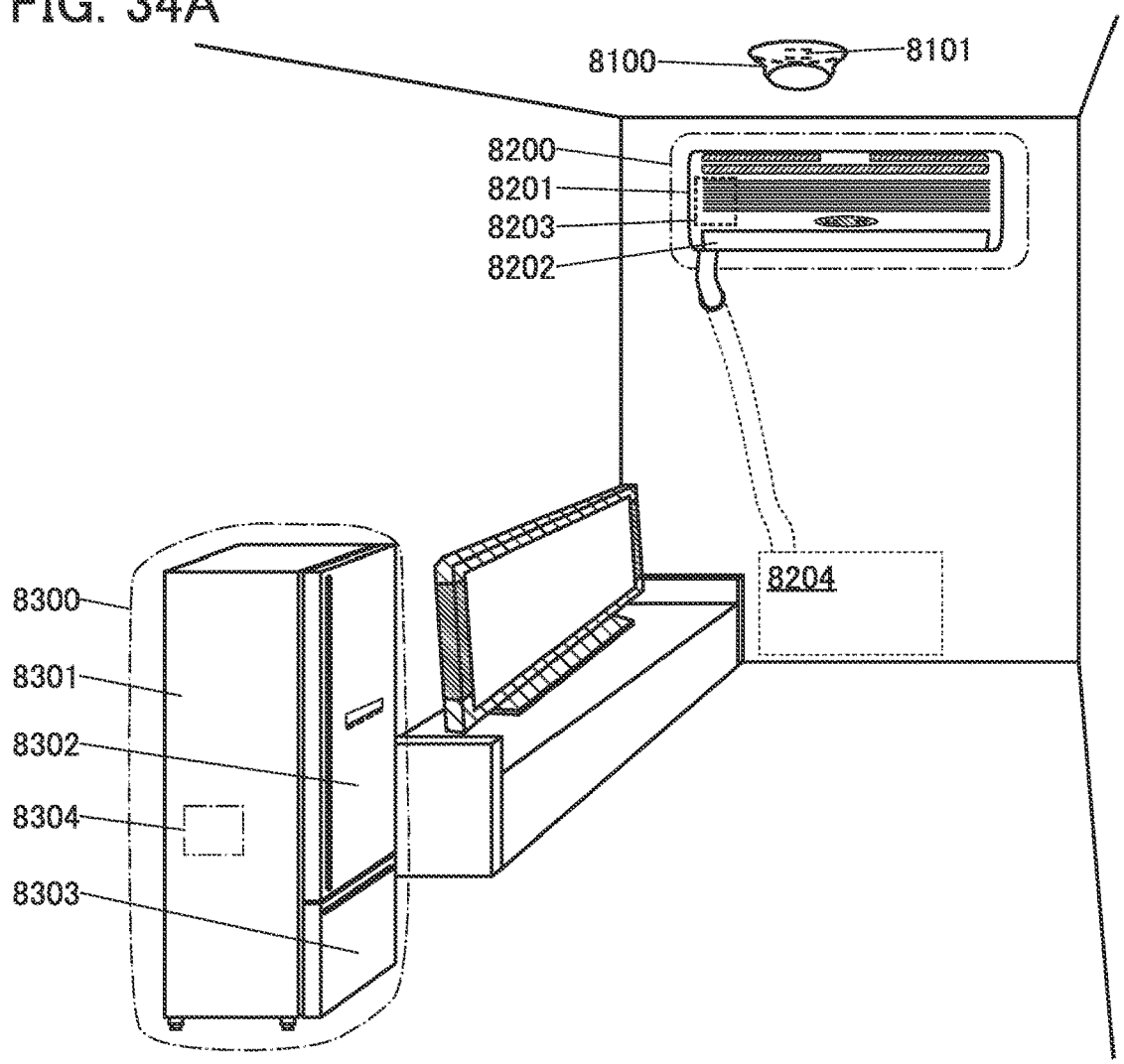
FIG. 34(A) to 34(C) are diagrams illustrating electronic devices.

An alarm device 8100 illustrated in FIG. 34(A) is a residential fire alarm, which includes a sensor portion and a semiconductor device 8101. When the electronic component 700 and/or the electronic component 730 are/is used in the semiconductor device 8101, the power consumption of the alarm device 8100 can be reduced. In addition, stable operation can be performed even in a high-temperature environment. Thus, the reliability of the alarm device 8100 can be increased.

An air conditioner illustrated in FIG. 34(A) includes an indoor unit 8200 and an outdoor unit 8204. The indoor unit 8200 includes a housing 8201, an air outlet 8202, a semiconductor device 8203, and the like. Although FIG. 34(A) illustrates the case where the semiconductor device 8203 is provided in the indoor unit 8200, the semiconductor device 8203 may be provided in the outdoor unit 8204. Alternatively, the semiconductor device 8203 may be provided in both the indoor unit 8200 and the outdoor unit 8204. When the electronic component 700 and/or the electronic component 730 are/is used in the semiconductor device 8203, the power consumption of the air conditioner can be reduced. In addition, stable operation can be performed even in a high-temperature environment. Thus, the reliability of the air conditioner can be increased.

An electric refrigerator-freezer 8300 illustrated in FIG. 34(A) includes a housing 8301, a refrigerator door 8302, a freezer door 8303, a semiconductor device 8304, and the like. The semiconductor device 8304 is provided in the housing 8301 in FIG. 34(A). When the electronic component 700 and/or the electronic component 730 are/is used in the semiconductor device 8304, the power consumption of the electric refrigerator-freezer 8300 can be reduced. In addition, stable operation can be performed even in a high-temperature environment. Thus, the reliability of the electric refrigerator-freezer 8300 can be increased.

Note that in this embodiment, the electric refrigerator-freezer and the air conditioner are described as examples of household appliances. The semiconductor device of one embodiment of the present invention can also be used for another household appliance. Other examples of household appliances include a vacuum cleaner, a microwave oven, an electric oven, a rice cooker, a water heater, an IH cooker, a water server, a heating-cooling combination appliance (including an air conditioner), a washing machine, a drying machine, and an audio visual appliance.

Figure 34B:
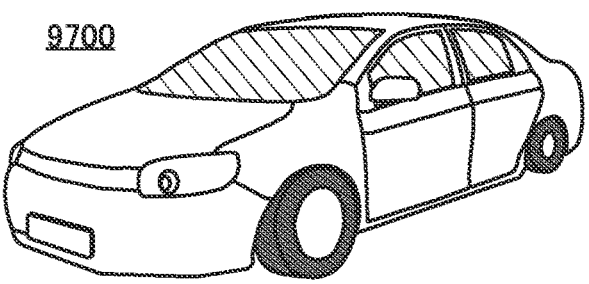
Figure 34C:
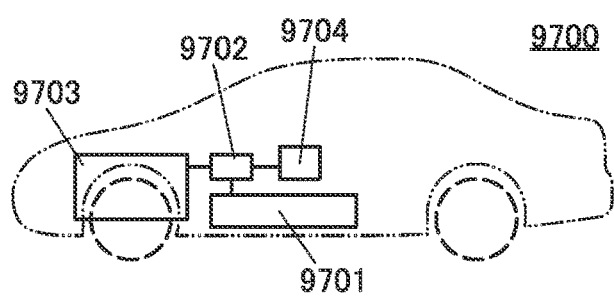

FIG. 34(B) illustrates an example of an electric vehicle. An electric vehicle 9700 is equipped with a secondary battery 9701. The output of the electric power of the secondary battery 9701 is adjusted by a control circuit 9702, and the electric power is supplied to a driving device 9703. The control circuit 9702 is controlled by a processing device 9704 including a semiconductor device or the like which is not illustrated. When the electronic component 700 and/or the electronic component 730 are/is used in the control circuit 9702 or the processing device 9704, the power consumption of the electric vehicle 9700 can be reduced. In addition, stable operation can be performed even in a high-temperature environment. Thus, the reliability of the electric vehicle 9700 can be increased.

The driving device 9703 includes a DC motor or an AC motor either alone, or a combination of a motor and an internal-combustion engine. The processing device 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing device 9704 to control the output of the driving device 9703. In the case where the AC motor is mounted, although not illustrated, an inverter which converts a direct current into an alternate current is also incorporated.

Figure 35A:
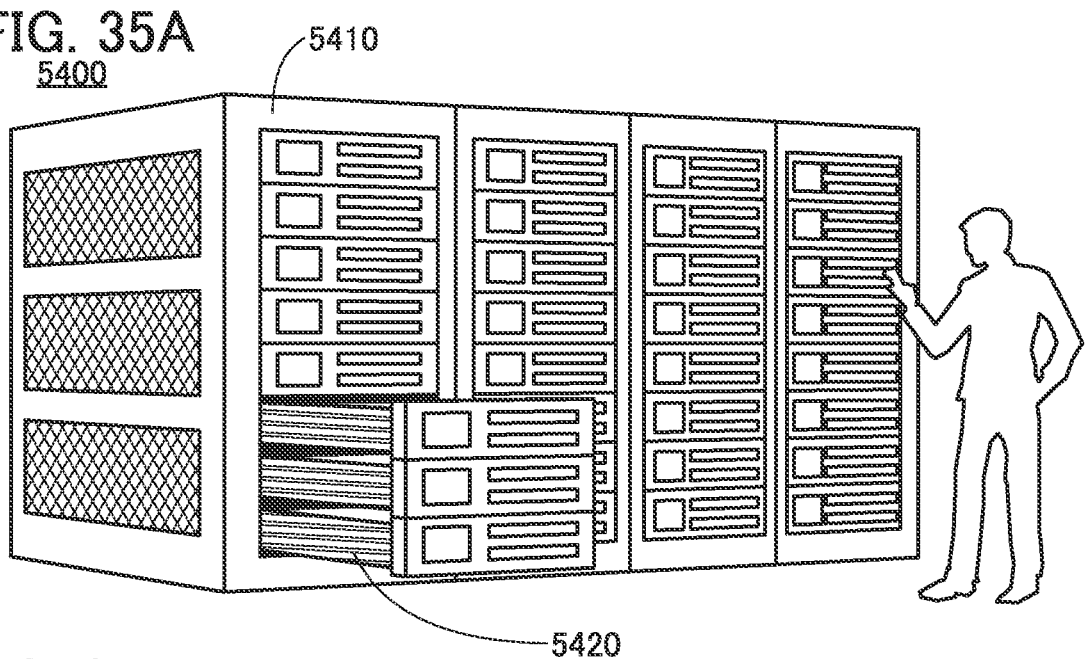
FIG. 35(A) to 35(C) are diagrams illustrating electronic devices.

A computer 5400 illustrated in FIG. 35(A) is an example of a large computer. In the computer 5400, a plurality of rack mount computers 5420 are stored in a rack 5410.

Figure 35B:
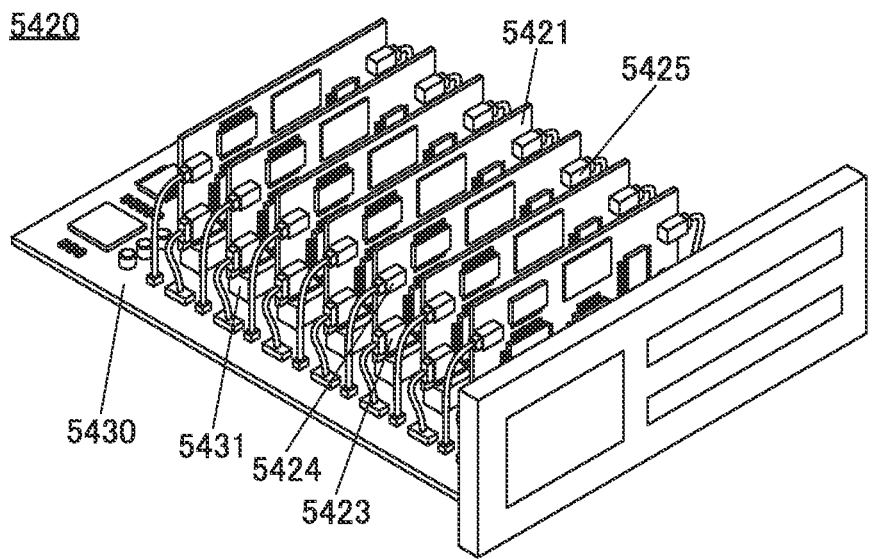

The computer 5420 can have a structure in a perspective view illustrated in FIG. 35(B), for example. In FIG. 35(B), the computer 5420 includes a motherboard 5430, and the motherboard includes a plurality of slots 5431. A PC card 5421 is inserted in the slot 5431.

Figure 35C:
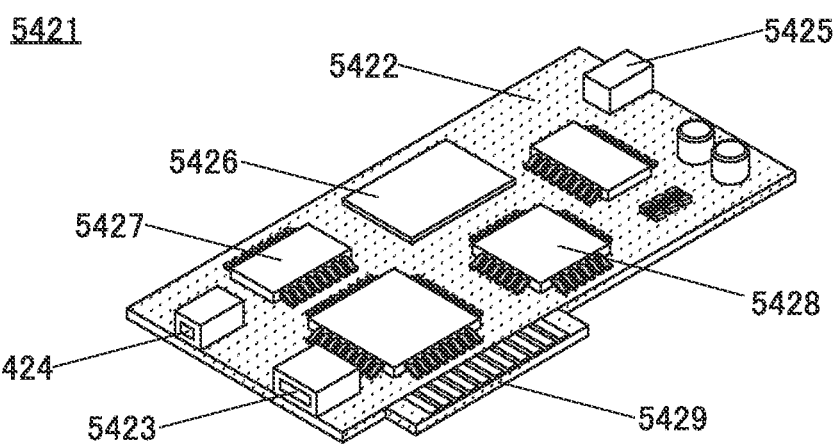

The PC card 5421 can have a structure in a perspective view illustrated in FIG. 35(C), for example. The PC card 5421 illustrated in FIG. 35(C) is an example of a processing board provided with a CPU, a GPU, a memory device, and the like. The PC card 5421 includes a board 5422. The board 5422 includes a connection terminal 5423, a connection terminal 5424, a connection terminal 5425, a semiconductor device 5426, a semiconductor device 5427, a semiconductor device 5428, and a connection terminal 5429. FIG. 35(C) also illustrates semiconductor devices other than the semiconductor device 5426, the semiconductor device 5427, and the semiconductor device 5428; the following description of the semiconductor device 5426, the semiconductor device 5427, and the semiconductor device 5428 can be referred to for these semiconductor devices.

The connection terminal 5429 has a shape with which the connection terminal 5429 can be inserted in the slot 5431 of the motherboard 5430, and the connection terminal 5429 functions as an interface for connecting the PC card 5421 and the motherboard 5430. An example of the standard for the connection terminal 5429 is PCIe.

The connection terminal 5423, the connection terminal 5424, and the connection terminal 5425 can serve, for example, as an interface for performing power supply, signal input, or the like to the PC card 5421. As another example, they can serve as an interface for outputting a signal calculated by the PC card 5421, for instance. Examples of the standard for each of the connection terminal 5423, the connection terminal 5424, and the connection terminal 5425 include USB (Universal Serial Bus), SATA (Serial ATA), and SCSI (Small Computer System Interface). In the case where video signals are output from the connection terminal 5423, the connection terminal 5424, and the connection terminal 5425, an example of the standard therefor is HDMI (registered trademark).

The semiconductor device 5426 includes a terminal (not illustrated) for inputting and outputting signals, and when the terminal is inserted in a socket (not illustrated) of the board 5422, the semiconductor device 5426 and the board 5422 can be electrically connected to each other.

The semiconductor device 5427 includes a plurality of terminals, and when the terminals are reflow-soldered, for example, to wirings of the board 5422, the semiconductor device 5427 and the board 5422 can be electrically connected to each other. Examples of the semiconductor device 5427 include an FPGA (Field Programmable Gate Array), a GPU, and a CPU. As the semiconductor device 5427, the electronic component 730 can be used.

The semiconductor device 5428 includes a plurality of terminals, and when the terminals are reflow-soldered, for example, to wirings of the board 5422, the semiconductor device 5428 and the board 5422 can be electrically connected to each other. As the semiconductor device 5428, a memory device can be given, for example. As the semiconductor device 5428, the electronic component 700 can be used.

The computer 5400 can also function as a parallel computer. When the computer 5400 is used as a parallel computer, large-scale computation necessary for artificial intelligence learning and inference can be performed, for example.

The semiconductor device of one embodiment of the present invention is used in a variety of electronic devices described above, whereby a reduction in size, an increase in speed, or a reduction in power consumption of the electronic devices can be achieved. Moreover, heat generation from a circuit can be reduced owing to low power consumption; thus, the influence of heat generation on the circuit, a peripheral circuit, and a module can be reduced. In addition, stable operation can be performed even in a high-temperature environment. Thus, the reliability of the electronic devices can be increased.

This embodiment can be implemented in an appropriate combination with the structures described in the other embodiments and the like.

Embodiment 5

The OS-LSI described in the above embodiment can be employed in a variety of memory devices. In this embodiment, memory devices that are able to be replaced by OS-LSI will be described with reference FIG. 36 to FIG. 38.

In general, memory devices are classified into work storage devices (working memory) and long-term memory devices (storage).

The working memory is a memory device where an arithmetic unit such as CPU directly reads and writes data while executing arithmetic processing. Thus, for the working memory, high speed operation and high rewriting endurance are required. The working memory is classified into a register, a cache, a main memory device, or the like depending on usage. Note that an SRAM and a DRAM are mainly used for a cache and a main memory device, respectively.

The storage is also called "external storage device" or "auxiliary storage device". The storage is connected to an arithmetic unit such as a CPU through an external bus or the like. Although the storage is inferior to the working memory in the data transfer speed, it has a large storage capacity and is used to storage data for a long term. For the storage, a NOR flash memory, a NAND flash memory (NAND flash), an HDD, a magnetic tape, or the like is used.

Figure 36:
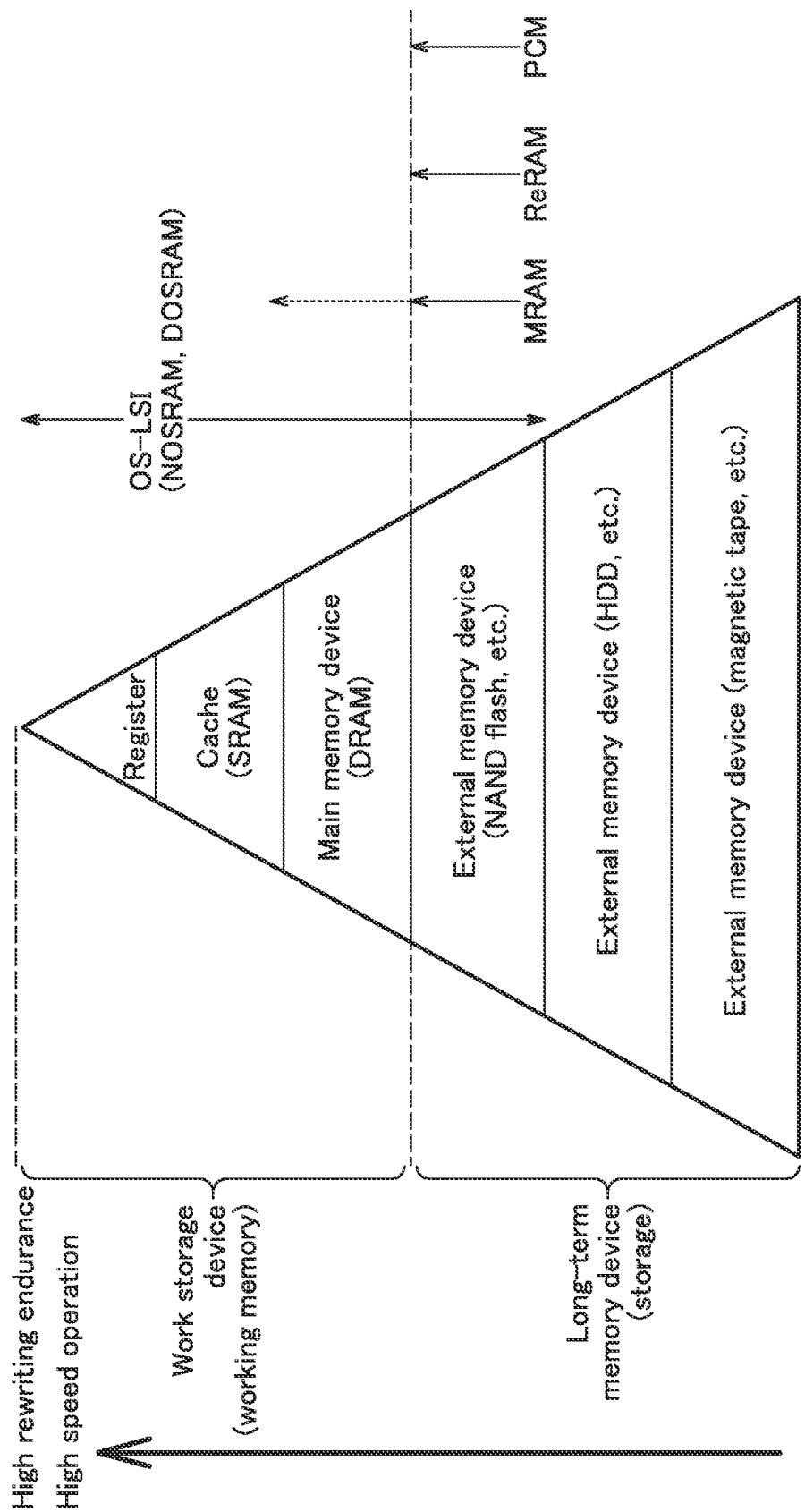
FIG. 36 is a diagram illustrating a hierarchy of various kinds of memory devices.

FIG. 36 illustrates a hierarchy in which a register, a cache, a main memory device, and a storage are sorted depending on an operation speed and rewriting endurance.

In addition, as next-generation memory, ReRAM (Resistive Random Access Memory), MRAM (Magnetoresistive Random Access Memory), PCM (Phase-Change Memory), or the like is considered.

For example, ReRAM is difficult to apply to the working memory due to its low rewriting endurance. MRAM has been studied to be applied to SRAM, but MRAM is likely to be affected by external magnetism and has low tolerance to high temperature. In addition, PCM needs high voltage for data writing and tends to consume a large amount of power.

Figure 37:
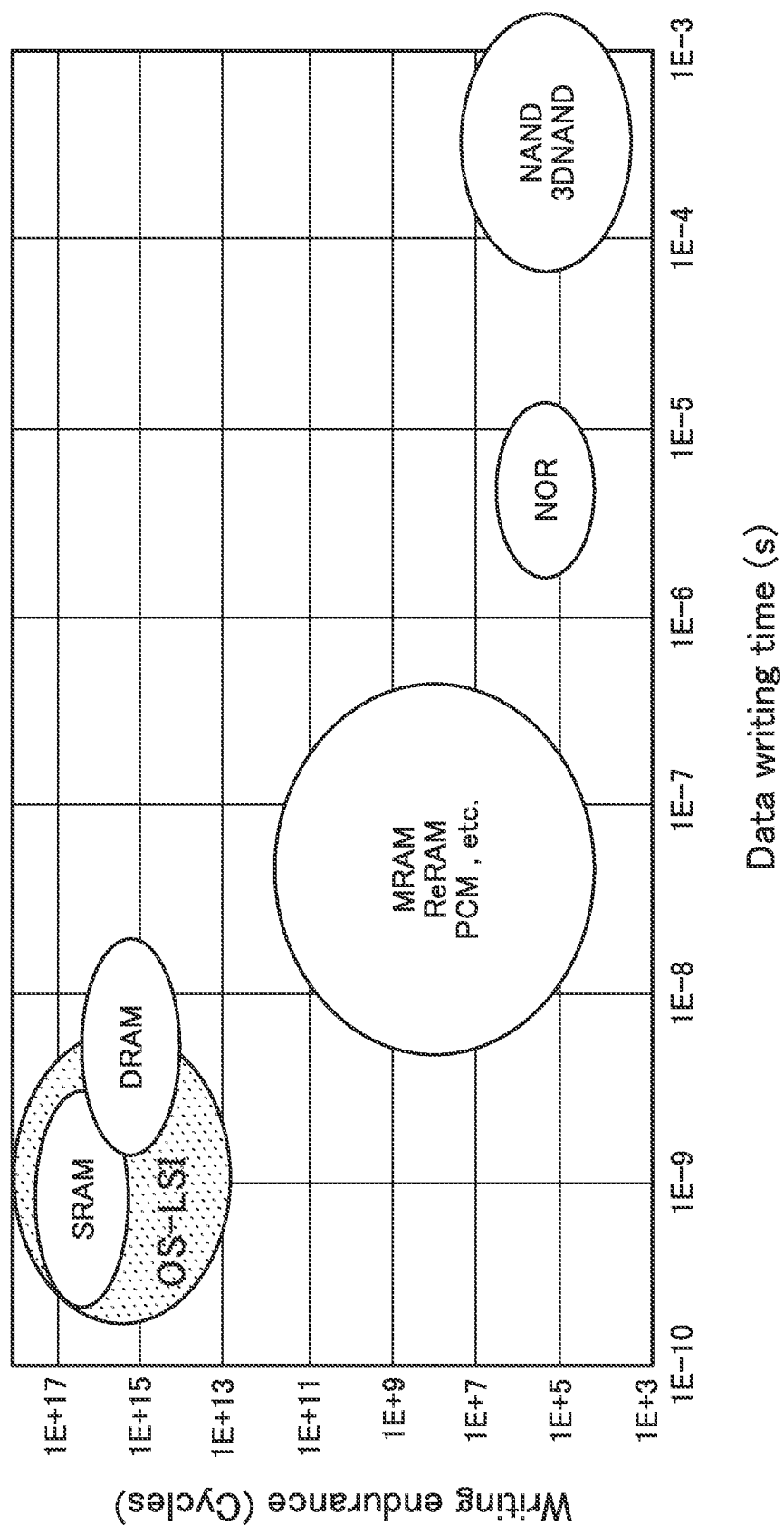
FIG. 37 is a diagram showing data writing time and writing endurance of various kinds of memory devices.

FIG. 37 shows the data writing time (time needed for data writing) and writing endurance of a variety of memory devices. The memory device using the OS-LSI enables the short data writing time and high writing endurance.

Figure 38:
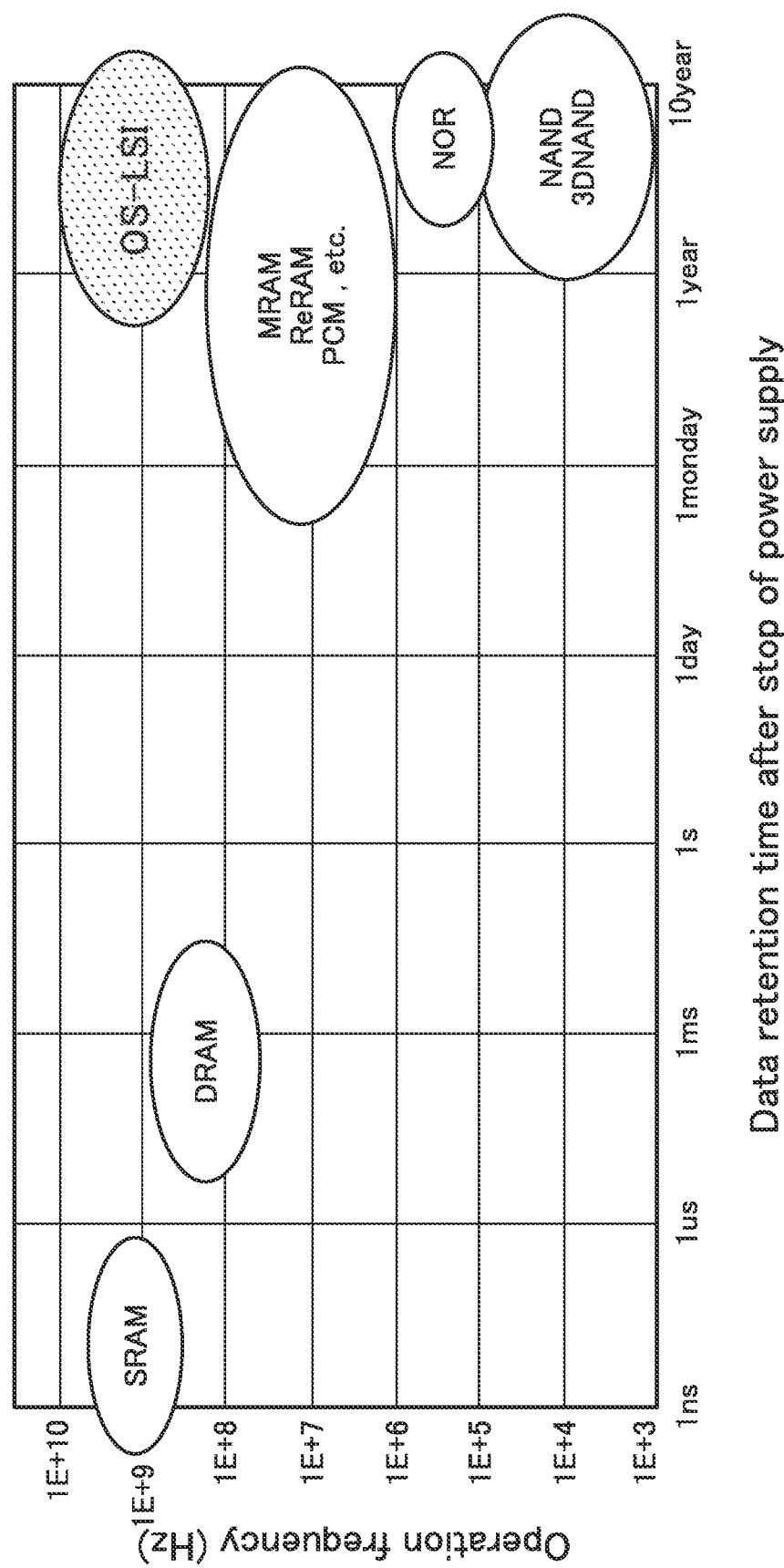
FIG. 38 is a diagram showing data retention time and operation frequency of various kinds of memory devices.

FIG. 38 shows the data retention time after the power supply is stopped and operation frequency of a variety of memory devices. The memory device using the OS-LSI can retain data for one year or longer even after the power supply is stopped. In addition, the memory device using the OS-LSI has high operation frequency and enables high speed operation.

The memory device using the OS-LSI described in the above embodiment enables high speed operation, long-term data retention, and low power consumption. In addition, data can be retained for a long time even at high temperatures. Therefore, the memory device using the OS-LSI can be used for both the working memory and the storage. With use of the OS-LSI, a universal memory can be achieved.

This embodiment can be implemented in an appropriate combination with the structures described in the other embodiments and the like.

REFERENCE NUMERALS

100: memory device, 111: peripheral circuit, 121: row decoder, 122: word line driver circuit, 130: bit line driver circuit, 131: column decoder, 132: precharge circuit, 133: amplifier circuit, 134: input/output circuit, 140: output circuit, 160: control logic circuit, 201: memory cell array, 211: memory cell

The invention claimed is:

1. A memory device comprising:
   a memory cell;
   a first region;
   a first word line;
   a second word line;
   a first bit line; and
   a second bit line,
   wherein the memory cell comprises a first transistor and a second transistor,
   wherein a semiconductor layer of the first transistor comprises a metal oxide,
   wherein the first region comprises a plurality of gaps,
   wherein the first bit line and the second bit line extend in a first direction,
   wherein the first word line and the second word line extend in a second direction,
   wherein a gate of the first transistor is electrically connected to the first word line,
   wherein one of a source and a drain of the first transistor is electrically connected to a gate of the second transistor,
   wherein the other of the source and the drain of the first transistor is electrically connected to the first bit line,
   wherein one of a source and a drain of the second transistor is electrically connected to the second word line,
   wherein the other of the source and the drain of the second transistor is electrically connected to the second bit line,
   wherein the first region comprises a region extending in the first direction,
   wherein in the region extending in the first direction, each of the plurality of gaps extends in a direction intersecting with the first direction, and
   wherein an area where a gate electrode and a semiconductor layer of the second transistor overlap with each other is larger than an area where a gate electrode and the semiconductor layer of the first transistor overlap with each other.

2. A memory device comprising:
   a memory cell;
   a first region;
   a first word line;
   a second word line;

a first bit line;
a second bit line; and
a first conductive layer,
wherein the memory cell comprises a first transistor and a second transistor,
wherein a semiconductor layer of the first transistor comprises a metal oxide,
wherein the first region comprises a plurality of gaps,
wherein the first bit line and the second bit line extend in a first direction,
wherein the first word line and the second word line extend in a second direction,
wherein a gate of the first transistor is electrically connected to the first word line,
wherein one of a source and a drain of the first transistor is electrically connected to a gate of the second transistor,
wherein the other of the source and the drain of the first transistor is electrically connected to the first bit line,
wherein one of a source and a drain of the second transistor is electrically connected to the second word line,
wherein the other of the source and the drain of the second transistor is electrically connected to the second bit line,
wherein the first conductive layer comprises a region overlapping with the semiconductor layer of the first transistor and a region overlapping with the one of the source and the drain of the first transistor,
wherein the first region comprises a region extending in the first direction, and
wherein in the region extending in the first direction, each of the plurality of gaps extends in a direction intersecting with the first direction.

3. The memory device according to claim 2,
wherein the first conductive layer comprises a region configured to be a back gate of the first transistor.

4. The memory device according to claim 1,
wherein the semiconductor layer contains at least one of In and Zn.

5. The memory device according to claim 1,
wherein the first region comprises a region extending in the second direction, and
wherein in the region extending in the second direction, each of the plurality of gaps comprises a region extending in a direction intersecting with the second direction.

6. The memory device according to claim 1,
wherein the area where the gate electrode and the semiconductor layer of the second transistor overlap with each other is greater than or equal to 1 time and less than or equal to 10 times the area where the gate electrode and the semiconductor layer of the first transistor overlap with each other.

7. An electronic device comprising:
the memory device according to claim 1; and
at least one of a microphone, a camera, a speaker, an antenna, and a battery.

8. The memory device according to claim 2,
wherein the semiconductor layer contains at least one of In and Zn.

9. The memory device according to claim 2,
wherein the first region comprises a region extending in the second direction, and
wherein in the region extending in the second direction, each of the plurality of gaps comprises a region extending in a direction intersecting with the second direction.

10. The memory device according to claim 2,
wherein an area where a gate electrode and a semiconductor layer of the second transistor overlap with each other is larger than an area where a gate electrode and a semiconductor layer of the first transistor overlap with each other.

11. The memory device according to claim 2,
wherein the area where the gate electrode and the semiconductor layer of the second transistor overlap with each other is greater than or equal to 1 time and less than or equal to 10 times the area where the gate electrode and the semiconductor layer of the first transistor overlap with each other.

12. An electronic device comprising:
the memory device according to claim 2; and
at least one of a microphone, a camera, a speaker, an antenna, and a battery.

* * * * *